(12) United States Patent
Hashizume

(10) Patent No.: US 6,539,511 B1
(45) Date of Patent: Mar. 25, 2003

(54) SEMICONDUCTOR INTEGRATED CIRCUIT DEVICES WITH TEST CIRCUIT

(75) Inventor: Takeshi Hashizume, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/438,541

(22) Filed: Nov. 12, 1999

(30) Foreign Application Priority Data

May 6, 1999 (JP) .......................................... 11-125891

(51) Int. Cl.[7] ............................................... G01R 31/38
(52) U.S. Cl. ........................................ 714/727; 714/726
(58) Field of Search .............................. 714/727, 724, 714/726, 728, 729, 730

(56) References Cited

U.S. PATENT DOCUMENTS

| | | | | |
|---|---|---|---|---|
| 4,855,669 A | * | 8/1989 | Mahoney | .................... 324/73.1 |
| 5,416,409 A | * | 5/1995 | Hunter | ..................... 324/158.1 |
| 5,471,481 A | * | 11/1995 | Okumoto et al. | ........... 714/727 |
| 5,487,074 A | * | 1/1996 | Sullivan | ..................... 714/727 |

* cited by examiner

Primary Examiner—Christine T. Tu
(74) Attorney, Agent, or Firm—McDermott, Will & Emery

(57) ABSTRACT

In a semiconductor integrated circuit device supporting a boundary scan test, the state of an I/O cell is set under the control of a DC test control circuit through a boundary scan register utilized for the boundary scan test for setting an external terminal connected with a pad in a desired state. A semiconductor integrated circuit device allowing execution of a DC test without increasing the circuit area and signal propagation delay is provided.

20 Claims, 26 Drawing Sheets

| DC TEST FUNCTION | DCTM[0:2] | STATE OF BSR | | | | |
|---|---|---|---|---|---|---|
| | | 0 | OE | IE | PU | PD |
| 1) INPUT (LEAKAGE CURRENT) | 001 | x | 0 | 1 | 0 | 0 |
| 2) HIGH OUTPUT (VOH) | 010 | 1 | 1 | x | 0 | 0 |
| 3) LOW OUTPUT (VOL) | 011 | 0 | 1 | x | 0 | 0 |
| 4) Hi-Z | 100 | x | 0 | 0 | 0 | 0 |
| 5) Hi-Z & PULL UP | 110 | x | 0 | x | 1 | 0 |
| 6) Hi-Z & PULL DOWN | 111 | x | 0 | x | 0 | 1 |

0:Rset, 1:Set
x:don't_care

COMMON FOR TEST CELLS IN CHIP
O, OE, IE, I, PU & PD: SEPARATE

COMMON FOR TEST CELLS IN CHIP
O, OE, IE & I: SEPARATE
LOGIC CIRCUITS FOR PU & PD

CNT1 EXEMPLARY FUNCTION

| LE | OE2 | Out2 | SET | REST |
|----|-----|------|-----|------|
| 0  | x   | x    | 0   | 0    |
| 1  | 1   | x    | 0   | 0    |
| 1  | 0   | 1    | 1   | 0    |
| 1  | 0   | 0    | 0   | 1    |

EACH SIGNAL HAS POSITIVE LOGIC
x: Don't Care

CNT2 EXEMPLARY FUNCTION

| LE | OE2 | Out2 | PD | PDOUT |
|----|-----|------|----|-------|
| 0  | x   | x    | 1  | 1     |
| 0  | x   | x    | 0  | 0     |
| 1  | 1   | x    | 0  | 0     |
| 1  | 1   | x    | 1  | 1     |
| 1  | 0   | 1    | x  | 0     |
| 1  | 0   | 0    | x  | 1     |

EACH SIGNAL HAS POSITIVE LOGIC
x: Don't Care

FIG. 32A

CNT1 EXEMPLARY FUNCTION

| LE | OE2 | Out2 | SET | REST |
|----|-----|------|-----|------|
| 0  | x   | x    | 0   | 0    |
| 1  | 1   | x    | 0   | 0    |
| 1  | 0   | 1    | 0   | 1    |
| 1  | 0   | 0    | 1   | 0    |

EACH SIGNAL HAS POSITIVE LOGIC
x: Don't Care

FIG. 32B

CNT2 EXEMPLARY FUNCTION

| LE | OE2 | Out2 | PU | PUOUT |
|----|-----|------|----|----|
| 0  | x   | x    | 1  | 1  |
| 0  | x   | x    | 0  | 0  |
| 1  | 1   | x    | 0  | 0  |
| 1  | 1   | x    | 1  | 1  |
| 1  | 0   | 1    | x  | 1  |
| 1  | 0   | 0    | x  | 0  |

EACH SIGNAL HAS POSITIVE LOGIC
x: Don't Care

| DC TEST FUNCTION | DCTM[0:2] | STATE OF BSR | | | | |
|---|---|---|---|---|---|---|
| | | O | OE | IE | PU | PD |
| 1) INPUT (I LEAK) | 001 | x | 0 | 1 | 0 | 0 |
| 2) HL OUTPUT | 010 | 1/0 | 1 | x | 0 | 0 |
| 3) LH OUTPUT | 011 | 0/1 | 1 | x | 0 | 0 |
| 4) Hi-Z | 100 | x | 0 | 0 | 0 | 0 |
| 5) Hi-Z & PULL UP | 110 | x | 0 | x | 1 | 0 |
| 6) Hi-Z & PULL DOWN | 111 | x | 0 | x | 0 | 1 |

0:Rset, 1:Set
x:don't_care

SEMICONDUCTOR INTEGRATED CIRCUIT DEVICES WITH TEST CIRCUIT

BACKGROUND OF THE INVENTION

1. Field of the Invention

The present invention relates to a semiconductor integrated circuit device, and more particularly, it relates to a semiconductor integrated circuit device with a test circuit. More specifically, the present invention relates to a semiconductor integrated circuit device which can be readily subjected to a DC test (direct current test) with no influence on the internal structure.

2. Description of the Background Art

A semiconductor integrated circuit device is subjected to various tests on functions, performance and electric characteristics of the product after fabrication, on the level of a single chip and on the level of a board having the chip mounted thereon. For example, "ULSI Design Technique" issued by the Institute of Electronics, Information and Communication Engineers describes such tests performed on the chip level and the board level.

A DC (direct current) characteristic test is performed as one test for testing electric characteristics of a single chip. Items tested in the DC characteristic test include potentials VIL and VIH when "0" or "1" is externally input, a leakage current of an input pin terminal, a potential VOL or VOH when "0" or "1" is output, and a leakage current (standby leakage current) in a high impedance (Hi-Z) state.

On the other hand, a boundary scan test (JTAG (joint test action group) test) standardized in IEEE (IEEE Std. 1149.1) is performed on the chip mounted on a board. The boundary scan test is performed by sequentially scanning all external input/output pins of a semiconductor integrated circuit device for inputting/outputting test data to test the internal functions of the integrated circuit device (chip) and the board on which the chip is mounted. In JTAG test, shift registers are arranged in correspondence to input/output pin terminals and test data are serially transferred through the shift registers for testing connection in the integrated circuit device, connection between the pin terminals of the integrated circuit device and the board, and the like.

In such a BGA (hall grid array) package that pin terminals are arranged on the rear surface of the chip and cannot be externally observed after on-board assembly, contact failures of the pin terminals or the like can be readily tested by shifting test data with shift registers called boundary scan registers. Also even when the number of pin terminals increases and a pitch of the pins reduces below that of test probes for performing a test, the integrated circuit device can be readily tested. The JTAG test standard defines a boundary scan register connected to an input/output circuit, and an input/output control circuit of an input/output buffer (I/O buffer) respectively, and a control unit for controlling a test operation.

FIG. 43 schematically illustrates the overall structure of a conventional semiconductor integrated circuit device 1000. Referring to FIG. 43, semiconductor integrated circuit device 1000 includes an input circuit 100a receiving an input signal supplied through an input terminal group 1001 and generating an internal input signal, an internal logic circuit 1000b performing a prescribed operation in accordance with the internal input signal supplied from input circuit 1000a, and an output circuit 1000c receiving an internal output signal from internal logic circuit 1000b for outputting to an output terminal group 1002. Internal logic circuit 1000b may be a logic circuit performing a desired logical processing or a circuit for controlling an access to a memory or the like.

In a test operation for semiconductor integrated circuit device 1000, input terminal group 1001 and output terminal group 1002 are coupled to a testing apparatus 1010 through an input signal bus 1003 and an output signal bus 1004. Testing apparatus 1010 generates a test pattern in accordance with a predetermined test program for application to input terminal group 1001 of semiconductor integrated circuit device 1000 through input signal bus 1003. Testing apparatus 1010 receives a signal supplied from output terminal group 1002 through output signal bus 1004 and compares the received signal with an expected value for determining whether or not internal logic circuit 1000b of the semiconductor integrated circuit device normally operates.

In a DC test operation, testing apparatus 1010 supplies a test pattern for setting the input terminal group 1001 and the output terminal group 1002 in states "0", "1" and "Hi-Z". As the test pattern supplied from the testing apparatus 1010 in DC test, a test pattern suitable for performing the DC test must be extracted from those previously prepared in testing apparatus 1010. In this case, test patterns changing the states of all terminals included in input terminal group 1001 and output terminal group 1002 respectively must be previously prepared for selecting and applying an appropriate test pattern. However, logic implemented by internal logic circuit 1000b is so complicated that it is difficult to create test patterns changing the states of all terminals. When performing the DC test on semiconductor integrated circuit device 1000 singly, therefore, each terminal cannot be set in a desired state with the test pattern from testing apparatus 1010 and hence the DC test cannot be readily performed.

FIG. 44 illustrates the structure of another conventional semiconductor integrated circuit device 1100. Referring to FIG. 44, semiconductor integrated circuit device 1100 includes a selector 1102 selecting one of an input signal supplied to an input terminal 1101, a power supply voltage Vcc and a ground voltage Vss under the control of a test control circuit 1110, an input buffer 1103 receiving a signal supplied through selector 1102 and generating an internal signal, an internal logic circuit 1104 performing prescribed processing in accordance with the internal signal from the input buffer 1103, a selector 1105 selecting one of an output signal of internal logic circuit 1104, power supply voltage Vcc and ground voltage Vss under the control of test control circuit 1110, and an output buffer 1106 buffering a signal (voltage) supplied from selector 1105 and outputting the buffered signal (voltage) to an output terminal 1107. Test control circuit 1110 determines the selection modes of selectors 1102 and 1105 in accordance with a test mode instruction signal φT supplied through a test mode signal input terminal 1108.

The states of input buffer 1103 and output buffer 1106 can be set by setting connection paths of selectors 1102 and 1105 by the test control circuit 1110, to perform a DC test. In this structure, however, selector 1102 must be provided between input buffer 1103 and input terminal 1101, while selector 1105 must be provided between internal logic circuit 1104 and output buffer 1106. The selectors 1102 and 1105, which are provided on signal propagation paths, cause signal propagation delay, and hence the semiconductor integrated circuit device 1100 cannot be operated at a high speed.

Further, interconnection lines are required for transmitting control signals to selectors 1102 and 1105 to disadvantageously increase the areas occupied by interconnection lines, while the selectors 1102 and 1105 must be provided in correspondence to the input terminals and the output terminals respectively to disadvantageously increase the circuit scale and the area occupied by the chip.

In the structure of the semiconductor integrated circuit device shown in FIG. 44, therefore, the chip area is disadvantageously increased to impede high integrationization although the states of the buffers 1103 and 1106 are not required to be set by extracting a test pattern from a test program under the control of the external testing apparatus, but each terminal is readily set in a desired state.

SUMMARY OF THE INVENTION

An object of the present invention is to provide a semiconductor integrated circuit device which can be readily subjected to a desired test without increasing the chip area.

Another object of the present invention is to provide a semiconductor integrated circuit device with a boundary scan register which can be readily subjected to a DC test.

The semiconductor integrated circuit device according to the present invention includes an I/O cell coupled to a pad and including at least one of an input circuit for inputting a signal and an output circuit for outputting a signal, and a test cell including a boundary scan register provided in correspondence to the circuit included in the I/O cell. The boundary scan register can serially transfer test data in a boundary scan test mode operation.

The semiconductor integrated circuit device according to the present invention further includes a test control circuit for setting the boundary scan register of the test cell in either a set state or a reset state in response to a test mode instruction signal and setting the logical value of an output signal from the boundary scan register at a prescribed value. The operating state of the I/O cell is set in accordance with the output signal of the boundary scan register.

The state of the I/O cell is set through the boundary scan register prepared in the semiconductor integrated circuit device supporting a boundary scan test (JTAG test), whereby a desired test on a chip level can be readily performed while suppressing signal propagation delay and increase of the circuit scale, with no requirement for adding a circuit dedicated to the DC test other than a test control circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 32A and 32B each are lists of logics implemented by control circuits shown in FIG. 31;

DESCRIPTION OF THE PREFERRED EMBODIMENTS

First Embodiment

Figure 1A:
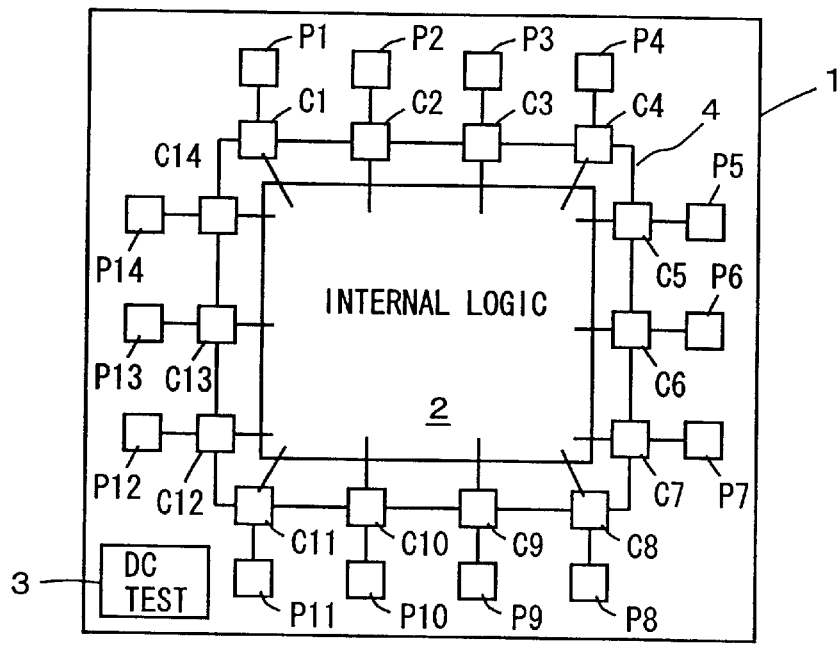
FIG. 1A schematically illustrates the overall structure of a semiconductor integrated circuit device according to a first embodiment of the present invention, and FIG. 1B schematically illustrates the structure of a cell corresponding to one pad.

FIG. 1A schematically illustrates the overall structure of a semiconductor integrated circuit device 1 according to a first embodiment of the present invention. Referring to FIG. 1A, semiconductor integrated circuit device 1 includes pads P1 to P14 arranged along the periphery thereof, and cells C1 to C14 arranged in correspondence to pads P1 to P14 respectively. Cells C1 to C 14 each include an input/output cell (I/O cell) for inputting and/or outputting a signal from/to the respective pads P1 to P14, and a test cell including a boundary scan register provided in correspondence to the I/O cell. The boundary scan registers included in cells C1 to C14 are serially connected by a scan path 4 and can serially transfer test data. In a normal operation mode, the boundary scan registers included in cells C1 to C14 are in through-states for transferring signals between a corresponding buffer (input or output buffer) and an internal logic circuit 2. FIG. 1A shows no JTAG test Circuit, for simplifying the illustration.

The semiconductor integrated circuit device 1 shown in FIG. 1A is further provided with a DC test control circuit 3. DC test control circuit 3 sets the boundary scan registers included in cells C1 to C14 in set states or reset states, thereby setting signal input/output states of the corresponding I/O cells.

A direct current (DC) test can be performed by utilizing cells for performing a boundary scan test, without providing additional components. In general, the scan path 4 forms a serial data transfer path in the boundary scan test (JTAG test). Referring to FIG. 1A, one of pads P10 and P9 serves as a test data input terminal and the other pad P9 or P10 serves as a test data output terminal, for serially inputting/outputting test data. The boundary scan registers included in cells C1 to C14 are set in set/reset states -through the internally provided DC test control circuit 3, whereby no dedicated circuit for setting DC test data need be arranged for each pin terminal.

Figure 1B:
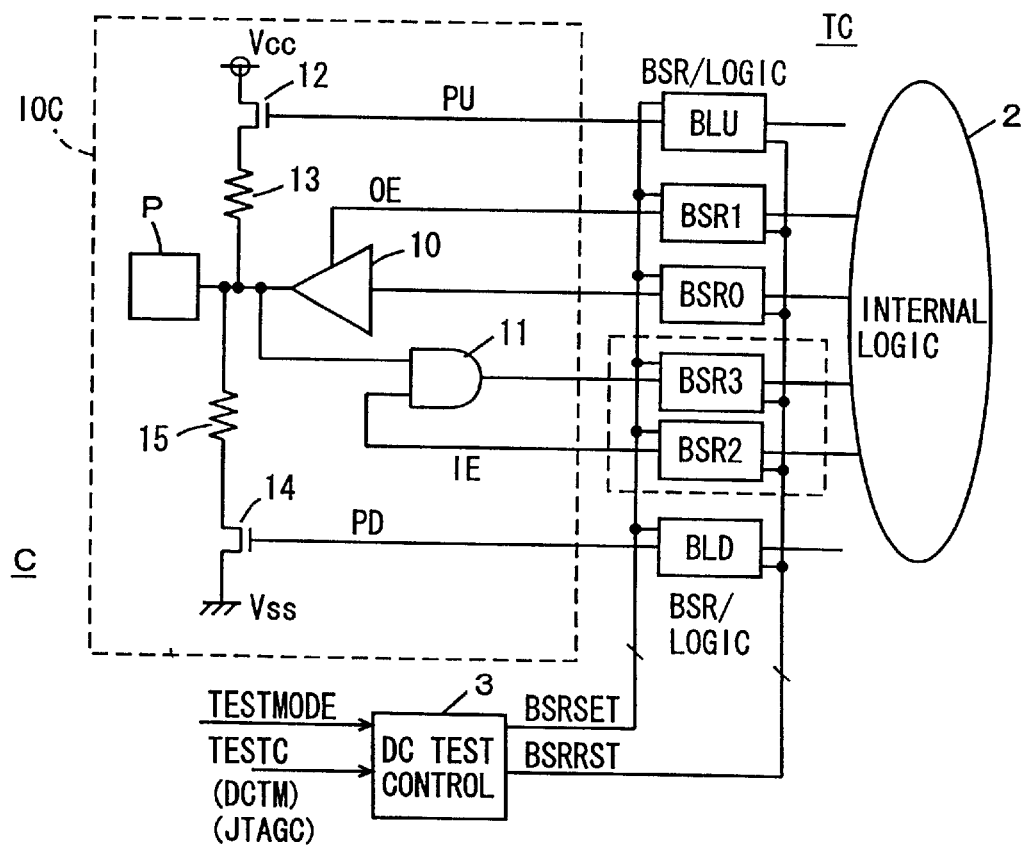

FIG. 1B illustrates the structure of each cell C shown in FIG. 1A, and illustrates an input/output cell (I/O cell) IOC inputting/outputting a signal, and a test cell TC provided in correspondence to the I/O cell IOC as the cell C.

I/O cell IOC includes a tri-state buffer 10 driven, in activation of an output enable signal (output control signal) OE, for buffering a supplied signal and transmitting the buffered signal to a pad P, an input buffer 11 driven, in activation of an input enable signal (input control signal) IE, for generating an internal signal from a signal supplied through pad P, high-resistance resistive elements 13 and 15 coupled in parallel with pad P, an n-channel MOS transistor 12 rendered conductive in activation of a pull-up instruction signal PU for connecting the resistive element 13 to a node receiving a power supply voltage Vcc, and an n-channel MOS transistor 14 rendered conductive in activation of a pull-down instruction signal PD for connecting the high-resistance resistive element 15 to a ground node.

I/O cell IOC can input and output a signal from and to an external device through pad P, and can also set the pad P to a fixed voltage level in accordance with the pull-up instruction signal PU or the pull-down instruction signal PD. In I/O cell IOC, MOS transistor 12 provided for the pull-up resistive element 13 may be replaced with a p-channel MOS transistor.

Test cell TC includes a boundary scan register BSR0 provided for an input of the tri-state buffer (output buffer) 10, a boundary scan register BSR1 provided for output enable signal OE, a boundary scan register BSR3 provided at an output input buffer 11, a boundary scan register BSR2 provided for the input enable signal IE, a boundary scan register or logic circuit BLU provided for pull-up instruction signal PU, and a boundary scan register or logic circuit BLD provided for pull-down instruction signal PD.

Boundary scan registers BSR0 to BSR3 enter through states in the normal operation mode for transferring signals between output buffer 10 and input buffer 11, and internal logic circuit 2. In a boundary scan test operation mode, boundary scan registers BSR0 to BSR3 form a serial scan path for serially transferring test data.

Boundary scan registers or logic circuits BLU and BLD may be formed by boundary scan registers or logic circuits. FIG. 1B shows no control signal or a shift clock for performing the boundary scan test.

DC test control circuit 3 individually generates a set signal BSRSET or a reset signal BSRRST for setting the boundary scan registers BSR0 to BSR3 and the boundary scan registers/logic circuits BLU and BLD in set states or reset states in accordance with a test mode instruction signal TESTMODE instructing the DC test and a test control signal TESTC (including signals DCTM and JTAGC) specifying a test operation content. Output signals of the boundary scan registers BSR0 to BSR3 and boundary scan registers/logic circuits BLU and BLD are set to logic "1" or "0" in response to the set states or the reset states. Thus, the state of I/O cell IOC is set.

For example, output enable signal OE is set to logic "1" of an active state for output buffer 10, and pull-up instruction signal PU and pull-down instruction signal PD are set in inactive states. In this state, a signal of logic "1"/"0" is output to pad P depending on the set/reset state of boundary scan register BSR0. With all of pull-up instruction signal PU, output enable signal OE and pull-down instruction signal PD inactivated, output buffer 10 enters an output high impedance state and hence pad P is set in a high impedance state (Hi-Z). In this state, input impedance can be measured while the voltage level of the signal output at pad P and a leakage current thereat can be measured.

Figure 2:
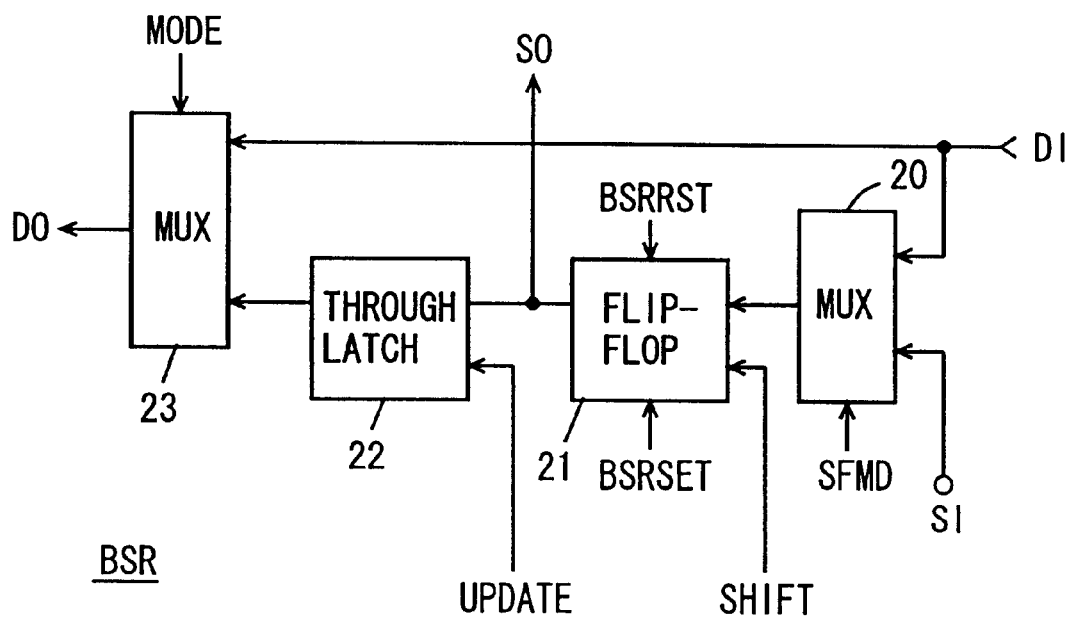
FIG. 2 schematically illustrates the structure of a boundary scan register shown in FIG. 1B.

FIG. 2 illustrates an exemplary structure of each boundary scan register BSR shown in FIG. 1B. Referring to FIG. 2, boundary scan register BSR includes a multiplexer (MUX) 20 selecting one of a shift-in data signal SI and an internal data signal DI in accordance with a shift mode instruction signal SFMD, a flip-flop (shift register) 21 capturing and transferring a signal supplied from multiplexer 20 in accordance with a shift clock signal SHIFT, a through latch 22 capturing the output signal of flip-flop 21 in accordance with an update instruction signal UPDATE, and a multiplexer (MUX) 23 selecting and outputting one of internal data signal DI and an output signal of through latch 22 in accordance with a mode instruction signal MODE.

The shift mode instruction signal SFMD indicates which one of internal data signal DI and data signal SI shifted out from a preceding stage boundary scan register (not shown) to select in the boundary scan test mode. Flip-flop 21 forms a shift register and shifts the signal supplied from multiplexer 20 in accordance with shift dock signal SHIFT. Flip-flop 21 can be set and reset in accordance with boundary scan register set signal BSRSET and boundary scan register reset signal BSRRST. Flip-flop 21 generates a shift-out signal SO for a next-stage boundary scan register. Through latch 22 enters a through state for passing the output signal of flip-flop 21 when the update instruction signal UPDATE is activated. Otherwise, through latch 22 enters a latch state. Multiplexer 23 selects the internal data signal DI when mode instruction signal MODE specifies the normal operation mode, and selects the signal from through latch 22 in the test operation mode (DC test mode) and the boundary scan test mode.

As shown in FIG. 2, the state of the output signal DO from boundary scan register BSR is established by setting/resetting the flip-flop 21. Therefore, the output of output buffer 10 can be set to one of three states, as shown in FIG. 1B.

In the structure of boundary scan register BSR shown in FIG. 2, through latch 22 may not be provided.

Figure 3:
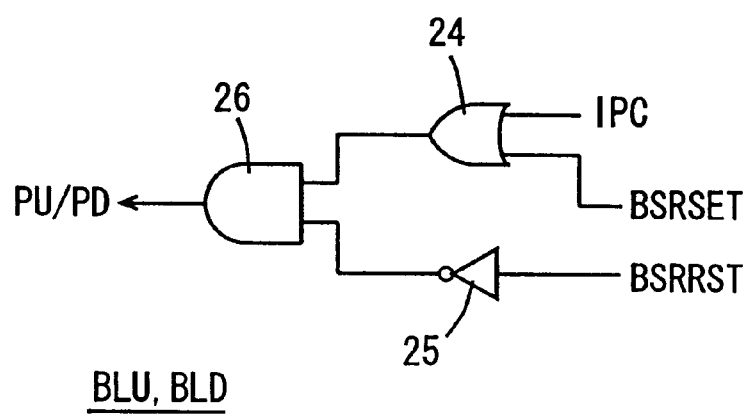
FIG. 3 schematically illustrates the structure of a logic circuit shown in FIG. 1B.

FIG. 3 illustrates the structure of each logic circuit BLU or BLD shown in FIG. 1B. Logic circuits BLU and BLD for generating the pull-up instruction signal PU and the pull-down instruction signal PD are identical in structure to each other, and hence FIG. 3 shows a logic circuit BLU or BLD generically. Referring to FIG. 3, logic circuit BLU or BLD includes an OR circuit 24 receiving an internally generated control signal IPC and set signal BSRSET, an invertor 25 inverting the reset signal BSRRST, and an AND circuit 26 receiving output signals from OR circuit 24 and invertor 25. AND circuit 26 generates the pull-up instruction signal PU or the pull-down instruction signal PD. The internal control signal IPC is generated when the output state of I/O cell IOC is fixedly set. The internal control signal IPC may be so generated as to set the pad P in a pull-up or pull-down state when output buffer 10 (see FIG. 1B) is in a high impedance state.

In the (DC) test operation mode, one of boundary scan set signal BSRSET and boundary scan reset signal BSRRST is driven to an active state (with pad P set to a fixed potential). When set signal BSRSET is driven to a high-level active state, the output signal from OR circuit 24 goes low while reset signal BSRRST is low, and hence the output signal from invertor 25 goes high, the pull-up/pull-down instruction signal PU/PD from AND circuit 26 is driven to a high-level active state for fixing the pad P to the power supply voltage or the ground voltage level. When the reset signal BSRRST is driven to a high-level active state, the output signal from invertor 25 goes low, and pull-up/pull-down instruction signal PU/PD is inactivated regardless of state of the internal control signal IPC. Pad P can be set at any of the power supply voltage Vcc level, the ground voltage Vss level and the output high impedance state by individually controlling the pull-up instruction signal PU and the pull-down instruction signal PD.

The circuit structure of the logic circuit shown in FIG. 3 is implemented in accordance with positive logic with active states of signals being high. The structure of the logic circuit may alternatively be implemented in accordance with negative logic.

According to the first embodiment of the present invention, as hereinabove described, the state of the cell connected with the pad is set through the boundary scan register BSR already provided in the semiconductor integrated circuit device supporting the JTAG test, and hence no additional circuit is interposed in a signal propagation path for each pad, whereby increase of signal propagation delay as well as increase of the circuit scale can be suppressed. Further, increase of control signals for the boundary scan register can also be suppressed by utilizing the set/reset signal utilized in a general boundary scan test. A desired DC test can be readily performed by setting the pad connected with the cell in a desired state.

Second Embodiment

Figures 4, 5:
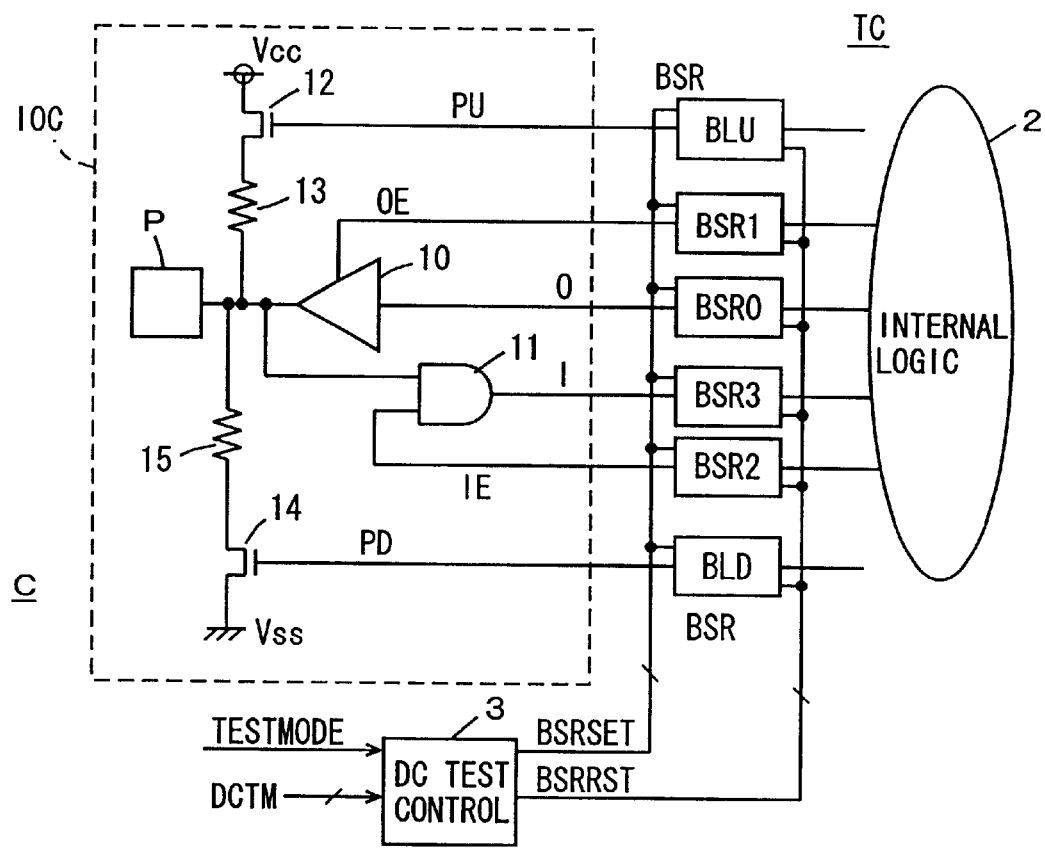
FIG. 4 schematically illustrates the structure of a main part of a semiconductor integrated circuit device according to a second embodiment of the present invention.
FIG. 5 is a list of logic implemented by a DC test control circuit shown in FIG. 4.

FIG. 4 illustrates the structure of a main part of a semiconductor integrated circuit device according to a second embodiment of the present invention. In the structure shown in FIG. 4, a DC test control circuit 3 is supplied with a test mode control signal DCTM of a plurality of bits. In accordance with the test mode control signal DCTM of a plurality of bits, DC test control circuit 3 sets set/reset states of boundary scan registers BSR0 to BSR3 and boundary scan registers/logic circuits BLU and BLD. The remaining structure of this embodiment is identical to that shown in FIG. 1B, and hence corresponding parts are denoted by the same reference numerals and detailed description thereof is not repeated. FIG. 4 does not show signal JTAGC for controlling a JTAG test, and shift clock and boundary scan test control signal for performing a boundary scan test, for the purpose of simplifying illustration.

FIG. 5 is a list of logic implemented by DC test control circuit 3. As shown in FIG. 5, DC test circuit 3 receives a 3-bit test mode control signal DCYM[0:2] and decodes this signal for implementing any one of six DC test functions. The six DC test functions include an input test function for measuring a leakage current in a pad P, a test mode for measuring a high-level output voltage VLH in pad P, a test mode for measuring a low-level output voltage VOL in pad P, a test mode for measuring a leakage current with pad P set in a high impedance state, a test mode setting the pad in a high impedance state and pulling up the voltage thereof to the level of a power supply voltage Vcc, and a test mode setting an output buffer in an output high impedance state and fixing the pad P to a ground voltage level through a pull-down resistive element 15. The pull-up and pull-down test modes are test modes for measuring resistance values of a pull-up resistive element 13 and pull-down resistive element 15, respectively.

DC test control circuit 3 decodes the test mode control signal DCTM and individually sets the boundary scan registers BSR0 to BSR3 and the boundary scan registers/logic circuits in set states or reset states. FIG. 5 shows the states of each boundary scan register BSR provided for each signal in positive logic. In an operation mode of performing an input test, for example, boundary scan register BSR1 provided for an output enable signal OE, boundary scan register/logic circuit BLU provided for a pull-up instruction signal PU and boundary scan register/logic circuit BLD provided for a pull-down instruction signal PD are set in reset states and boundary scan register BSR2 provided for an input enable signal IE is set in a set state.

The output enable signal OE is set in a reset state and an output buffer 10 is set in an output high impedance state, and hence the state of boundary scan register BSR0 provided for an input signal O for the output buffer 10 is arbitrary (X: don't care). In this state, input enable signal IE goes high, and an input buffer 11 formed by an AND circuit is enabled to generate an internal signal I in accordance with a signal supplied to pad P. In this input test mode, a leakage current in pad P is measured. Therefore, input buffer 11 may be in an enabled state, and the state of the corresponding boundary scan register BSR3 is arbitrary. Therefore, FIG. 5 does not show the state of boundary scan register BSR3 provided for the input signal I. The state of boundary scan register BSR3 provided for input signal I may be set through any of control signals implementing the states of the respective boundary scan registers shown in FIG. 5.

Also in the remaining test functions, the states of the boundary scan registers are set in response to the value of test mode control signal DCTM.

In the structure shown in FIG. 4, boundary scan registers (or logic circuits) are connected for all signals between the chip and an I/O cell IOC including pull-up and pull-down control, and the boundary scan registers or logic circuits are identical in control mode to each other. Therefore, control circuitry for components included in test cell TC inclusive of pull-up and pull-down control can be integrated for simplifying a control manner for setting the state of I/O cell IOC and the structure of DC test circuit 3. Further, the pull-up state and the pull-down state of pad P can be externally observed, a pull-up terminal and a pull-down terminal can be externally observed, and the characteristics of a leakage current or the like can be correctly measured by providing the boundary scan registers/logic circuits BLU and BLD for pull-up instruction signal PU and pull-down instruction signal PD.

[First Modification]

Figure 6A:
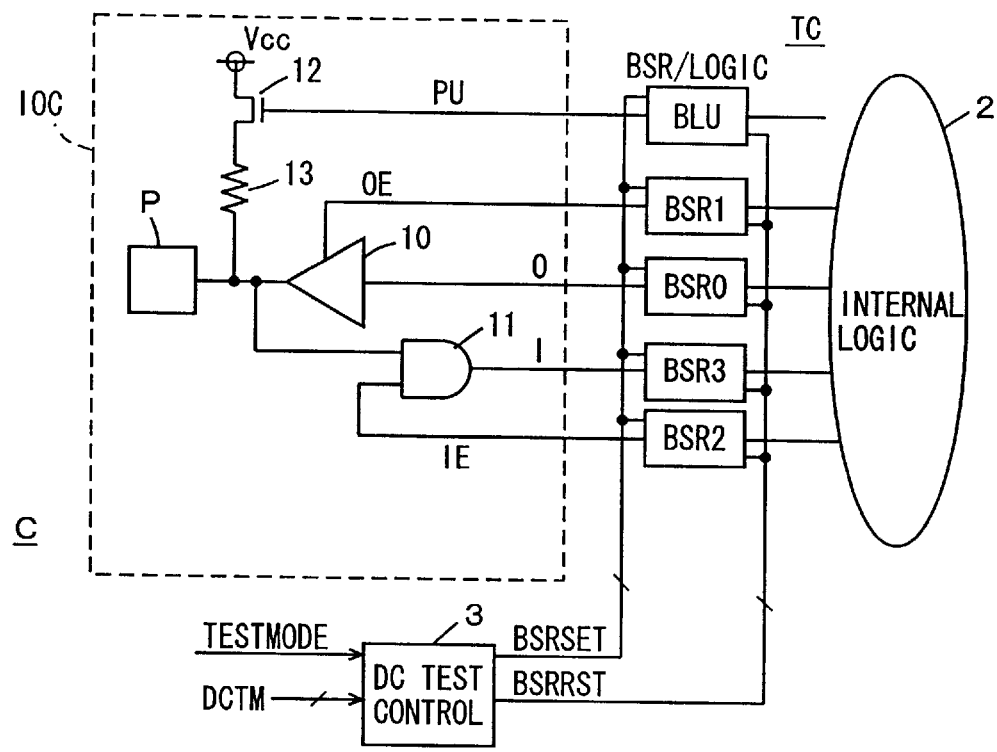
FIGS. 6A and 6B schematically illustrate modifications of the second embodiment of the present invention respectively.

FIG. 6A illustrates the structure of a first modification of the second embodiment of the present invention. In the structure shown in FIG. 6A, an I/O cell IOC is provided with no pull-down resistive element and pull-down control transistor. A pull-up resistive element 13 and a MOS transistor 12 rendered conductive in response to a pull-up instruction signal PU for connecting the pull-up resistive element 13 to a power supply node are provided. The remaining structure of this modification is identical to that shown in FIG. 4, and hence corresponding parts are denoted by the same reference numerals and detailed description thereof is not repeated.

In the structure shown in FIG. 6A, no additional circuit for determining the state of the I/O cell is employed similarly to the structure shown in FIG. 4. Boundary scan registers employed for a boundary scan test are simply utilized, and increase of the circuit scale is suppressed. Further, the element for pulling up a pad P is provided and a boundary scan register/logic circuit BLU is provided for the pull-up instruction signal PU, and hence pad P can be set in a pull-up state and this pulled-up state can be externally observed.

Generally in the boundary scan test, no test mode for setting the pad P in a pull-up state and/or a pull-down state is defined. I/O cell IOC can be set in a desired state (Hi-Z) without exerting a bad influence on the boundary scan test in particular.

A set signal BSRSET and a reset signal BSRRST for each of boundary scan registers BSR0 to BSR3 and boundary scan register/logic circuit BLU output from a DC test circuit 3 are provided by the logic obtained by deleting the state of Hi-Z and pull-down of the item 6) and deleting the pull-down instruction signal PD from the logic shown in FIG. 5. This logic may alternatively be implemented by negative logic.

[Second Modification]

Figure 6B:
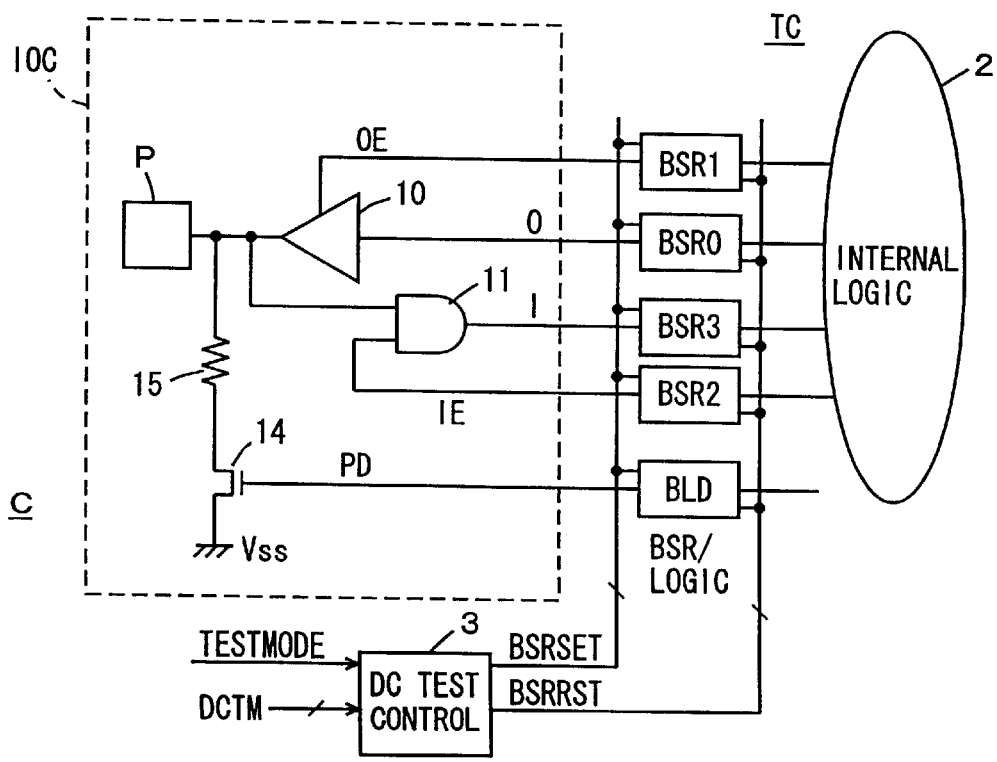

FIG. 6B shows the structure of a second modification of the second embodiment of the present invention. The structure shown in FIG. 6B is not provided with pull-up resistive element 13 and MOS transistor 12 for setting a pull-up state. The remaining structure of this modification is identical to that shown in FIG. 4, and hence corresponding parts are denoted by the same reference numerals and detailed description thereof is not repeated.

In the structure shown in FIG. 6B, a pad P can be set in a pull-down state. A boundary scan register/logic circuit BLD is provided for a pull-down instruction signal PD, and the state of pad P can be externally observed when set in a pull-down state. A DC test control circuit 3 for the structure shown in FIG. 6B implements the logic obtained by deleting Hi-Z and pull-up of the item 5) and deleting the pull-up instruction signal PU from the list shown in FIG. 5.

Also when an I/O cell IOC is provided with a pull-down element as shown in FIG. 6B, a DC test can be performed by setting the I/O cell IOC in a desired state with no bad influence on a boundary scan test since no pull-down test is defined in the boundary scan test.

According to the second embodiment of the present invention, the boundary scan registers employed for the boundary scan test are employed for setting the state of I/O cell IOC, whereby signal propagation delay and increase of the circuit scale can be suppressed and a desired test can be readily performed. Further, the boundary scan registers or logic circuits are provided also for the pull-up instruction signal and the pull-down instruction signal, whereby control for the test cell TC provided for the I/O cell can be integrated, the circuit structure for control can be simplified and the terminal set in a pull-up/pull-down state can be externally observed.

Third Embodiment

Figure 7A:
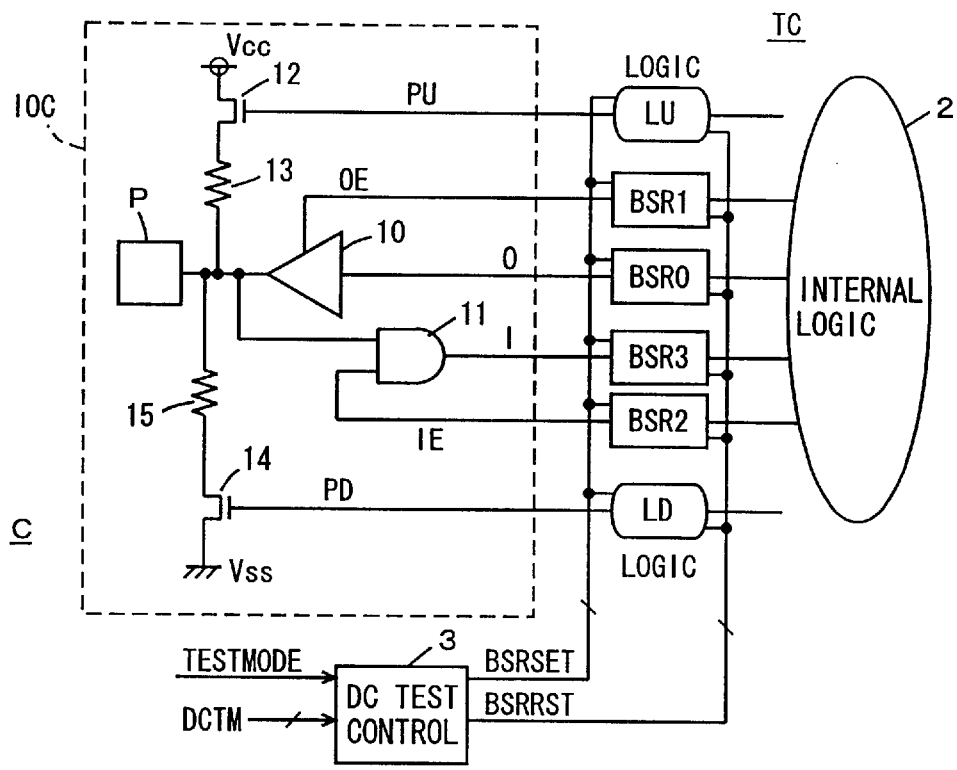
FIG. 7A schematically illustrates the structure of a cell according to a third embodiment of the present invention.

FIG. 7A schematically illustrates the structure of a main part of a semiconductor integrated circuit device according to a third embodiment of the present invention. In the structure shown in FIG. 7A, logic circuits LU and LD are provided for a pull-up instruction signal PU and a pull-down instruction signal PD respectively. No pull-up and pull-down operations are defined in a boundary scan test and hence no boundary scan registers need be provided for the pull-up instruction signal PU and the pull-down instruction signal PD in particular for the boundary scan test. As shown in FIG. 7A, therefore, the circuit structure is simplified by arranging the logic circuits LU and LD for pull-up instruction signal PU and pull-down instruction signal PD. Logic circuits LU and LD may have the structure shown in FIG. 3. The remaining structure of this embodiment is identical to that shown in FIG. 4, and hence corresponding parts are denoted by the same reference numerals and detailed description thereof is not repeated.

[First Modification]

Figure 7B:
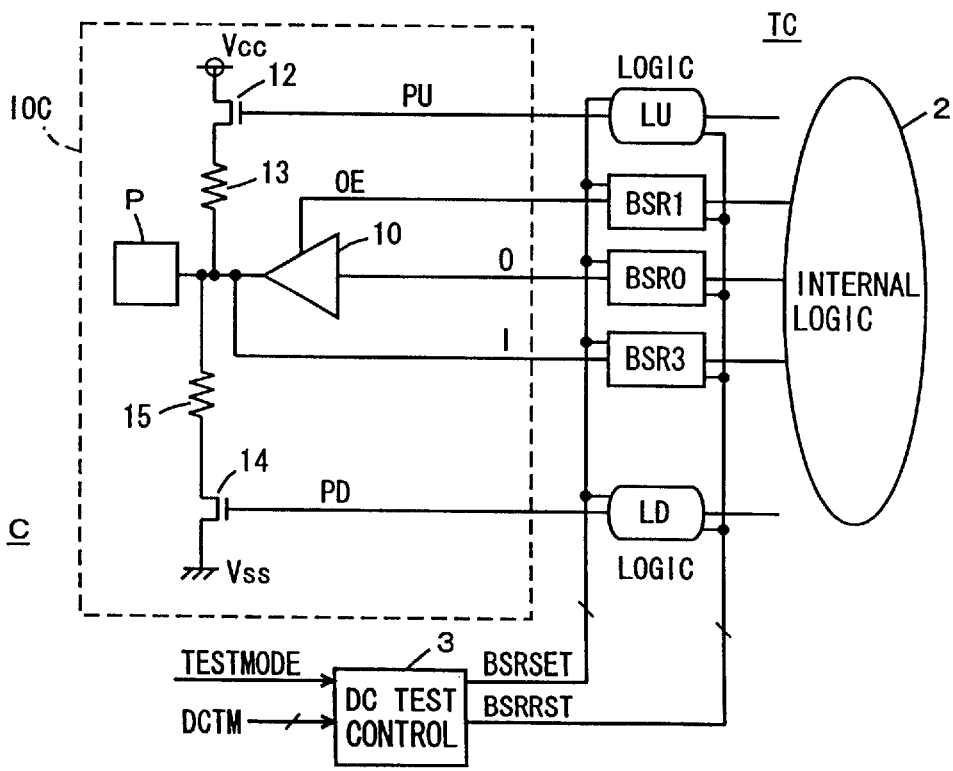
FIG. 7B illustrates a modification of the third embodiment of the present invention.

FIG. 7B illustrates the structure of a first modification of the third embodiment of the present invention. In the structure shown in FIG. 7B, an I/O cell IOC is provided with no input buffer. A signal I on a pad P is supplied to a boundary scan register BSR included in a test cell TC. Therefore, I/O cell IOC statically receives the input signal I supplied to pad P to supply this signal to an internal logic circuit 2 in a normal operation mode. The remaining structure of this modification is identical to that shown in FIG. 4, and hence corresponding parts are denoted by the same reference numerals and the description thereof is not repeated.

Also in the structure of the I/O cell shown in FIG. 7B, an effect similar to that of the structure shown in FIG. 7A can be attained.

[Second Modification]

Figure 8A:
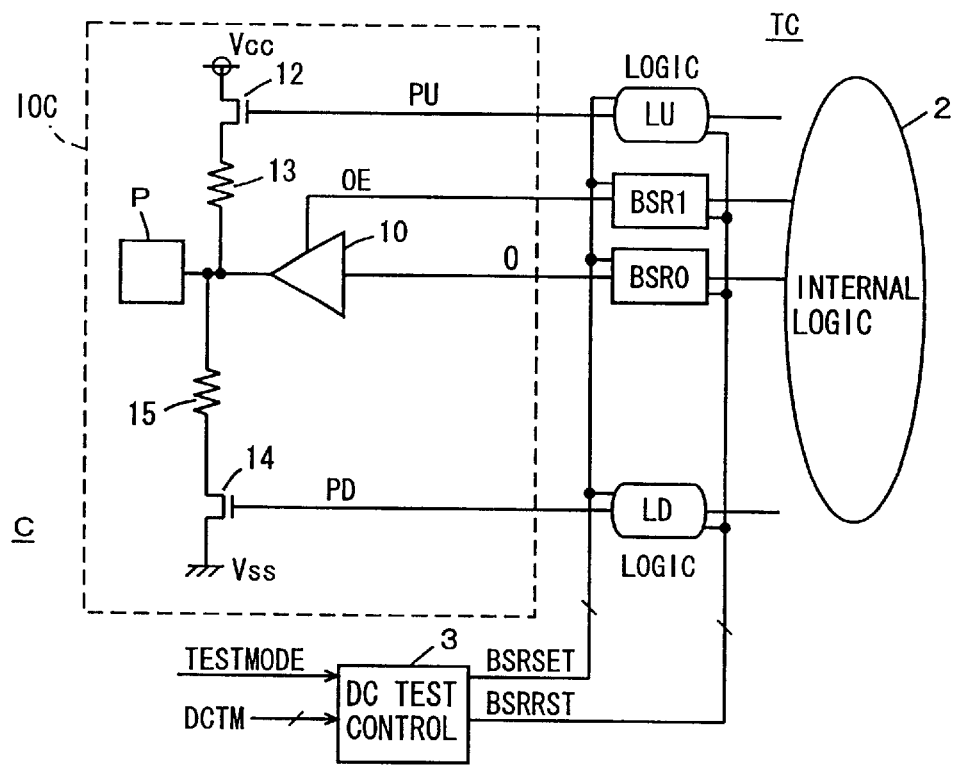
FIGS. 8A and 8B illustrate modifications of the third embodiment of the present invention respectively.

FIG. 8A schematically illustrates the structure of a second modification of the third embodiment of the present invention. In the structure shown in FIG. 8A, an I/O cell IOC includes an output buffer 10, a pull-up resistive element 13, a pull-up set MOS transistor 12, a pull-down resistive element 15 and a pull-down set MOS transistor 14. No input buffer is provided. Therefore, a test cell TC includes a boundary scan register BSR1 for an output enable signal OE, a boundary scan register BSR0 for an input signal O for output buffer 10, a logic circuit LU for a pull-up instruction signal PU and a logic circuit LD for a pull-down instruction signal PD. The remaining structure of this modification is identical to that shown in FIG. 4, and hence corresponding parts are denoted by the same reference numerals and detailed description thereof is not repeated.

The structure shown in FIG. 8A also utilizes boundary scan registers BSR0 and BSR1 for a boundary scan test for setting the state of I/O cell IOC. Further, logic circuits LU and LD are provided for pull-up instruction signal PU and pull-down instruction signal PD, and the circuit structure as well as control can be simplified as compared with the structure with boundary scan registers.

[Third Modification]

Figure 8B:
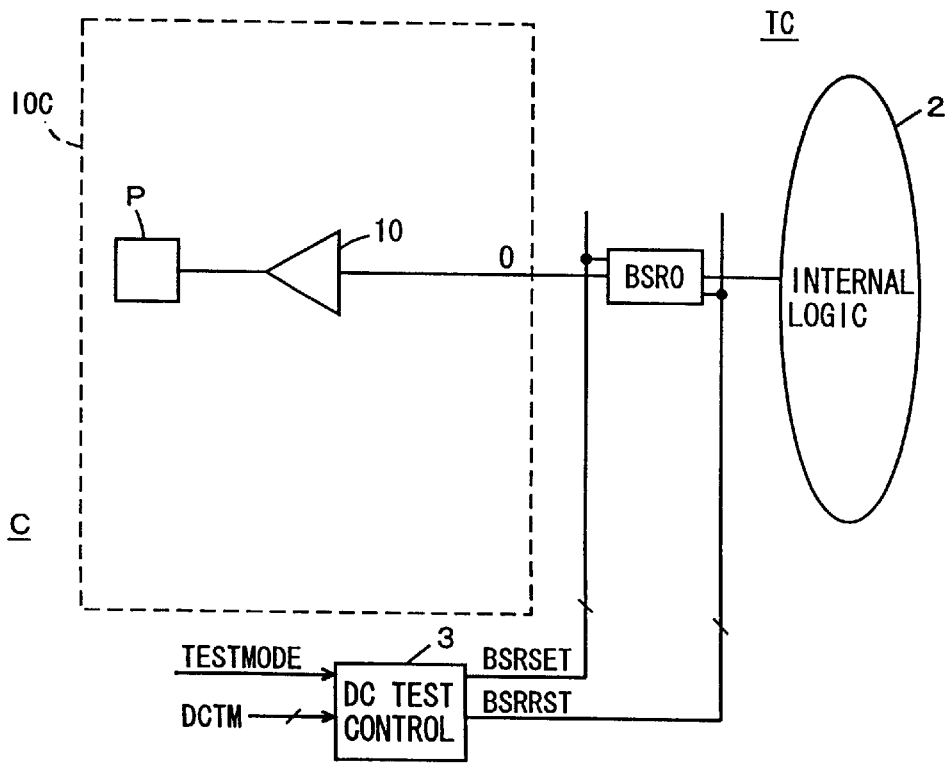

FIG. 8B illustrates the structure of a third modification of the third embodiment of the present invention. In the structure shown in FIG. 8B, an I/O cell IOC includes only an output buffer 10. This output buffer 10 normally operates and is not supplied with output enable signal OE. Therefore, I/O cell IOC functions as an output cell. A boundary scan register BSR0 is provided for output buffer 10.

Also with respect to the output cell shown in FIG. 8B, signal propagation delay as well as increase of the circuit scale can be suppressed, I/O cell IOC can be readily set in a desired state and a desired DC test can be performed by setting the state thereof through boundary scan registers.

Logic implemented by a DC control circuit 3 in each of the structures shown in FIGS. 7A to 8B is essentially implemented by the logic shown in FIG. 5 while modified depending on the structure of the I/O cell A set signal BSRSET and a reset signal BSRRST are individually supplied to the boundary scan registers and the logic circuits.

According to the third embodiment of the present invention, as hereinabove described, I/O cells of various internal structures can be readily set in desired states and signal propagation delay as well as increase of the circuit scale can be suppressed by means of circuits provided for a boundary scan test by arranging boundary scan registers included in the test cells TC dependently on the various structures of the I/O cells. Further, logic circuits are arranged for control signals setting pull-up and pull-down states not defined in the boundary scan test, and hence the circuit scale can be simplified and control is also simplified as compared with the structure utilizing boundary scan registers. In addition, a buffer circuit can be readily externally set to an externally observable state by utilizing the boundary scan registers and the logic circuits, and a precise test can be readily implemented.

Fourth Embodiment

Figure 9:
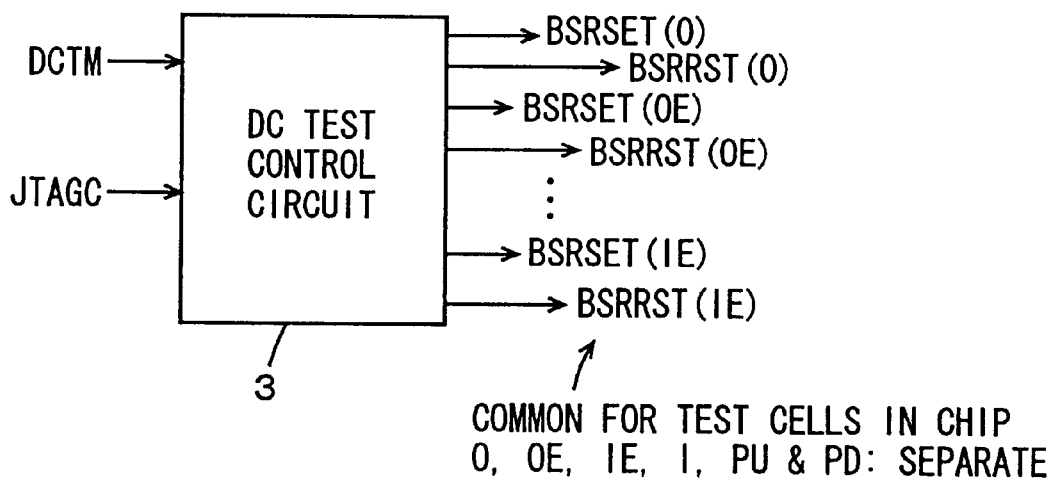
FIG. 9 schematically illustrates output signals from a DC test control circuit according to a fourth embodiment of the present invention.

FIG. 9 illustrates the structure of a main part of a semiconductor integrated circuit device according to a fourth embodiment of the present invention. Referring to FIG. 9, a DC test control circuit 3 is provided for each chip. The DC test control circuit 3 receives a DC test mode control signal DCTM and a JTAG test control signal JTAGC for controlling a JTAG test (boundary scan test) and outputs set signals BSRSET and reset signals BSRRST in common to test cells TC provided in the chip. DC test control circuit 3 individually outputs the set signals BSRSET and the reset signals BSRRST depending on functions of boundary scan registers provided in each test cell TC. FIG. 9 representatively shows a set signal BSRSET(O) and a reset signal BSRRST(O) for a boundary scan register provided for an output buffer, a set signal BSRSET(OE) and a reset signal BSRRST(OE) supplied to a boundary scan register provided for an output enable signal OE, and a set signal BSRSET(IE) and a reset signal BSRRST(IE) for a boundary scan register provided for an input enable signal IE. Additional boundary scan registers are provided for an input signal I, a pull-up instruction signal PU and a pull-down instruction signal PD, and are individually supplied with set and reset signals.

When JTAG test control signal JTAGC specifies setting or resetting, DC test control circuit 3 sets the set and reset signals BSRSET and BSRRST to set or reset states in accordance with JTAG test control signal JTAGC. Therefore, a DC test and a boundary scan test (JTAG test) can be performed through the same boundary scan registers. DC test control circuit 3 is arranged in common for test cells TC provided in the chip, and hence increase of the circuit scale for the test can be suppressed.

As JTGA test control signal JTAGC, an update signal UPDATE, a shift signal SHIFT, a set signal SET and a reset signal RESET for initialization are supplied to the boundary scan registers shown in FIG. 2. Operations of these signals are described later.

[Modification]

Figure 10:
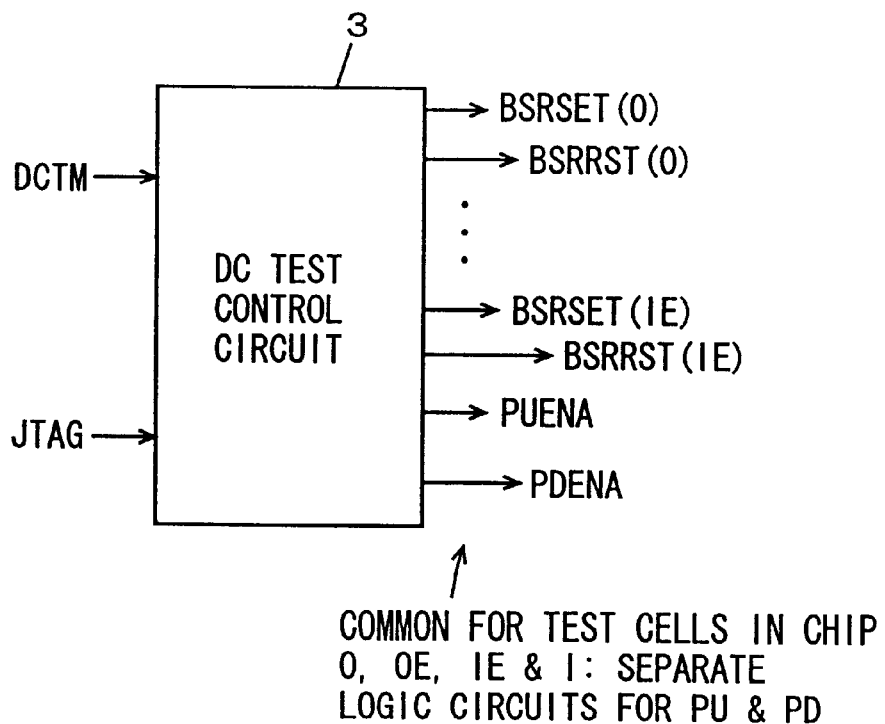
FIG. 10 illustrates a modification of the fourth embodiment of the present invention.

FIG. 10 illustrates a modification of the fourth embodiment of the present invention. Referring to FIG. 10, a DC test circuit 3 outputs an enable signal PDENA to a logic circuit provided for a pull-down instruction signal, and outputs a pull-up enable signal PUENA to a logic circuit LU provided for a pull-up instruction signal PU. The remaining structure of this modification is identical to that shown in FIG. 9. Similarly to the structure shown in FIG. 9, DC test control circuit 3 supplies set and reset signals in common to test cells TC provided in a chip. However, boundary scan registers provided in test cells TC are individually supplied with set and reset signals.

In the structure shown in FIG. 10, logic circuits are provided for pull-up instruction signal PU and pull-down instruction signal PD in place of boundary scan registers (see FIG. 7A). In this case, enable signals PUENA and PDENA are output in place of the set and reset signals. Pull-up enable signal PUENA and pull-down enable signal PDENA can be generated by the same logic as the logic (see FIG. 5) for generating the set and reset signals for pull-up instruction signal PU and pull-down instruction signal PD. The signals PUENA and PUDNA are independent of a JTAG test control signal JTAGC (a pull up/pull down test is not defined in the JTAG test).

According to the fourth embodiment of the present invention, as hereinabove described, the DC test control circuit is arranged for each chip (semiconductor integrated circuit device) for outputting set and reset signals in common to the test cells TC provided in the chip, whereby increase of the circuit scale for the DC test can be suppressed.

Fifth Embodiment

Figure 11:
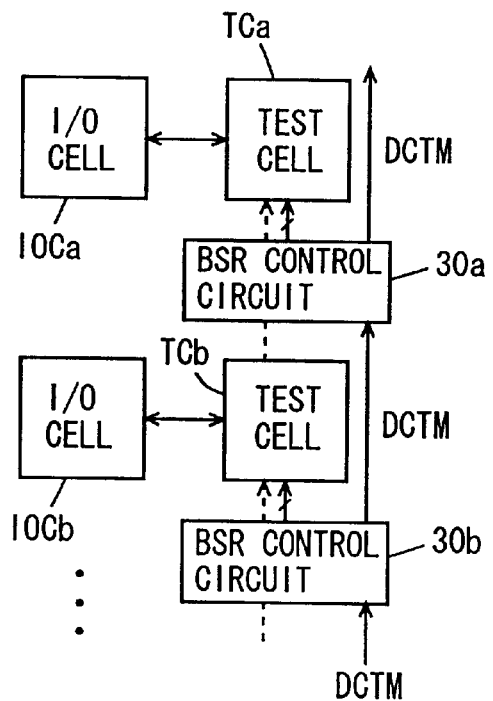
FIG. 11 schematically illustrates the structure of a main part of a semiconductor integrated circuit device according to a fifth embodiment of the present invention.

FIG. 11 schematically illustrates the structure of a main part of a semiconductor integrated circuit device according to a fifth embodiment of the present invention. In the structure shown in FIG. 11, boundary scan register (BSR) control circuits 30a and 30b are arranged in correspondence to test cells TCa and TCb corresponding to I/O cells IOCa and IOCb respectively. Boundary scan register control circuits 30a and 30b supply set and reset signals only to corresponding test cells TCa and TCb. A test mode control signal DCTM is transmitted between the adjacent boundary scan register control circuits 30a and 30b.

Between these test cells TCa and TCb, a path (shown by broken lines in FIG. 10) transmitting test data and the control signal in a boundary scan test is arranged. The test mode control signal DCTM is a 3-bit signal, for example, and hence only a 3-bit signal line is arranged between adjacent cells, to reduce the area occupied by the line.

Figure 12:
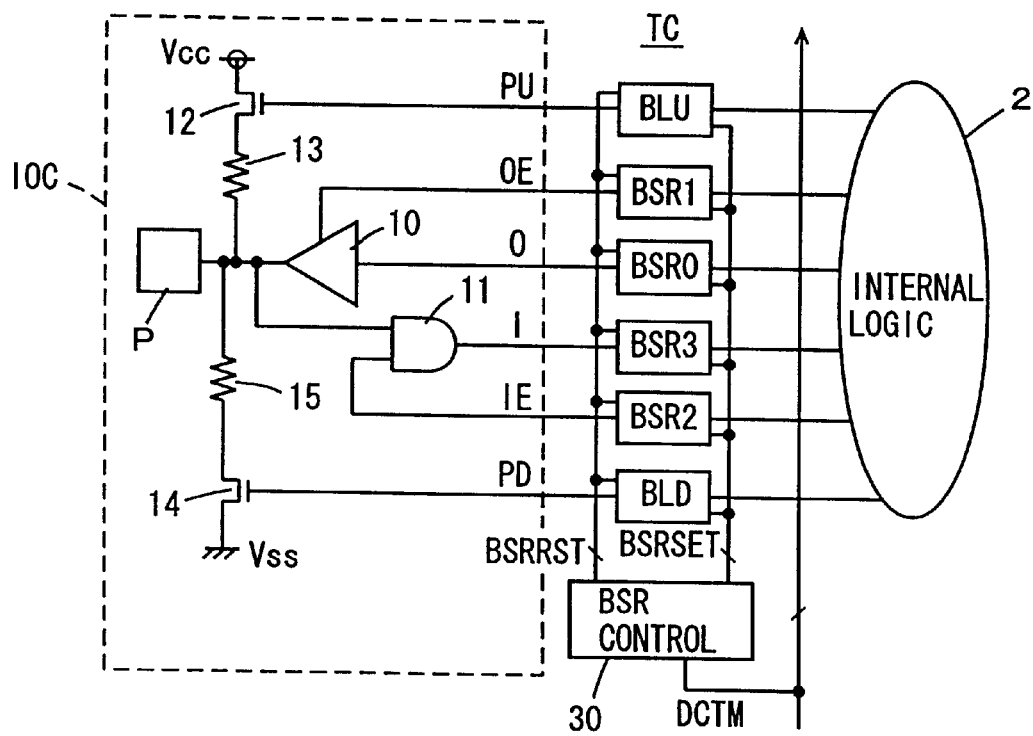
FIG. 12 schematically illustrates the structure of a cell and a corresponding BSR control circuit shown in FIG. 11.

FIG. 12 schematically illustrates the structure of a part related to a single cell in the structure shown in FIG. 11. Referring to FIG. 12, a single BSR control circuit 30 is arranged for an I/O cell IOC and a test cell TC. BSR control circuit 30 individually supplies a set signal BSRSET and a reset signal BSRRST to respective boundary scan registers BSR0 to BSR3 and boundary scan registers/logic circuits BLU and BLD included in test cell TC. BSR control circuit 30 is supplied with test mode control signal DCTM from a circuit part (not shown). Test mode control signal DCTM is supplied also to a BSR control circuit 30 provided for an adjacent I/O cell IOC.

BSR control circuit 30 outputs the set and reset signals BSRSET and BSRRST for the six boundary scan registers or logic circuits. Thus, BSR control circuit 30 outputs 12 control signals in total (when the boundary scan registers are employed for pull-up and pull-down control). On the other hand, test mode control signal DCTM is a 3-bit signal, for example, as shown in FIG. 5. As compared with a structure of arranging 12 types of control signal lines for each I/O cell, therefore, a 3-bit control signal line is simply arranged between I/O cells, to reduce the area occupied by the line. 12 types of signals BSRSET and BSRRST may simply be arranged in test cell TC, whereby the area occupied by the line between the I/O cells can be reduced, thereby reducing the area occupied by the chip of the integrated circuit device as a consequence (particularly effective when I/O cells are distributedly arranged).

According to the fifth embodiment of the present invention, as hereinabove described, the control circuit for a DC test is arranged in correspondence to the I/O cell, whereby the area occupied by the line between the I/O cells can be reduced and the area occupied by the chip can be responsively reduced.

Logic implemented by BSR control circuits 30a or 30b and 30 shown in FIGS. 11 and 12 is identical to that shown in FIG. 5. When a test mode signal TESTMODE specifies a DC test mode, control signals for the boundary scan registers or logic circuits are generated in accordance with the specified test mode function. When a boundary scan test is specified, the set and reset signals BSRSET and BSRRST for each boundary scan register are generated in accordance with set and reset signals for the boundary scan test control.

Sixth Embodiment

Figure 13:
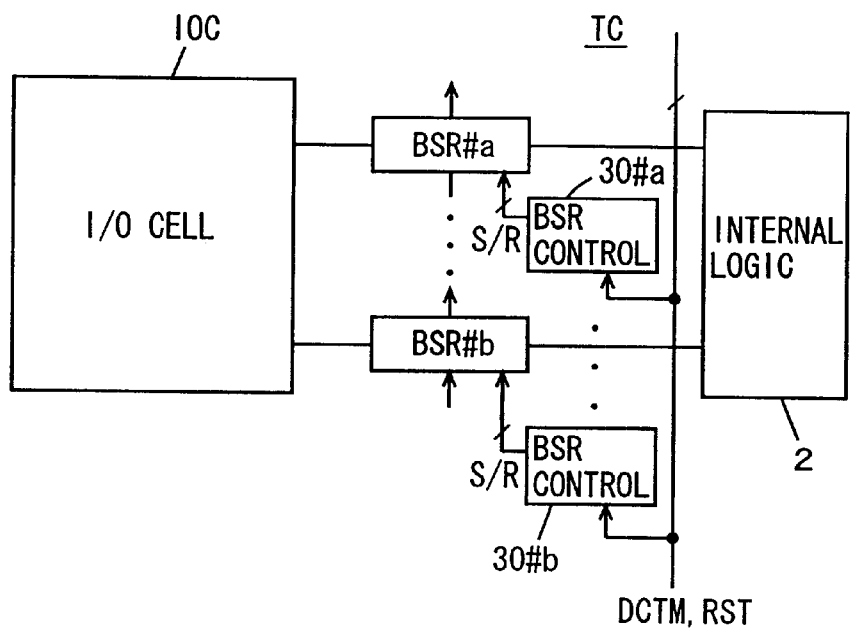
FIG. 13 schematically illustrates the structure of a main part of a semiconductor integrated circuit device according to a sixth embodiment of the present invention.

FIG. 13 schematically illustrates the structure of a main part of a semiconductor integrated circuit device according to a sixth embodiment of the present invention. In the structure shown in FIG. 13, BSR control circuits 30#a . . . 30#b are provided for boundary scan registers BSR#a . . . BSR#b included in a test cell TC, respectively. BSR control circuits 30#a . . . 30#b output set and reset signals SIR to corresponding boundary scan registers BSR#a . . . BSR#b. A test mode control signal DCTM and a reset signal RST are supplied to BSR control circuits 30#a . . . 30#b. Reset signal RST is a signal for resetting a direct current test mode.

In the arrangement shown in FIG. 13, test mode control signal DCTM is transmitted between the boundary scan registers BSR#a . . . BSR#b in addition to a control signal for a boundary scan test. Therefore, test mode control signal DCTM is a 3-bit control signal for implementing the DC test functions shown in FIG. 5, for example, and there is no need to arrange 12 control signal lines between the boundary scan registers, and the area occupied by lines is reduced. Particularly, when an I/O cell IOC is a simple output or input buffer cell and boundary scan registers BSR are dispersively arranged in test cell TC, no unnecessary control signal lines need be arranged in the test cell TC, and the area occupied by lines can be remarkably reduced.

The internal structure of BSR control circuits 30#a . . . 30#b may implement the logic shown in FIG. 5. If test cell TC includes logic circuits for controlling a pull-up instruction signal PU and a pull-down instruction signal PD, enable signals PUENA and PDENA are generated in place of the set/reset signals S/R.

According to the sixth embodiment of the present invention, as hereinabove described, a circuit for DC test control is arranged in correspondence to boundary scan registers or logic circuits, whereby only a DC test mode control signal before decoding can be transmitted between the boundary scan registers and the area occupied by the lines is reduced.

Seventh Embodiment

Figure 14:
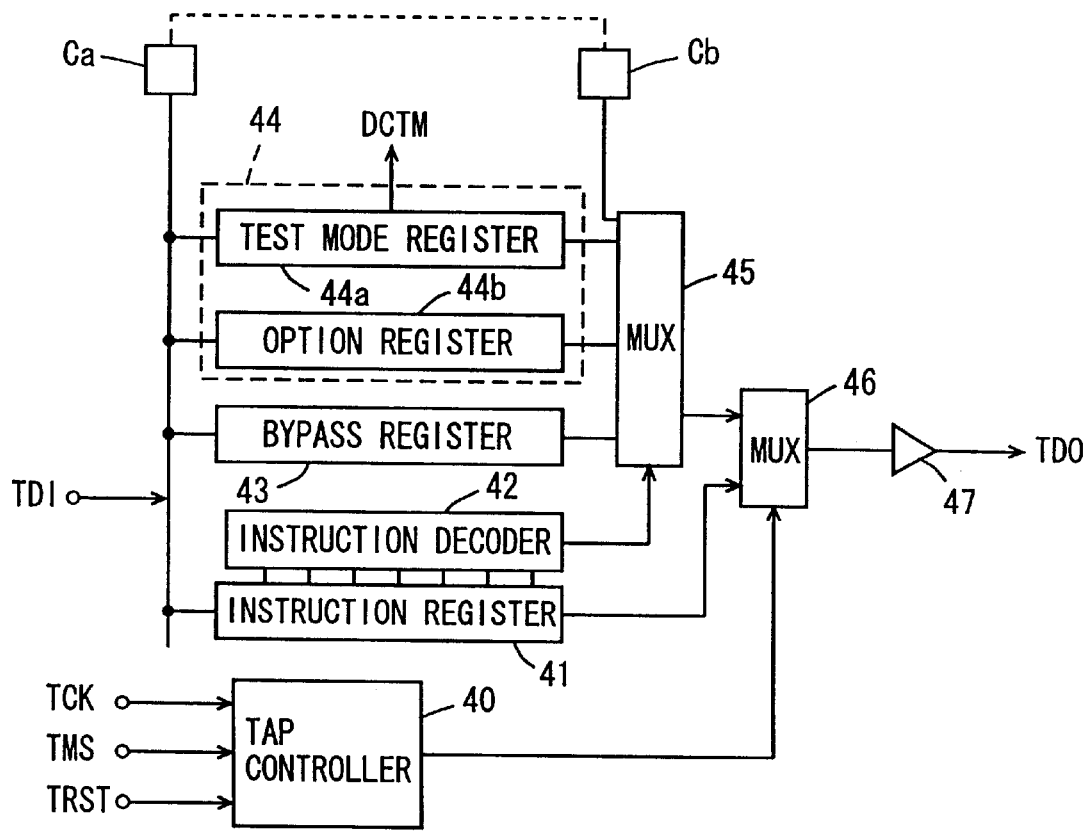
FIG. 14 schematically illustrates the structure of a main part of a semiconductor integrated circuit device according to a seventh embodiment of the present invention.

FIG. 14 illustrates the structure of a main part of a semiconductor integrated circuit device according to a seventh embodiment of the present invention. Referring to FIG. 14, the semiconductor integrated circuit device supports a JTAG test, and includes a control circuit for performing a boundary scan test. This boundary scan test circuit includes a TAP (test access port) controller 40 receiving a test clock signal TCK applied in a test mode, a test mode selection signal TMS selecting and specifying the test mode and a reset signal TRST for resetting the test mode, and generating an internal clock signal for the boundary scan test and the like, an instruction register 41 receiving test data TDI serially applied in a unit of one bit through a test data input terminal, an instruction decoder 42 decoding an instruction stored in the instruction register 41 and generating a control signal necessary for the boundary scan test, a bypass register 43 for bypassing the test data TDI, and a user-defined register group 44, the application of which is defined by the user. The user-defined register group 44 includes an option register 44b storing an ID code for identifying the device and the like, and a test mode register 44a storing a test mode control signal DCTM specifying a direct current (DC) test mode.

The boundary scan test circuit further includes a multiplexer (MUX) 45 selecting either one of output data from the user-defined register group 44, the bypass register 43 and a cell Cb, a multiplexer 46 selecting one of the multiplexer 45 and the instruction register 41 in accordance with the output signal of TAP controller 46, and a driver/buffer 47 buffering an output signal of the multiplexer 46 for outputting to a test data output terminal TDO. Test data output terminal TDO is employed as a terminal for outputting a data signal DO or set in a high impedance state in a normal operation mode.

The boundary scan test circuit shown in FIG. 14 is standardized in the aforementioned IEEE standard. In the seventh embodiment of the present invention, the register 44a included in the user-defined register group 44 included in the boundary scan test circuit is used as a test mode register 44a storing the test mode control signal for performing the direct current (DC) test. Test mode register 44a supplies the test mode control signal DCTM to a BSR control circuit, for applying various signals to boundary scan registers included in each test cell. BSR control circuit may be arranged in accordance with any arrangement shown in FIGS. 9 to 13.

The boundary scan test circuit is provided in every device supporting the boundary scan test. The direct current test can be readily performed with no requirement for an additional circuit by generating the control signal for performing the direct current test not defined in the boundary scan test through the boundary scan test circuit.

TAP controller 40 is a state machine (sequential circuit) controlling the boundary scan registers in accordance with test mode selection signal TMS and test clock signal TCK. TAP controller 40 decodes the test mode selection signal TMS thereby shifting from a certain state to another state for controlling the boundary scan registers in accordance with the state. Storage of an instruction in instruction register 41 or storage of user-defined data in user-defined register group 44 is executed under the control of TAP controller 40. Once the test mode control signal DCTM is set in the test mode register 44a, therefore, the state of the control signals for the boundary scan test is arbitrary in a DC test operation since a set/reset signal serving as the direct current test control signal fixes the logical value of an output signal from each test cell.

When direct current test control signal DCTM is set to the test mode register 44a, TAP controller 40 is set to execute selection-DR scan for supplying a test mode register selection instruction to instruction register 41 to select the test mode register 44a, and thereafter makes transition to a capture-DR state. Thus, test mode register 44a stores the test mode control signal DCTM for performing a desired direct current test. Output is executed in an update DR state.

The structure shown in FIG. 14 utilizes the user-defined register included in the boundary scan test circuit provided in the device supporting the boundary scan test for direct current test mode control, and requires no additional pin terminal for externally applying the direct current test mode control signal DCTM (the test access port is generally provided with five pin terminals TDI, TCK, TMS, TRST and TDO (TRST may be optional)). Therefore, a desired direct current test can be readily performed without increasing the number of the pins. Transmission of a control signal for setting the state of an I/O cell is also controlled under the control of the boundary scan test circuit, and no additional circuit dedicated to the direct current test mode need be provided, and increase of the circuit scale can be suppressed.

The instruction register 41 can store instruction bits for TAP controller 40, for making the integrated circuit device execute various functions in accordance with instructions stored in instruction register 41.

Eighth Embodiment

Figure 15:
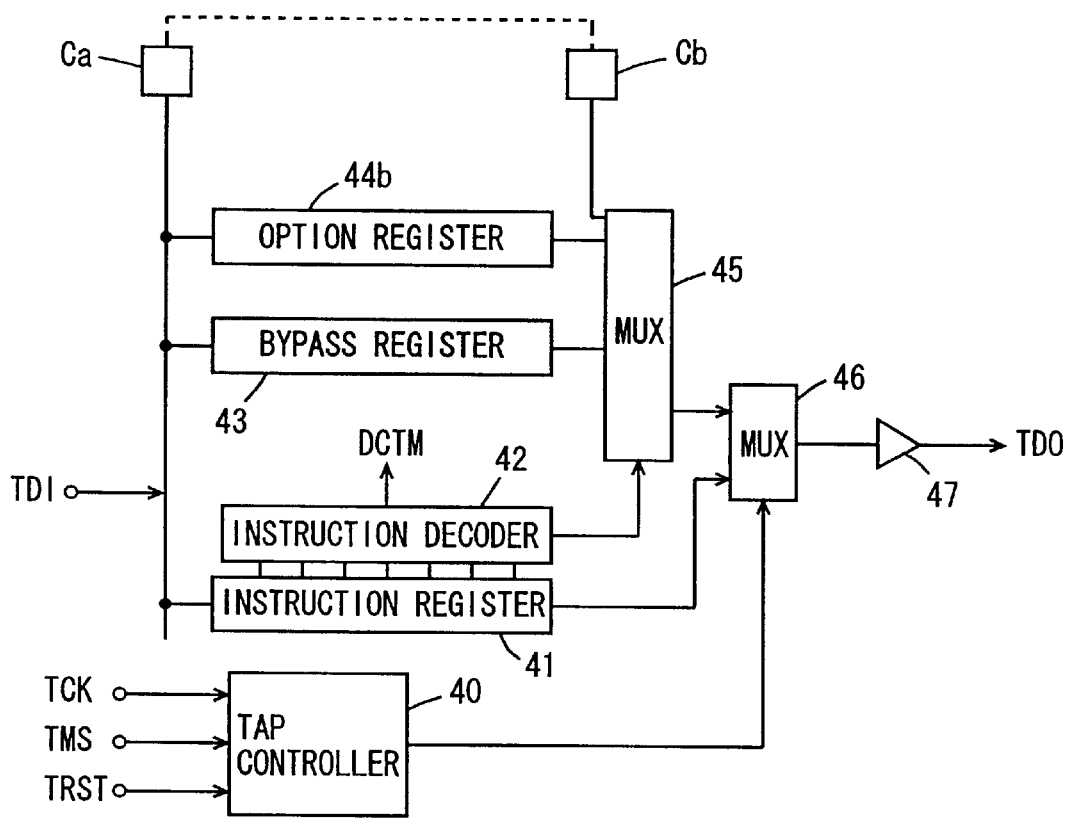
FIG. 15 schematically illustrates the structure of a main part of a semiconductor integrated circuit device according to an eighth embodiment of the present invention.

FIG. 15 illustrates the structure of a main part of a semiconductor integrated circuit device according to an eighth embodiment of the present invention. In the structure shown in FIG. 15, an instruction decoder 42 included in a boundary scan test circuit generates direct current test mode control signals DCTM. Provided as registers are a bypass register 43 for bypassing the semiconductor integrated circuit device in a boundary scan test, and an option register 44b having the function thereof defined by a user. In the standard of the boundary scan test, it is defined that types of implemented instructions and codes of the instructions can be set with a certain degree of freedom. Therefore, instruction codes having no functions allocated in the boundary scan test are utilized as instructions for the direct current test. Six types of direct test mode control signals DCTM are present and hence six instructions are prepared for the direct current test. The number of the instructions can be readily increased by expanding the bit width of an instruction register (when no reserved instruction code is present).

The instruction decoder 42 supplies DC test mode control signals DCTM to BSR control circuits identical to those described with reference to the aforementioned embodiments.

The structure shown in FIG. 15 utilizes the boundary scan test circuit itself for performing the direct current test, whereby the circuit structure for the direct current test can be reduced and increase of the circuit scale can be suppressed. Further, there is no need to provide an instruction register for persistently applying the direct current test mode control signals to a boundary scan register control circuit, and increase of the circuit scale can be suppressed.

Ninth Embodiment

Figure 16:
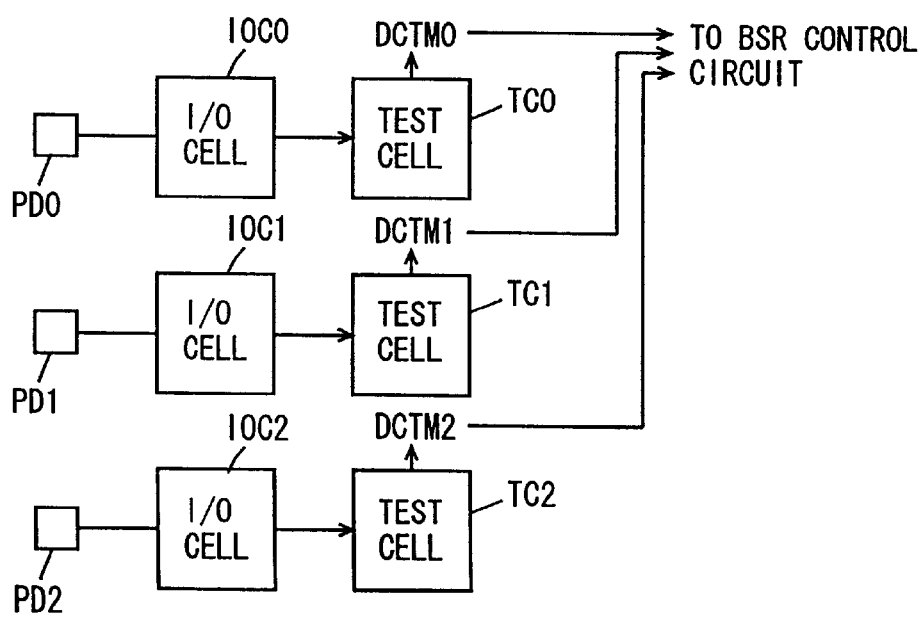
FIG. 16 schematically illustrates the structure of a main part of a semiconductor integrated circuit device according to a ninth embodiment of the present invention.

FIG. 16 illustrates the structure of a main part of a semiconductor integrated circuit device according to a ninth embodiment of the present invention. In the structure shown in FIG. 16, DC test control signals DCTM0 to DCTM2 are externally supplied through pads PD0 to PD2. Test mode control signals supplied to pads PD0 to PD2 are captured in input boundary scan registers included in corresponding test cells TC0 to TC2 through I/O cells IOC0 to IOC2 respectively, and supplied to an internally provided BSR control circuit(s). BSR control circuit can have any of the arrangements described with reference to the aforementioned embodiments (see FIGS. 9 to 13). Pads PD0 to PD2 may be adjacent to each other or dispersed.

The control signals for setting the states of the respective I/O cells for performing a DC test are supplied from pads PD0 to PD2 and held in the input boundary scan registers, and hence no dedicated pin terminal is necessary for performing the DC test. Further, no data for performing the DC test is propagated in accordance with a shift operation, whereby the test function can be set at a high speed and increase of the test time can be suppressed.

Figure 17:
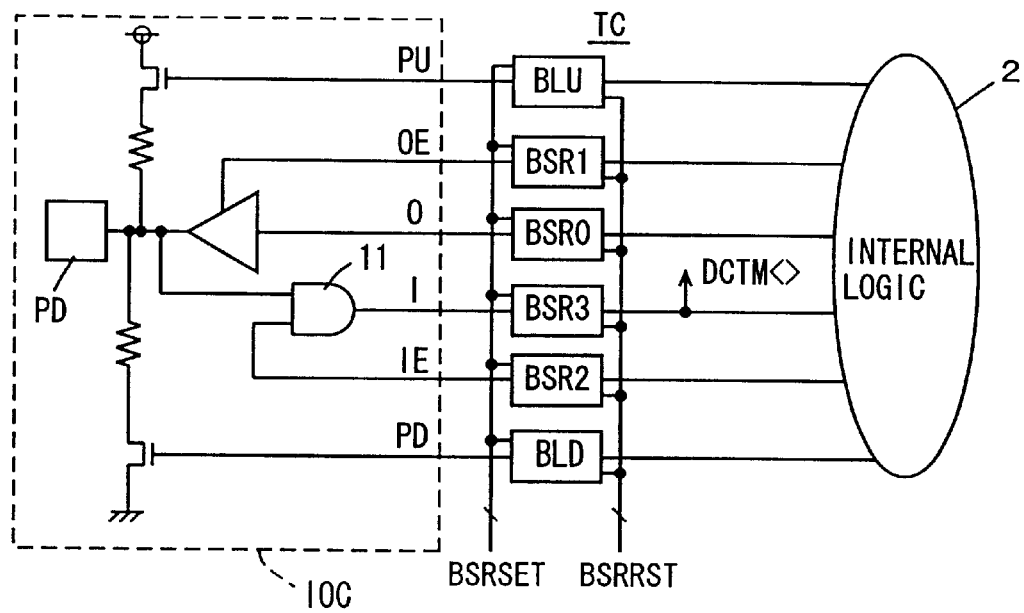
FIG. 17 schematically illustrates the structure of a single cell shown in FIG. 16.
Figure 18:
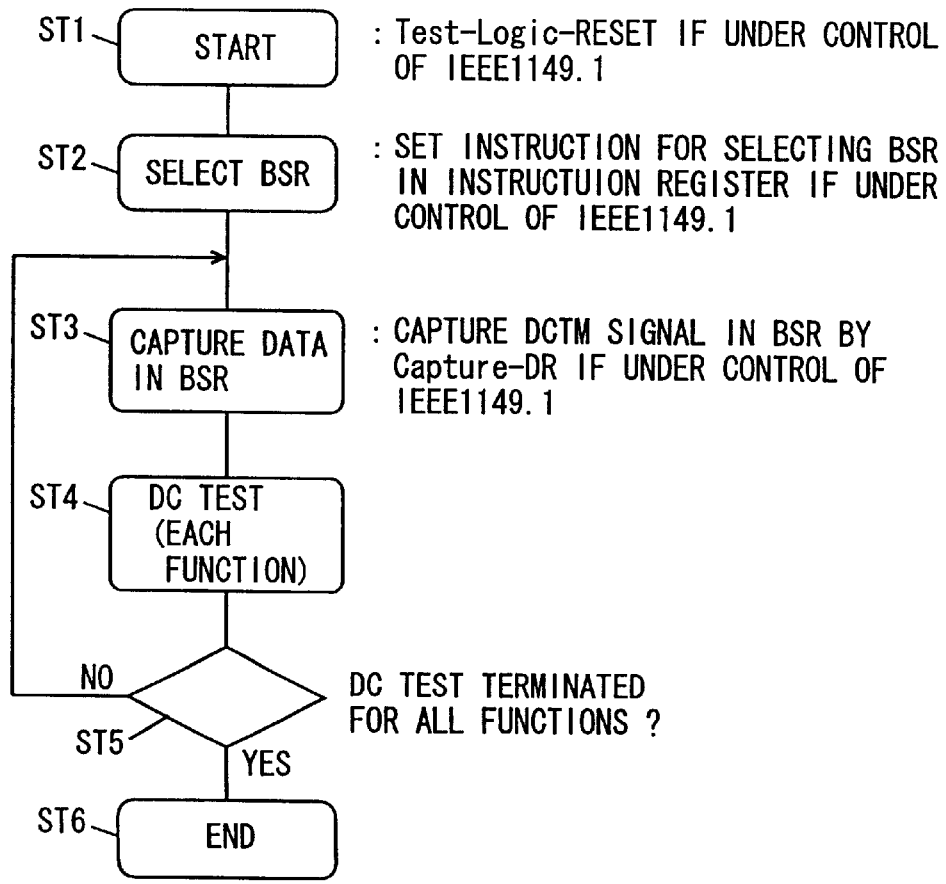
FIG. 18 is a flow chart showing a test operation sequence in the ninth embodiment of the present invention.

FIG. 17 schematically illustrates a structure for a single pad PD in the arrangement shown in FIG. 16. Referring to FIG. 17, at least an input buffer 11 is arranged in an I/O cell IOC. For this input buffer 11, two boundary scan registers BSR2 and BSR3 are provided in a test cell TC. Boundary scan register BSR3 stores a direct current test mode control signal DCTM<> received from pad PD through input buffer 11. Operations for capturing the direct current test control signal in the arrangement shown in FIG. 17 will now be described with reference to a flow chart shown in FIG. 18.

First, test cell TC is set in an initial state (step ST1). When the boundary scan test circuit shown in FIG. 14 or 15 operates under the control of the boundary scan test standard IEEE 1149.1, a TAP controller 40 is set in a Test-Logic-RESET state for this initialization with a test mode selection signal TMS. The initialization may alternatively be performed simply with a reset signal TRST. Thus, the boundary scan test circuit is initialized.

Then, a boundary scan register is selected (step ST2). In the case of the IEEE standard, TAP controller 40 is set in a select-DR scan state for selecting a data register (DR) in the boundary scan test circuit, and an instruction for selecting the boundary scan register BSR is stored in the instruction register. This is done for distinguishing the boundary scan register from data registers such as the option register and the bypass register shown in FIG. 14 or 15.

After boundary scan register BSR is selected at the step ST2, a signal supplied to pad PD is captured in boundary scan register BSR through I/O cell IOC (a Capture operation is performed (step ST3)). In this case, a normal sample instruction SAMPLE may be executed. With the boundary scan test circuit according to the standard IEEE 1149.1, TAP controller is set in a Capture-DR state with the test mode selection signal TMS. In accordance with the Capture-DR state, the boundary scan register BSR2 outputs a signal of logic "1" and input buffer 11 supplies the signal supplied to pad PD to boundary scan register BSR, which in turn captures and latches the supplied data. The signal captured (acquired) in boundary scan register BSR3 is generated in a state of being disconnected from internal logic since the TAP controller is not in an UPDATE state (a through latch is in a latch state). In other words, a shift register (flip-flop) included in the boundary scan register captures the signal DCTM<>. The BSR control circuit decodes the signal DCTM<> stored in boundary scan register BSR3 and sets each boundary scan register or logic circuit in a specified state.

After this state setting, the DC test is executed at the step ST4. This DC test is executed per function.

When the DC test is completed at the step ST4, whether all functions of the DC test are completed is determined at a step ST5. If every function is not terminated, the test process returns to the step ST3 again so that a DC test mode control signal of a prescribed state is supplied to pad PD for setting the function to be executed next, boundary scan register BSR 3 captures the data again and DC test control signal DCTM<> (DCTM0 to DCTM2) specifying the next function is generated for executing the next DC test function.

If a determination is made at the step ST5 that all functions are completed, the test process advances to a step ST6 to terminate the DC test.

In the DC test, boundary scan register BSR3 holds the DC test mode control signal. Upon executing each function of the DC test shown in FIG. 5, the state of boundary scan register BSR3 receiving the output signal I from input buffer 11 is arbitrary and hence no problem arises in the DC test in particular. This corresponds to the previous description that the reset/reset state of boundary scan register BSR3 receiving the output signal I from input buffer 11 is arbitrary and any set/reset signal may be utilized. However, the structure shown in FIGS. 16 and 17 prevents the boundary scan register BSR3 from being forcibly set in a set or reset state in the DC test mode, and hence the set/reset state of boundary scan register BSR3 provided for output signal I of input buffer 11 may not particularly be controlled in the DC test. Only a set/reset signal for the boundary scan test is necessary.

According to the ninth embodiment of the present invention, as hereinabove described, the boundary scan register provided for the input buffer holds the DC test mode control signal, and hence test data need not be sequentially propagated through a shift path connecting a plurality of boundary scan registers for setting the state of the I/O cell, and the test time can be reduced. Further, the DC test mode control signal is simply stored in the boundary scan register through I/O cell IOC, and hence the I/O cell can be readily set in a desired state. In addition, no specific additional circuit is required for controlling the state of the I/O cell in the test mode, and increase of the circuit scale can be suppressed.

Tenth Embodiment

Figure 19:
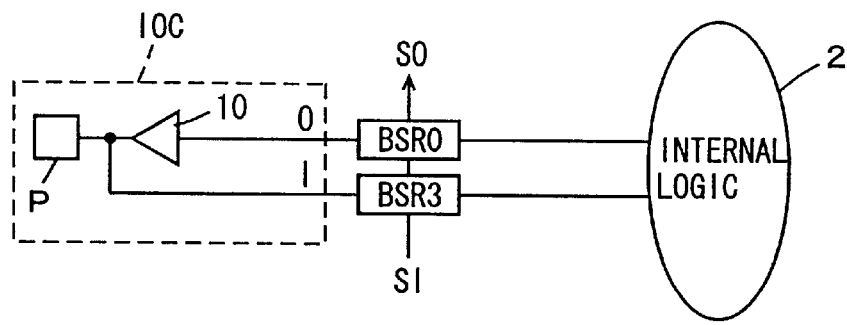
FIG. 19 schematically illustrates the structure of a cell according to a tenth embodiment of the present invention.

FIG. 19 schematically illustrates the structure of a main part of a semiconductor integrated circuit device according to a tenth embodiment of the present invention. In the structure shown in FIG. 19, an I/O cell IOC includes an output buffer 10 coupled to a pad P. The output buffer 10 is not supplied with output control signal (output enable signal) OE. A boundary scan register BSR3 is provided for pad P, and a boundary scan register BSR0 is provided for output buffer 10. Boundary scan registers BSR3 and BSR0 can shift data in a boundary scan test operation. In this shift operation, boundary scan register BSR3 transfers shift-in data SI to boundary scan register BSR0.

Figure 20:
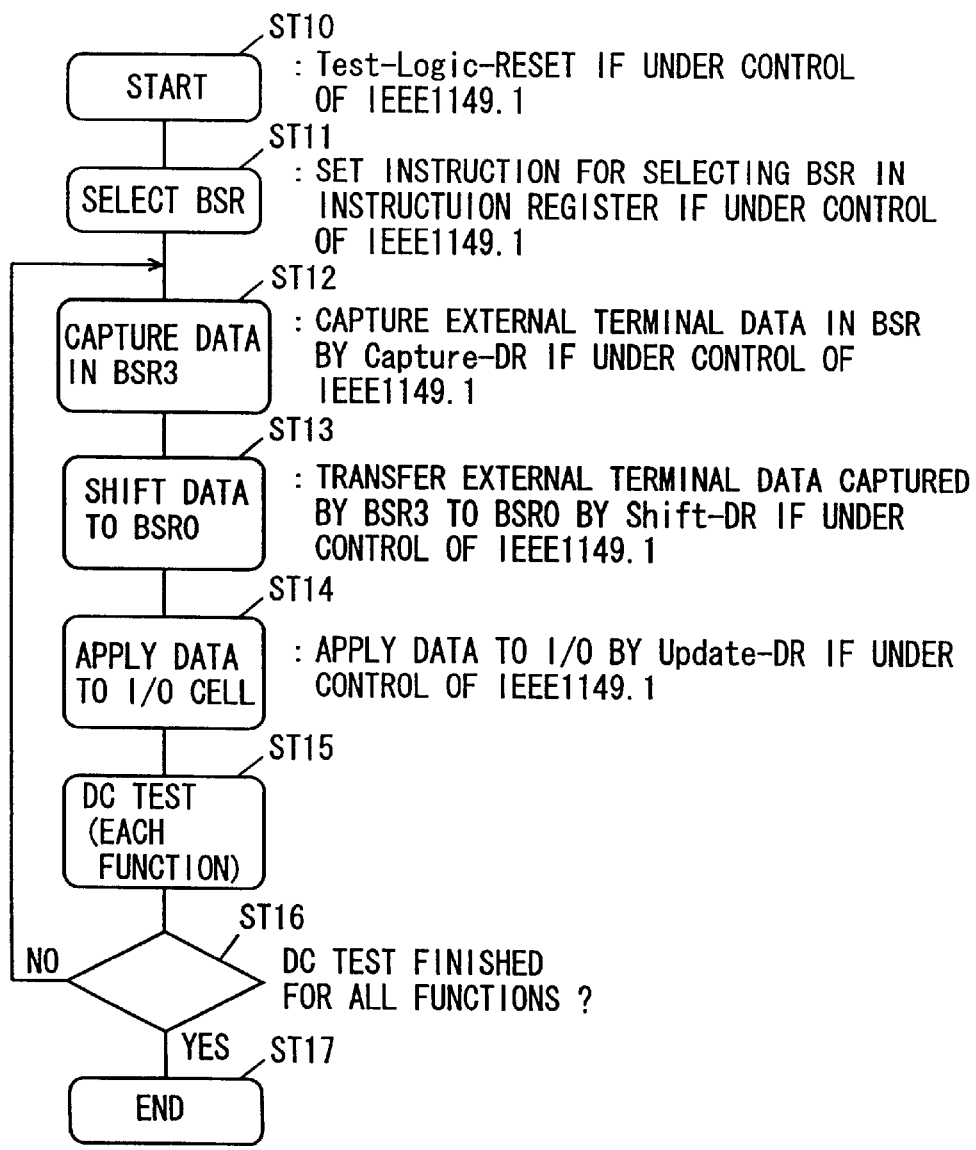
FIG. 20 is a flow chart showing a test operation sequence in the tenth embodiment of the present invention.

A boundary scan test circuit controls the states of boundary scan registers BSR0 and BSR3. No BSR control circuit for a DC test is particularly employed. Operations of the structure shown in FIG. 19 will be now described with reference to a flow chart shown in FIG. 20.

First, the boundary scan test circuit is initialized (step ST10). When the boundary scan test circuit is in accordance with the standard IEEE 1149.1, a TAP controller is set in a Test-Logic-RESET state. Thus, the test circuit is initialized. Boundary scan registers BSR0 and BSR3 are also initialized. A reset signal TRST may be employed for initialization.

Then, the boundary scan test circuit is set in a state of selecting the boundary scan register BSR (step ST11). This is implemented by setting the TAP controller in a select-DR-scan state in accordance with a test mode selection signal TMS and thereafter setting an instruction of selecting the boundary scan register (BSR) in an instruction register.

After the boundary scan test circuit is set in the state of selecting the boundary scan register BSR, a signal of a desired logical level is applied to pad P and boundary scan register BSR3 is made to capture (acquire) the signal supplied to pad P (step ST12). TAP controller is set in a Capture-DR state, so that boundary scan register BSR3 captures a signal I supplied to pad P.

Then, the data acquired in boundary scan register BSR3 is transferred to boundary scan register BSR0 through a scan path (step ST13). This is implemented by setting the TAP controller into a Shift-DR state in a boundary scan test for making a shift operation in accordance with a test clock signal TCK. Thus, boundary scan register BSR0 captures the signal supplied to pad P.

Only a shift operation is performed and an output signal of boundary scan register BSR0 remains unchanged. At a step ST14, the data acquired in boundary scan register BSR0 is applied to output buffer 10. This is implemented by setting the TAP controller in an Update-DR state when the boundary scan test circuit operates in accordance with the standard IEEE 1149.1 for the boundary scan test. In the case of the Update-DR state, boundary scan register BSR outputs the shifted or captured data to an output pin. If an external test instruction EXTEST is executed, the data captured by boundary scan register BSR3 is not supplied to an internal logic circuit 2. This is because the internal logic 2 is disconnected from boundary scan register BSR when the external test instruction EXTEST is supplied.

At the step ST14, the signal previously supplied through pad P is supplied to pad P through output buffer 10. In this case, therefore, the logical level of pad P can be recognized in advance, a potential test (VIH/VIL determination) for determining logic "1" or "0" of the input signal can also be performed, and the potential levels of high and low outputs (VOH and VOL) of output signals can also be measured.

At a step ST16, whether all functions of the DC test are completed is determined after completion of a test for a function. If every function is not tested, the test process returns to the step ST12 again so that a signal for performing the next function is set to pad P, for repeating similar operations. If a determination is made at the step ST16 that all functions of the DC test are completed, the DC test is completed (step ST17).

In the tenth embodiment of the present invention, as hereinabove described, data to be obtained from the output of the terminal for the DC test is directly input from the corresponding terminal to be captured through the boundary scan register and thereafter output through the output buffer. Therefore, no additional circuit for setting a signal for the DC test needs be provided (the structure for the boundary scan test can be utilized as such), and the circuit scale can be reduced.

Further, no data for setting terminal states of all I/O cells needs be shifted in, shifted out and transmitted through a scan path connected with a number of boundary scan registers, but necessary test data can be set only through transfer from boundary scan register BSR3 to boundary scan register BSR0, and thus the test time can be reduced.

In the structure shown in FIG. 19, I/O cell IOC includes only output buffer 10 and pad P is directly connected with boundary scan register BSR3. However, I/O cell IOC can have any of the structures of the I/O cells described with reference to the first and second embodiments. The I/O cell may have a structure of simply capturing the signal supplied to pad P in the boundary scan register connected with the input terminal and thereafter transferring the signal to the boundary scan register provided in correspondence to the output buffer. The Update/Capture-DR states implement control of an input/output control signal (enable signal). If a pull-up/pull-down control signal is also included, a structure of setting the corresponding boundary scan register in a reset state may be employed (a signal (logic "0") corresponding to the reset state may be shifted in a shift-in operation, and the preceding-stage boundary scan register may be initialized in the shift-in operation).

Eleventh Embodiment

Figure 21:
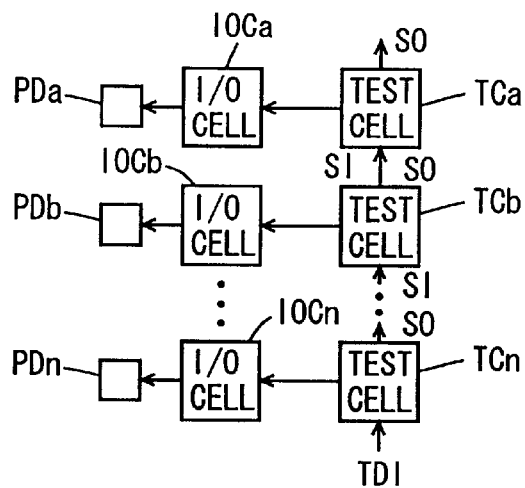
FIG. 21 schematically illustrates the structure of a main part of a semiconductor integrated circuit device according to an eleventh embodiment of the present invention.

FIG. 21 schematically illustrates the structure of a main part of a semiconductor integrated circuit device according to an eleventh embodiment of the present invention. Referring to FIG. 21, I/O cells IOCa . . . IOCn are arranged in correspondence to pads PDa . . . PDn, respectively. Test cells TCa . . . TCn are arranged in correspondence to I/O cells IOCA . . . IOCn. Test cells TCa . . . TCn include boundary scan registers appropriately arranged and connected dependently on the structure of the respective I/O cells IOCa . . . IOCn. The boundary scan registers included in each of the test cells TCa . . . TCn can unidirectionally transfer test data through a scan path.

Figure 22:
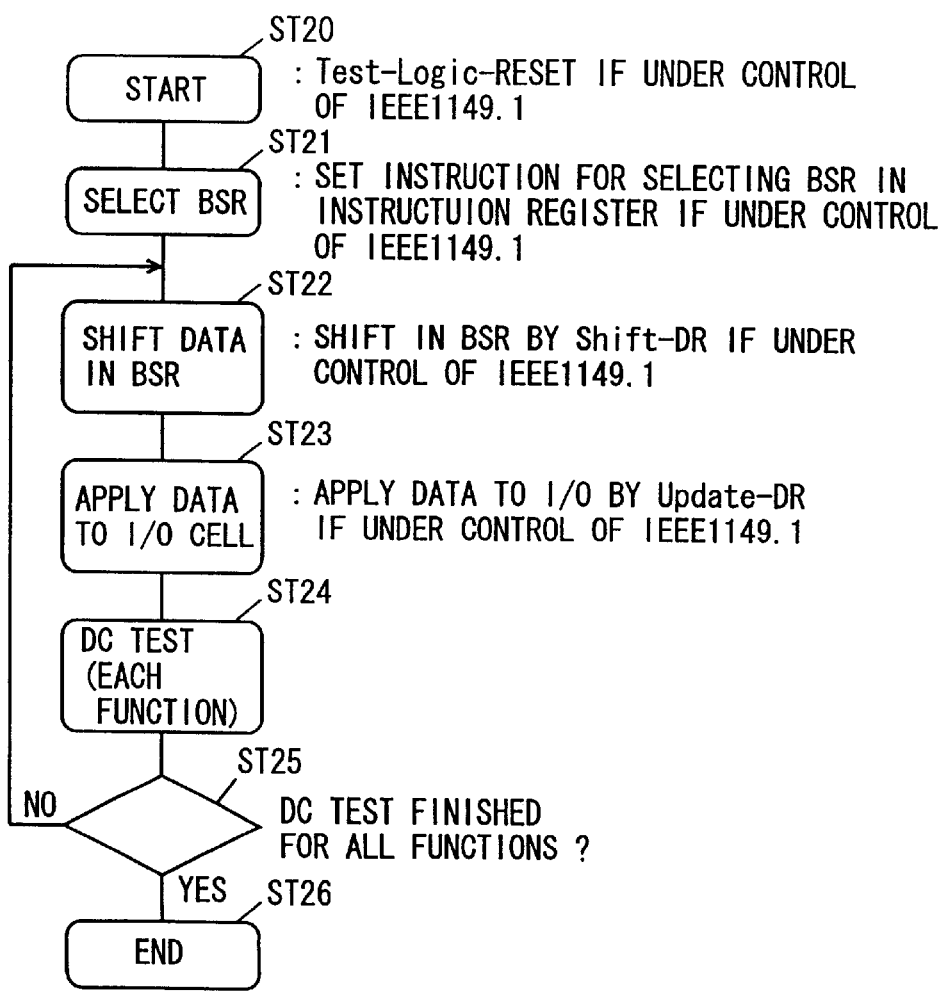
FIG. 22 is a flow chart showing a test operation sequence in the eleventh embodiment of the present invention.

In this embodiment, data setting the states of I/O cells IOCA . . . IOCn are transferred through this serial scan path. Thereafter the test data latched in test cells TCa . . . TCn are output to pads PDa . . . PDn through corresponding I/O cells IOCa . . . IOCn. A desired DC test is executed in this state. Operations of the structure shown in FIG. 21 will now be described with reference to a flow chart shown in FIG. 22.

First, a test circuit is initialized (step ST20). If a BSR control circuit is employed, this circuit is initialized (reset). With a boundary scan test circuit, a TAP controller is set in a Test-Logic-RESET state in accordance with a test mode selection signal TMS or a reset signal TRST.

Then, it is set that the target of control is a boundary scan register BSR, and a control signal for the boundary scan register is rendered valid (step ST21). With the boundary scan test circuit, TAP controller is set in a select-DR-scan state, for setting an instruction of selecting the boundary scan register in an instruction register. Thus, the control signal for boundary scan register BSR is rendered valid. Data is shifted in boundary scan register BSR. In this case, data having a specific pattern (01 . . . ), for example, is input through a test data input terminal TDI and sequentially shifted. With the boundary scan test circuit, TAP controller is set in a shift-DR state in accordance with test mode selection signal TMS, for executing data transfer between the boundary scan registers BSR through the scan path in accordance with a test clock signal TCK (step ST22).

After a desired test pattern is stored in the boundary scan registers, the boundary scan register is made to output the captured data to the corresponding I/O cell (step ST23). With a boundary scan test circuit of the IEEE standard, the TAP controller is set in an Update-DR state. Thus, data captured (shifted in) in the boundary scan registers included in test cells TCa to TCn are output to corresponding I/O cells IOCA . . . IOCn. I/O cells IOCA . . . IOCn are responsively set in prescribed states so that the DC test is executed (step ST24).

When a DC test on a function is completed, whether the test is executed as to all DC test functions is determined (step ST25). If the test is not performed as to all functions, the process returns to the step ST22 again for shifting in test data for performing the next function. If a determination is made at the step ST25 that the test as to all functions is completed, the DC test is terminated (step ST26).

Test data having a prescribed pattern is sequentially transferred through a scan path and set in the boundary scan registers BSR. The structure for the boundary scan test is simply utilized, with no requirement for an additional circuit structure. Each I/O cell is simply set in a desired state for executing the DC test, with no requirement for processing of capturing the test data in the boundary scan register and thereafter sequentially transferring the data for compaling the same with an expected value or the like. In this DC test, all I/O cells IOCa . . . IOCn may be simply in the same states, and hence the same test data pattern can be transferred to test cells TCa . . . TCn, with no requirement for creation of a complicated data pattern.

[Modification]

Figure 23:
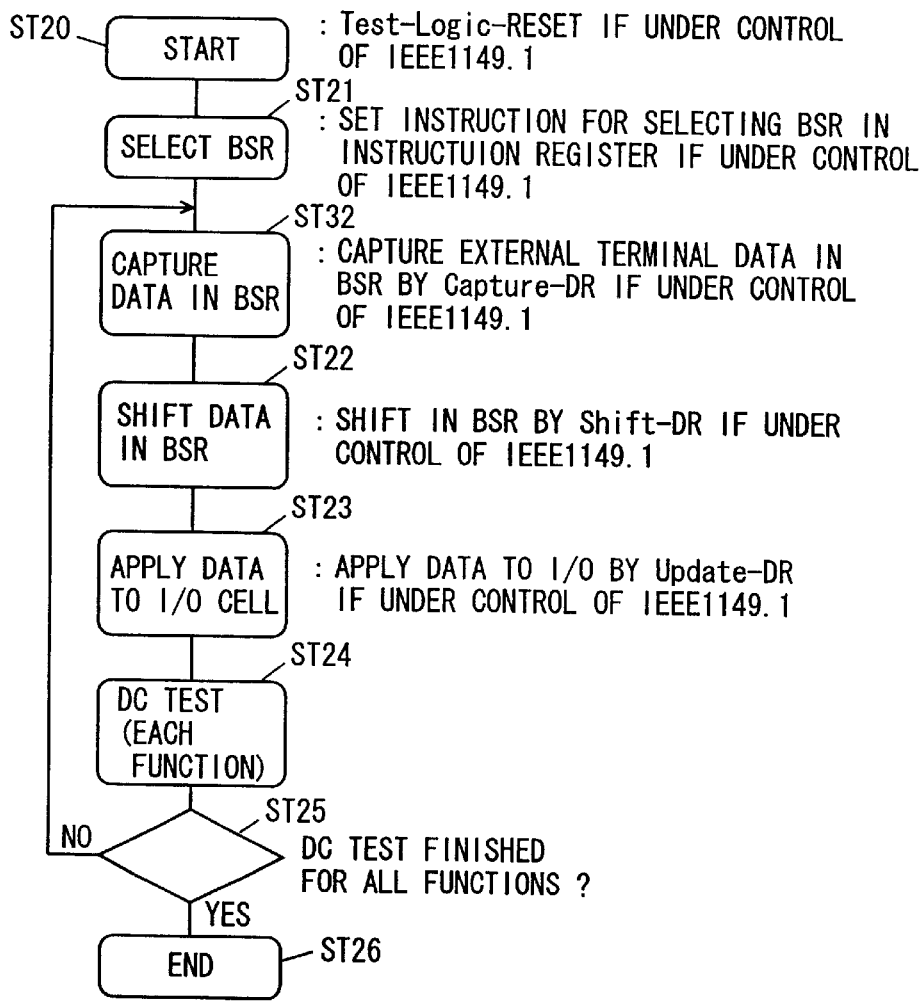
FIG. 23 is a flow chart showing a modification of the test operation sequence in the eleventh embodiment of the present invention.

FIG. 23 is a flow chart showing operations of a modification of the eleventh embodiment of the present invention. In the flow chart shown in FIG. 23, a boundary scan register BSR is selected at a step ST21 and thereafter a step ST32 is executed. At the step ST32, a TAP controller is set in a Capture-DR state, so that an input boundary scan register (boundary scan register coupled to an input terminal) captures data set on an external terminal. Thereafter, test data having a desired pattern is shifted in the boundary scan register, similarly to the flow chart shown in FIG. 22 (step ST22). Subsequent operations are identical to those in the flow chart shown in FIG. 22.

In the flow chart shown in FIG. 23, the input boundary scan register captures the data set on the external terminals. The test data having a desired pattern is shifted in the boundary scan registers and thereafter the data set on the external terminals is shifted through a scan path of the boundary scan registers. The data set on the external terminals is sequentially shifted out through the scan path for observing the relation between the voltage level of a data signal set on an input terminal and the logical level of a read out signal, thereby executing a test on the relation (VIL/VIH) between an input potential and the logical level.

Figure 24A:
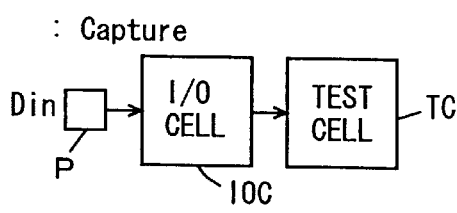
FIGS. 24A to 24D schematically illustrate the overall flow in the flow chart shown in FIG. 23.

FIGS. 24A to 24D typically illustrate the test operation of the flow chart shown in FIG. 23. As shown in FIG. 24A, a boundary scan test circuit is set in a Capture state, for setting data Din supplied to a pad P into an input boundary scan register of a test cell TC through an I/O cell IOC.

Figure 24B:
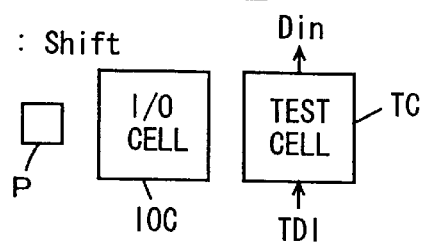

As shown in FIG. 24B, the boundary scan test circuit is set in a Shift state for shifting test data TDI having a desired pattern in the boundary scan test circuit through the boundary scan registers included in the test cell TC. In this case, the external data Din is sequentially transferred through the scan path.

Figure 24C:
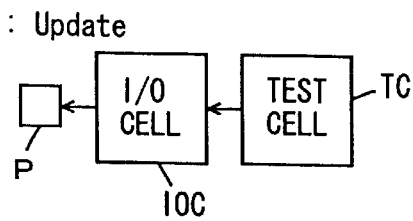

As shown in FIG. 24C, the boundary scan test circuit is set in an Update state after the test data having a desired pattern is set, for setting the I/O cell IOC in a desired state in accordance with the data set in test cell TC. DC test as to one of six functions is executed in this state.

Figure 24D:
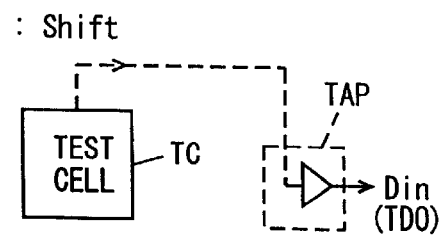

As shown in FIG. 24D, the boundary scan test circuit is set in a Shift state for sequentially transferring data through the scan path. In this case, the external data Din set on a corresponding external terminal is sequentially transferred through the scan path and output through a test access port TAP. Voltage levels VIH and VIL of the input signal can be measured by inputting the external data signal Din while changing the voltage level thereof, and observing the logic of data TDO (Vin) sequentially shifted out from the test access port TAP.

The test time can be reduced by simultaneously executing the shift-in operation for the test data having a desired pattern shown in FIG. 24B and the operation of externally shifting out the data signal supplied to the external terminal shown in FIG. 24D. Thus, the input signal voltages VIL and VIH can also be measured in addition to the six DC test functions shown in FIG. 5.

According to the eleventh embodiment of the present invention, as hereinabove described, the boundary scan test circuit is utilized for shifting and setting the test data having a desired pattern in the test cell through the scan path and thereafter setting the corresponding I/O cell in a prescribed state, whereby no dedicated circuit is required for the DC test, and increase of the area occupied by the circuit can be suppressed. Further, the relationship between the signal voltage supplied to the external terminal and the logical value of the input signal can be measured by shifting the test data after capturing the data supplied to the external terminal.

The corresponding I/O cell is set in a desired state in accordance with the test data set in the test cell for executing the DC test, whereby the DC test for measuring analog values through the boundary scan circuit can be readily executed.

Twelfth Embodiment

Figure 25:
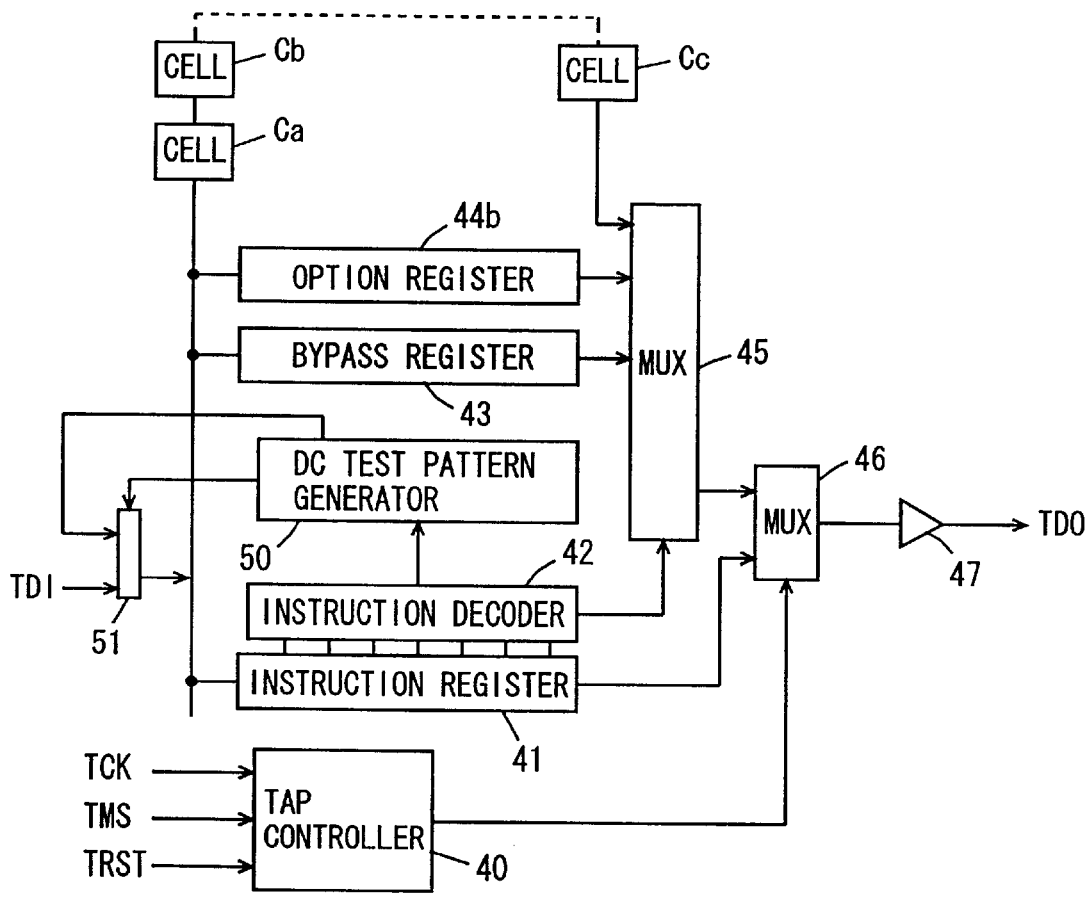
FIG. 25 schematically illustrates the structure of a main part of a semiconductor integrated circuit device according to a twelfth embodiment of the present invention.

FIG. 25 illustrates the structure of a main part of a semiconductor integrated circuit device according to a twelfth embodiment of the present invention. The structure shown in FIG. 25 includes a DC test pattern generator 50 generating a desired pattern in accordance with a DC test (function specification) instruction signal from an instruction decoder 42 and a multiplexer 51 selecting one of the test pattern output from the DC test pattern generator 50 and test data TDI in accordance with the output signal from the DC test pattern generator 50 and transmitting the selected pattern or data to a serial scan path in a test access port (TAP). Cells Ca . . . Cc are connected to this serial scan path. The remaining structure of this embodiment is identical to that shown in FIG. 15, and hence corresponding parts are denoted by the same reference numerals and detailed description thereof is not repeated.

The structure shown in FIG. 25 utilizes an instruction code not used in a boundary scan test for specifying a DC test function. In accordance with a DC test instruction stored in an instruction register 41, instruction decoder 42 decodes this DC test instruction and instructs the DC test pattern generator 50 to generate a desired pattern in accordance with the result of decoding. DC test pattern generator 50 generates the corresponding pattern from instruction decoder 42 among six functions in accordance with a decode signal (the DC test function specification signal).

The test pattern is generated through DC test pattern generator 50 for setting the cells Ca . . . Cc in prescribed states respectively, whereby each cell can be readily set in a prescribed state without newly generating a test pattern. In this case, the test pattern is generated depending on whether each of the cells Ca . . . Cc is an input cell, an output cell or an input/output cell.

Whether the cell is an input cell, an output cell or an input/output cell can be recognized in advance, and cells Ca . . . Cc can be readily set in the prescribed states in testing by repetitively generating the same pattern in a prescribed order in accordance with the cell arrangement order.

[Modification]

Figure 26:
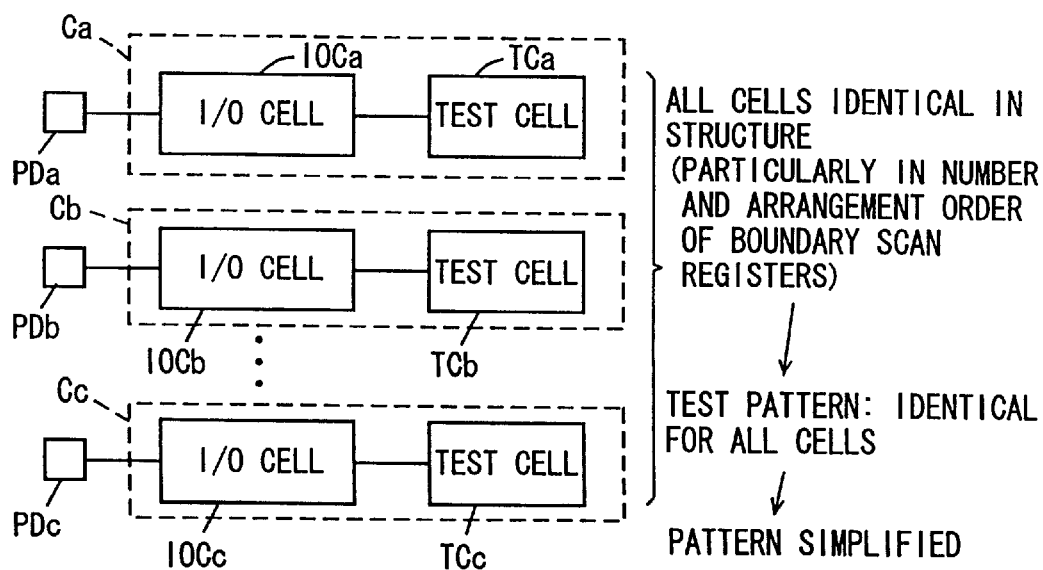
FIG. 26 illustrates a modification of the twelfth embodiment of the present invention.

FIG. 26 illustrates the structure of a modification of the twelfth embodiment of the present invention. Cells Ca . . . Cc include I/O cells IOCA . . . IOCc and test cells TCa . . . TCc respectively. The cells Ca . . . Cc are connected to pads PDa . . . PDc respectively.

In the structure shown in FIG. 26, all cells Ca . . . Cc are identical in structure to each other. In other words, the numbers and arrangement orders of boundary scan registers are made identical in the test cells TCa . . . TCc. I/O cells IOCa . . . IOCc may be identical to or different from each other in structure. When the numbers and arrangement orders of the boundary scan registers are identical to each other in test cells TCa . . . TCc, an operation of setting test data of the same pattern for cells Ca . . . Cc is simply required (for setting respective terminals in the same states). Therefore, DC test pattern generator 50 shown in FIG. 25 is only required to repetitively generate the same pattern by the number of cells Ca . . . Cc. Thus, the pattern in the DC test can be simplified and the circuit scale of DC test pattern generator 50 can be reduced.

According to the twelfth embodiment of the present invention, as hereinabove described, the pattern required for the DC test is generated in the test access port and transferred to the boundary scan registers included in the cells through the scan path for setting the state of each I/O cell, whereby there is no need to externally generate a new pattern in the DC test, and the test structure is simplified.

Further, all cells are identical in structure to each other and hence only application of the same pattern to each cell is required. Thus, the logic of the DC test pattern generator can be simplified and the scale of the DC test pattern generator can be reduced.

Thirteenth Embodiment

Figure 27:
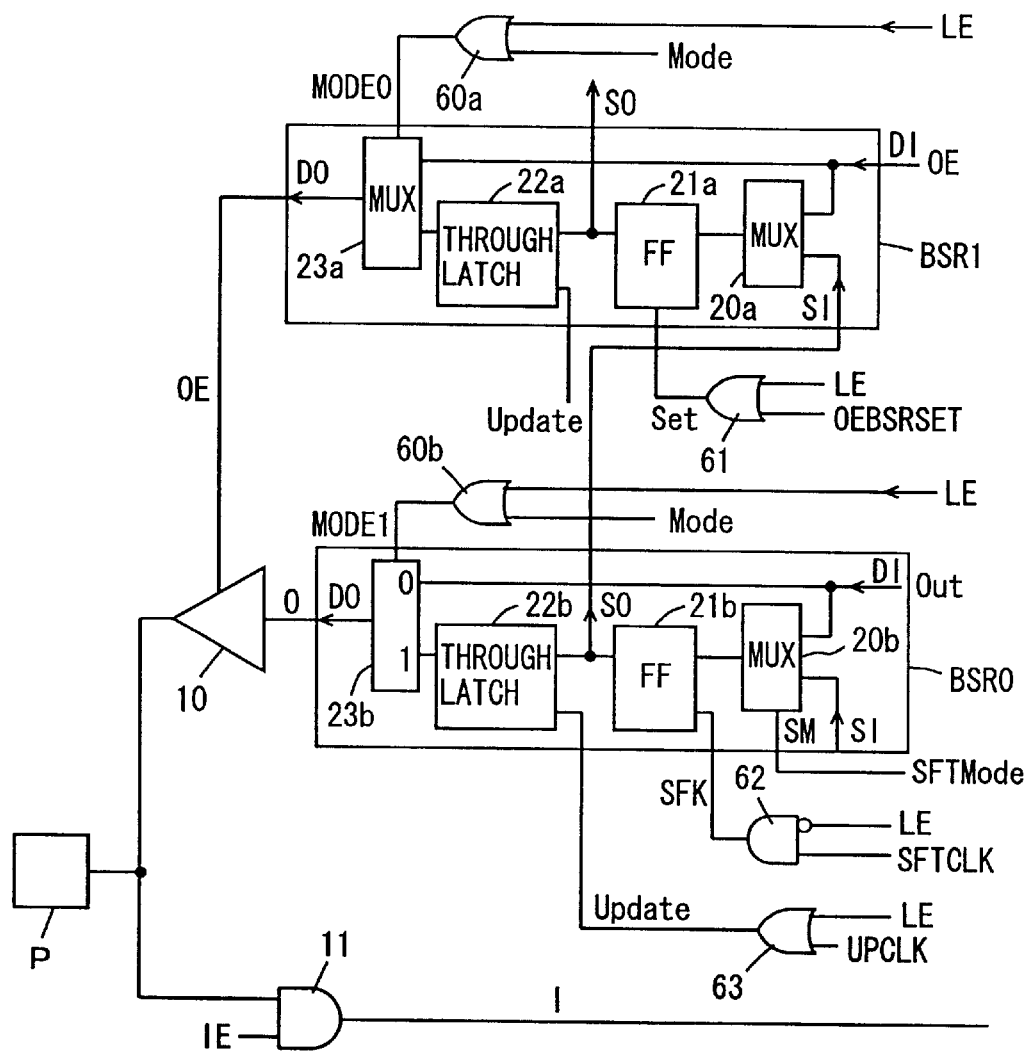
FIG. 27 schematically illustrates the structure of a main part of a semiconductor integrated circuit device according to a thirteenth embodiment of the present invention.

FIG. 27 illustrates the structure of a main part of a semiconductor integrated circuit device according to a thirteenth embodiment of the present invention. An I/O cell shown in FIG. 27 includes at least an output buffer 10 driving a pad P and an input buffer 11 capturing a signal on pad P in accordance with an input enable signal IE.

A boundary scan register BSR1 provided for an output enable signal OE for output buffer 10 and a boundary scan register BSR0 provided for an input signal to output buffer 10 are arranged in a test cell. FIG. 27 omits boundary scan registers similarly provided for input buffer 11, in order to simplify the illustration.

Boundary scan register BSR1 includes a multiplexer 20a selecting one of shift-in data SI and output enable signal OE from an internal logic circuit in accordance with a mode instruction signal (not shown), a flip-flop 21a shifting an output signal of multiplexer 20a in accordance with a shift clock signal (not shown), a through latch 22a transferring the output signal of flip-flop 21a, and a multiplexer 23a selecting one of output enable signal OE supplied to an input terminal DI from the internal logic circuit and the output signal of through latch 22a in accordance with a mode instruction signal MODE0 and supplying the selected signal to an output terminal DO. The output signal of flip-flop 21a is set ("1" is output) in accordance with a set instruction signal Set.

An OR circuit 60a outputting the signal MODE0 setting a connection path of multiplexer 23a in accordance with a level holding signal LE and a mode instruction signal Mode specifying a test mode or a normal mode generated in a boundary scan test and an OR circuit 61 receiving the level holding signal LE and a set instruction signal OEBSRSET and supplying the output signal Set to flip-flop 21a are provided for boundary scan register BSR1. The set instruction signal OEBSRSET may be a signal generated from the aforementioned BSR control circuit or from the boundary scan test circuit. While flip-flop 21a shifts the signal from multiplexer 20a and generates shift-out data SO in accordance with the shift clock signal, FIG. 27 shows no input path of the shift clock signal for flip-flop 21a.

The through latch 22a enters a through state in accordance with an update instruction signal Update and transmits the data signal output from flip-flop 21a to multiplexer 23a.

Boundary scan register BSR0 also includes a multiplexer 20b selecting one of the shift-in data signal SI and an output signal OUT from the internal logic circuit in accordance with a shift mode instruction signal SFTMode, a flip-flop 21b for shifting an output data signal from multiplexer 20b in accordance with a shift clock signal SFK, a through latch 22b transmitting output data from flip-flop 21b in accordance with update instruction signal Update, and a multiplexer 23b selecting one of the signal OUT supplied to input terminal DI and the output signal from through latch 22b and supplying the selected signal to output buffer 10 through output terminal DO. Flip-flop 21b is also set/reset in a boundary scan test mode (FIG. 27 shows no path therefor).

An OR circuit 60b outputting a mode instruction signal MODE 1 to multiplexer 23b in accordance with level holding signal LE and a boundary scan test mode instruction signal Mode is provided also to boundary scan register BSR0. Boundary scan test mode instruction signal Mode supplied to OR circuit 60b may be identical to or different from the mode instruction signal Mode supplied to OR circuit 60a. When boundary scan test mode instruction signal Mode is output to the boundary scan registers for output enable signal OE and output signal O respectively through the same logic, OR circuits 60a and 60b may be combined into a common OR gate.

A gate circuit 62 receiving the level holding signal LE and a shift clock signal SFTCLK, to generate a shift clock signal SFK for supplying to flip-flop 21b and an OR circuit 63 receiving the level holding signal LE and an update clock signal UPCLK to generate the update instruction signal Update for supplying to through latch 22b are further provided for boundary scan register BSR0. When level holding signal LE is high, the gate circuit 62 fixes the shift clock signal SFK supplied to flip-flop 21b to a low level regardless of the state of shift clock signal SFTCLK, for inhibiting a shift operation in flip-flop 21b (setting the flip-flop 21b in a latch state). Shift clock signal SFTCLK is activated in a boundary scan test mode in a shift-DR state. When level holding signal LE is in a high-level active state, OR circuit 63 fixes the update instruction signal Update to a high level, brings the through latch 22b into a through state and persistently supplies the output data of flip-flop 21b to multiplexer 23b. Update clock signal UPCLK is activated when a boundary scan test circuit is set in an Update-DR state. Operations of the structure shown in FIG. 27 will now be described.

When level holding signal LE is low, OR circuits 60a and 60b generate the mode instruction signals MODE0 and MODE1 in accordance with mode instruction signal Mode which is a boundary scan test control signal, and establish connection paths for multiplexers 23a and 23b. Further, OR circuit 61 generates the set signal Set in accordance with set instruction signal OEBSRSET generated from the boundary scan test circuit or the BSR control circuit and supplies the generated set signal to flip-flop 21a since level holding signal LE is low. Gate circuit 62 and OR circuit 63 generate the shift clock signal SFK and update instruction signal Update in accordance with shift clock signal SFTCLK and update clock signal UPCLK generated in the boundary scan test respectively. In this state, therefore, a data transfer path is set under the control of the boundary scan test circuit, for executing a shift operation or an update operation.

When level holding signal LE is set high, the output signals of OR circuits 60a and 60b go low and multiplexers 23a and 23b select the output signals of through latches 22a and 22b regardless of the state of mode instruction signal Mode which is a boundary scan test control signal. In boundary scan register BSR1, the set signal Set output from OR circuit 61 goes high, flip-flop 21$a$ is set to render the output signal thereof high (logic "1"). The update instruction signal Update supplied to through latch 22$a$ in this state is set high for the high-level period of level holding signal LE, so that boundary scan register BSR1 outputs the signal of logic "1" set in flip-flop 21$a$ through the through latch and multiplexer 23$a$, output enable signal OE is activated during the active state of level holding signal LE, and output buffer 10 is set in an output enable state.

In boundary scan register BSR0, the mode instruction signal MODE1 goes high and multiplexer 23$b$ selects the output signal of through latch 22$b$ since level holding signal LE is high. Further, the update instruction signal Update from OR circuit 63 goes high and through latch 22$b$ is set in a through state. In addition, gate circuit 62 fixes the shift clock signal SFK to a low level and inhibits shifting operation of flip-flop 21$b$ due to the high-level active state of level holding signal LE. Therefore, flip-flip 21$b$ persistently holds and outputs data held immediately before activation of level holding signal LE.

While level holding signal LE is high, therefore, output buffer 10 persistently transmits the data held immediately before activation of level holding signal LE to pad P. Thus, also when the shift clock or the update clock is a high-speed clock, pad P can be set to a prescribed voltage level through output buffer 10 with level holding signal LE. Thus, pad P can be externally observed during a desired prescribed period in execution of the DG test, and the DC test can be correctly performed.

The level holding signal LE may be made active by decoding an instruction for the boundary scan test, or may be externally supplied. The state of level holding signal LE may be set in accordance with a DC test mode control signal DCTM.

In the structure shown in FIG. 27, through latches 22$a$ and 22$b$ may not be provided. Further, a structure similar to that of OR circuit 63 may also be provided for through latch 22$a$ of boundary scan register BSR1.

When all control signals in the boundary scan test, i.e., the update instruction signal Update, the shift clock signal SFTCLK and the set signal are generated in common for boundary scan registers BSR0 and BSR1, logic circuits for these signals can be arranged commonizedly and the circuit scale is reduced.

[Modification]

Figure 28:
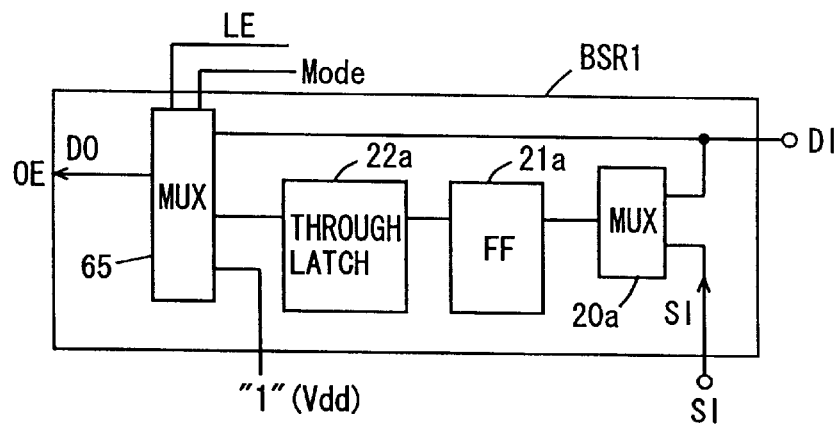
FIG. 28 illustrates a modification of the thirteenth embodiment of the present invention.

FIG. 28 illustrates the structure of a modification of the thirteenth embodiment of the present invention. In a boundary scan register BSR1 provided for an output enable signal OE in the structure shown in FIG. 28, a multiplexer 65 on an output stage selects one of a signal supplied to an input terminal DI, an output signal from a through latch 22$a$ and a fixed value "1" (Vdd: power supply potential) in accordance with a level holding signal LE and a mode instruction signal Mode which is a boundary scan test control signal. When level holding signal LE is in a high-level active state, the multiplexer 65 selects the fixed value "1" and holds the output enable signal OE at a high level of an active state. When level holding signal LE is in a low-level inactive state, multiplexer 65 selects one of the signal supplied to input terminal DI and the output signal from through latch 22$a$ in accordance with the mode instruction signal Mode which is the boundary scan test control signal.

In the structure shown in FIG. 28, only the structure of multiplexer (MUX) 65 at the output stage is changed while a multiplexer 65$a$ at an input stage, a flip-flop 21$a$ and through latch 22$a$ are simply structured to operate in accordance with the boundary scan test control signal, and the number of additional circuits is reduced.

According to the thirteenth embodiment of the present invention, as hereinabove described, the signal of the same logic is persistently output to the pad in accordance with the level holding signal and this state is set through the boundary scan register BSR, whereby no new latch for holding the output need be provided and increase of the circuit scale can be suppressed for implementing a desired function such as a correct DC test.

Fourteenth Embodiment

Figure 29:
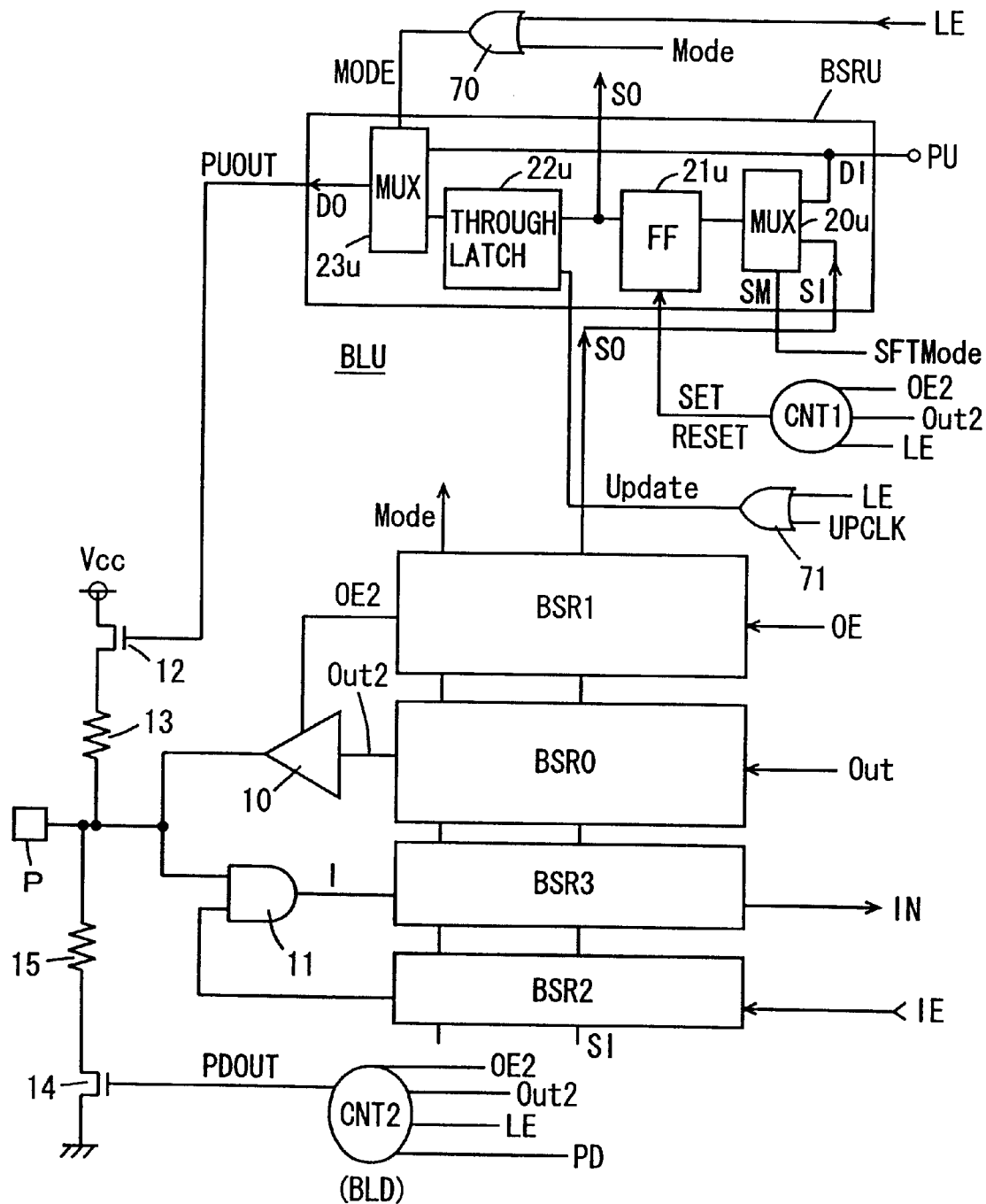
FIG. 29 schematically illustrates the structure of a main part of a semiconductor integrated circuit device according to a fourteenth embodiment of the present invention.

FIG. 29 illustrates the structure of a main part of a semiconductor integrated circuit device according to a fourteenth embodiment of the present invention. The structure shown in FIG. 29 controls a pull-up instruction signal PUOUT and a pull-down instruction signal PDOUT in accordance with a level holding signal LE. A boundary scan register BSR0 provided for an output buffer 10, a boundary scan register BSR1 provided for an output enable signal OE, a boundary scan register BSR2 provided for an input enable signal IE and a boundary scan register BSR3 provided for an input buffer 11 can shift in (SI) and shift out (SO) data through a scan path. A mode instruction signal Mode which is a boundary scan test control signal is supplied to boundary scan registers BSR0 to BSR3.

A boundary scan register BSRU and a control circuit CNT1 are provided for pull-up instruction signal PUOUT controlling conduction/non-conduction of a MOS transistor 12 connecting a pull-up resistive element 13 to a power supply node. A control circuit CNT2 is provided for pull-down instruction signal PDOUT controlling conduction/non-conduction of a MOS transistor connecting a pull-down resistive element 15 to a ground node. Boundary scan register BSRU and control circuit CNT1 correspond to the boundary scan register/logic circuit BLU in the first embodiment etc., and control circuit CNT2 corresponds to the boundary scan register/logic circuit BLD.

Boundary scan register BSRU includes a multiplexer 20$u$ selecting one of an internal signal PU supplied to an input terminal DI and data SO shifted out from boundary scan register BSR1 in accordance with a shift mode instruction signal SFTMode which is a boundary scan test control signal, a flip-flop 21$u$ set/reset in accordance with an output signal from control circuit CNT1 and performing a shift operation in accordance with a shift clock signal supplied through a path (not shown), a through latch 22$u$ entering a through state in accordance with an update instruction signal Update output from an OR circuit 71 for passing an output signal of flip-flop 21$u$, and a multiplexer (MUX) 23$u$ selecting one of the output signal from through latch 22$u$ and the signal PU supplied to input terminal DI in accordance with a mode instruction signal MODE and outputting the selected signal as a pull-up instruction signal PUOUT.

The mode instruction signal MODE supplied to multiplexer 23$u$ is output from an OR circuit 70 receiving a level holding signal LE and the mode instruction signal Mode which is a boundary scan test control signal. OR circuit 71 receiving the level holding signal LE and an update clock signal UPCLK outputs the update instruction signal Update to through latch 22$u$.

Control circuit CNT1 outputs a set signal SET and a reset signal RESET in accordance with an internal output enable signal OE2 output from boundary scan register BSR1, an internal output signal Out2 output from boundary scan register BSR0 and level holding signal LE.

Control circuit CNT2 generates the instruction signal PDOUT in accordance with an internal power-down instruction signal PD, level holding signal LE, internal output enable signal OE2 and internal output signal Out2.

In the structure shown in FIG. 29, multiplexer 23u of boundary scan register BSRU selects the output signal of through latch 22u when level holding signal LE goes high. When level holding signal LE is high, update instruction signal Update output from the OR circuit 71 goes high and through latch 22u enters a through state for passing data held in flip-flop 21u. Therefore, the data signal set in flip-flop 21u is persistently output as pull-up instruction signal PUOUT. Control circuit CNT1 generates the set signal SET and the reset signal RESET in accordance with the logic of internal output enable signal OE2 and internal output signal Out2. While the logic implemented by control circuit CNT1 will be described later, the set signal SET is activated when output buffer 10 outputs a high-level signal (when internal output signal Out2 is "1"), and the reset signal RESET is activated when internal output signal Out2 is low (logic "0") (when the internal output enable signal OE2 is inactive).

Control circuit CNT2 activates the pull-down instruction signal PDOUT when output buffer 10 is in an output high impedance state and the internal output signal Out2 is at logic "0". Thus, high- and low-level signals can be persistently output to pad P when output buffer 10 enters an output high impedance state. Thus, a test (measurement of the resistance values of the resistive elements 13 and 15, for example) can be performed in a pull-up/pull-down state not defined in the boundary scan test.

Figures 30A, 30B, 31:
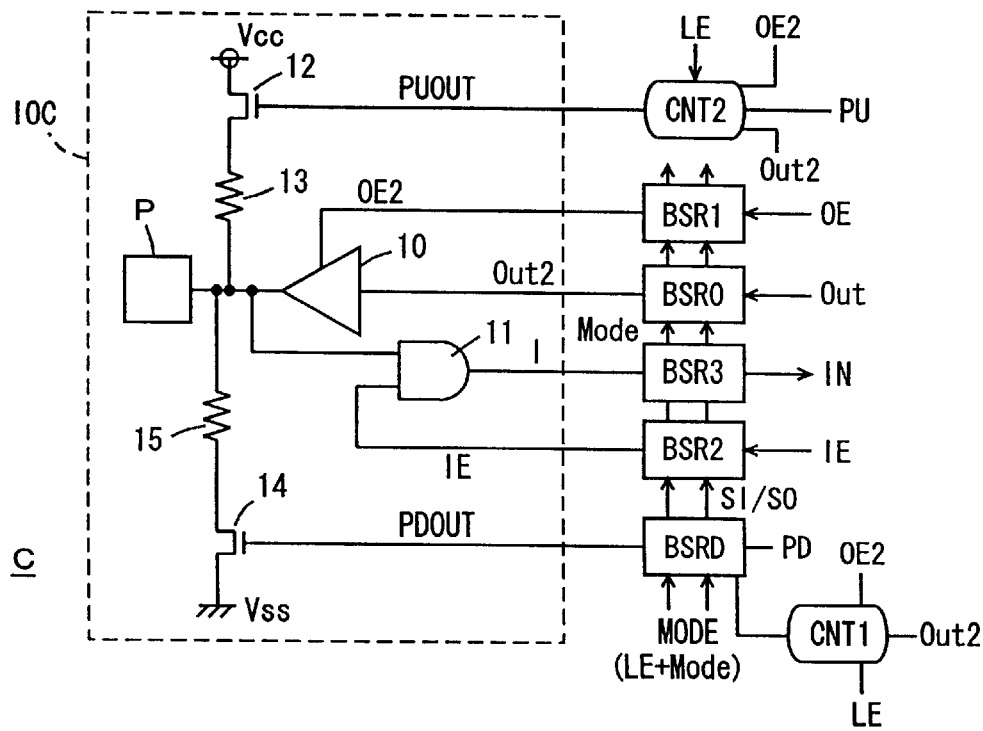
FIGS. 30A and 30B are lists of logics implemented by control circuits shown in FIG. 29 respectively.
FIG. 31 illustrates a modification of the fourteenth embodiment of the present invention.

FIG. 30A illustrates exemplary logic implemented by control circuit CNT1 shown in FIG. 29. Referring to FIG. 30A, control circuit CNT1 sets the set signal SET and the reset signal RESET at low levels of inactive states (logic "0") when level holding signal LE is low (logic "0"), regardless of the states of internal output enable signal OE2 and internal output signal Out2. In this state, data held in flip-flop 21u shown in FIG. 29 is determined in response to shifted data.

When level holding signal LE goes high (logic "1") and internal output enable signal OE2 is set high, output buffer 10 drives the pad P in accordance with internal output signal Out2, and hence pull-up MOS transistor 12 must be held in a non-conductive state. In this state, therefore, both set signal SET and reset signal RESET are held low.

When level holding signal LE is in a high-level active state and internal output signal OE enters a low-level inactive state, output buffer 10 enters an output high impedance state. In this state, control circuit CNT1 activates the set signal SET if internal output signal Out2 is high, while it drives the reset signal RESET to a high level of an active state if internal output signal Out2 is low. When internal output signal Out2 is high, therefore, pull-up instruction signal PUOUT goes high, MOS transistor 12 is rendered conductive, and pad P is pulled up to a power supply voltage Vcc level through pull-up resistive element 13.

FIG. 30B illustrates exemplary logic implemented by control circuit CNT2. When level holding signal LE is in a low-level inactive state, power-down instruction signal PDOUT is driven in accordance with internal power-down instruction signal PD.

When level holding signal LE enters a high-level active state and internal output enable signal OE2 is in a high-level active state, power-down instruction signal PDOUT is driven in accordance with internal power-down instruction signal PD. Even if the pad P is connected to the ground node through pull-down resistive element 15 in accordance with the power-down instruction signal PDOUT in activation of internal output enable signal OE2, no bad influence is exerted on output data from output buffer 10 because of the following reason. Pull-down resistive element 15 generally has a high resistance value and is provided simply for preventing the pad P from entering a high impedance state, to exert no bad influence on the logical value of the signal input/output through pad P.

When level holding signal LE is in an high-level active state and output enable signal OE2 is in a low-level inactive state, power-down instruction signal PDOUT is driven in accordance with internal output signal Out2. Power-down instruction signal PDOUT is set low when internal output signal Out2 is high, while power-down instruction signal PDOUT is driven to a high level when internal output signal Out2 is low. In other words, one of pull-up resistive element 13 and pull-down resistive element 15 pulls up or down the pad P when level holding signal LE is in a high-level active state and internal output enable signal OE2 is in a low-level inactive state.

The internal output signal Out2 and the output enable signal OE2 may be set to the boundary scan registers BSR0 and BSR1 through any of the methods of setting the test patterns in the boundary scan registers described with reference to the above embodiments. Referring to FIGS. 30A and 30B, the control logic may be implemented by negative logic.

[Modification]

FIG. 31 illustrates the structure of a modification of the fourteenth embodiment of the present invention. In the structure shown in FIG. 31, a control circuit CNT2 is provided for a pull-up instruction signal PUOUT while a boundary scan register BSRD and a control circuit CNT1 are provided for a pull-down instruction signal PDOUT. Boundary scan register BSRD is identical in structure to boundary scan register BSRU shown in FIG. 29. The remaining structure of this modification is identical to that shown in FIG. 29, and corresponding parts are denoted by the same reference numerals.

Also in the structure shown in FIG. 31, control circuits CNT1 and CNT2 selectively drive the pull-up instruction signal PUOUT and pull-down instruction signal PDOUT to active states in accordance with a level holding signal LE. Thus, the voltage of a pad P is persistently kept at a constant level and a desired DC test can be executed with a sufficient time margin.

FIG. 32A illustrates the logic implemented by control circuit CNT1 shown in FIG. 31. In the logic implemented by control circuit CNT1 shown in FIG. 32A, a reset signal RESET is activated and power-down instruction signal PDOUT output from boundary scan register BSRD is held in a low-level inactive state when level holding signal LE and an internal output signal Out2 are high and an internal output enable signal OE2 is in a low-level inactive state. When level holding signal LE is active and internal output enable signal OE2 and internal output signal Out2 are low, the set signal SET and the pull-down instruction signal PDOUT are activated and pad P is coupled to a ground node through a resistive element 15. In other words, the logic implemented by control circuit CNT1 shown in FIG. 32A is identical to that obtained by exchanging the set signal SET and the reset signal RESET in the logic implemented by control circuit CNT1 shown in FIG. 30A.

FIG. 32B illustrates the logic implemented by control circuit CNT2 shown in FIG. 31. Control circuit CNT2 shown in FIG. 31 is supplied with an internal pull-up instruction signal PU in place of the internal pull-down instruction signal. Therefore, control circuit CNT2 shown in FIG. 31 sets the pull-up instruction signal PUOUT to 1 and pulls up the pad P to power supply voltage Vcc level when level holding signal LE and internal output signal Out2 are high and internal output enable signal OE2 is low. When level holding signal LE is at a high level of an active state and internal output enable signal OE2 and internal output signal Out2 are low, pull-up instruction signal PUOUT is held low and the MOS transistor 12 maintains an OFF state.

When level holding signal LE is active and internal output enable signal OE2 is high, pull-up instruction signal PUOUT is generated in accordance with internal pull-up instruction signal PU. When level holding signal LE is low, pull-up instruction signal PUOUT is generated in accordance with internal pull-up instruction signal PU.

With the boundary scan register BSRD and control circuit CNT1 for pull-down instruction signal PDOUT and with the control circuit CNT2 for pull-up instruction signal PUOUT as shown in FIG. 31, pad P can be readily set in a pull-up state or a pull-down state by.simply changing the logic implemented by control circuits CNT1 and CNT2.

Boundary scan register BSRU shown in FIG. 29 is provided with through latch 22u. This through latch 22u may be omitted.

According to the fourteenth embodiment of the present invention, as hereinabove described, the pad can be persistently set in a pull-up/pull-down state through the boundary scan register and a desired DC test can be performed with a sufficient time margin without providing an additional circuit such as an output latch circuit for the DC test.

Fifteenth Embodiment

Figure 33:
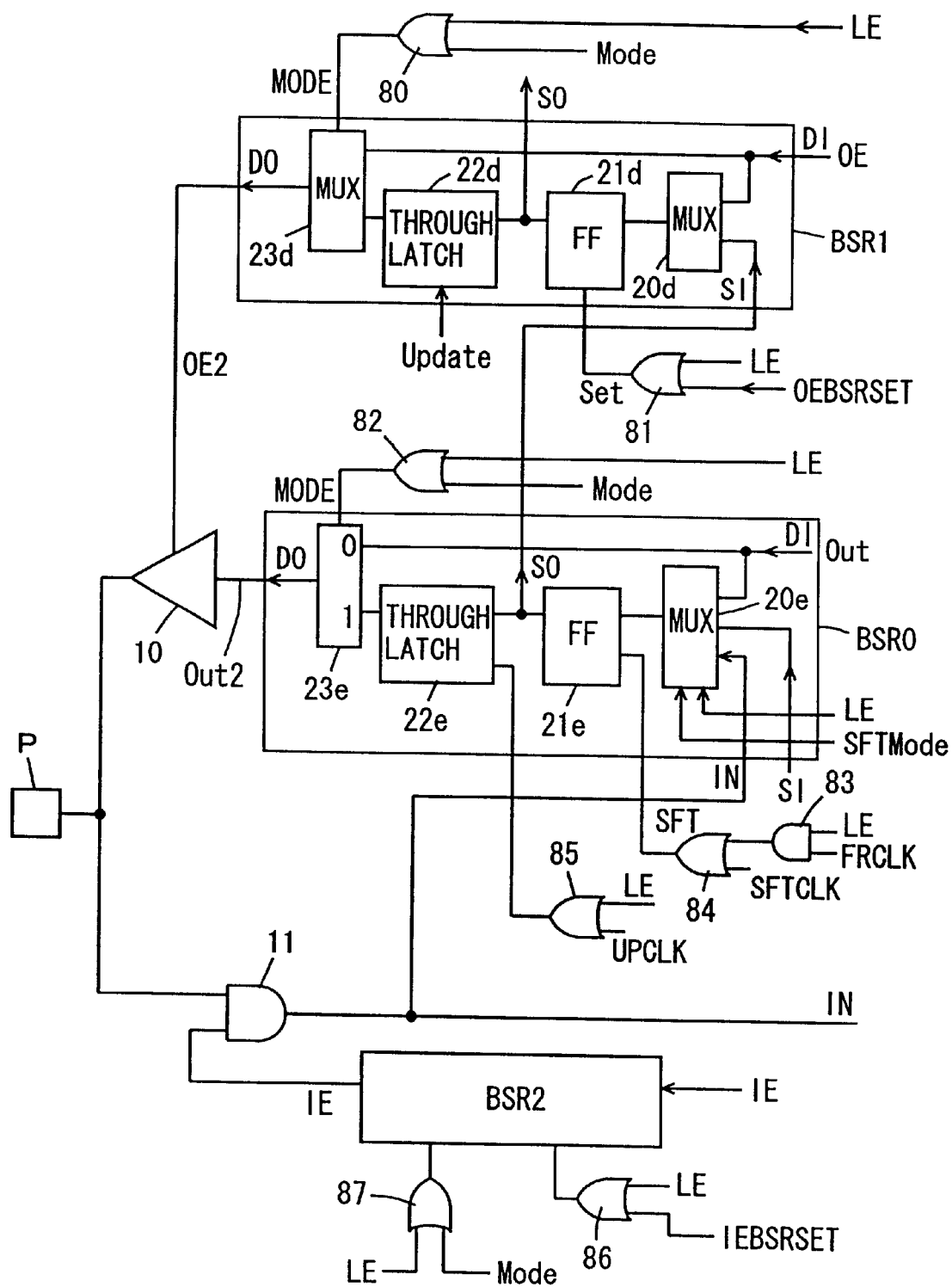
FIG. 33 schematically illustrates the structure of a main part of a semiconductor integrated circuit device according to a fifteenth embodiment of the present invention.

FIG. 33 illustrates the structure of a main part of a semiconductor integrated circuit device according to a fifteenth embodiment of the present invention. In the structure shown in FIG. 33, a boundary scan register BSR1 provided for an output enable signal OE, a boundary scan register BSR0 provided for an output buffer 10 and a boundary scan register BSR2 provided for an input enable signal IE are controlled in accordance with a level holding signal LE.

Boundary scan register BSR1 includes a multiplexer (MUX) 20d selecting one of shift-in data (SI) and an internal output enable signal OE supplied to a data input terminal DI in accordance with a shift mode instruction signal (not shown), a flip-flop 2 1d set in accordance with a set signal Set from an OR circuit 81 and shifting an output signal of the multiplexer 20d in accordance with a shift clock signal (not shown), a through latch 22d transmitting an output signal of flip-flop 21d in accordance with an update instruction signal Update, and a multiplexer (MUX) 23d selecting one of the output signal from through latch 22d and internal output enable signal OE supplied to data input terminal DI in accordance with a mode instruction signal MODE from an OR circuit 80 and transmitting the selected signal to an output terminal DO. OR circuit 81 receives the level holding signal LE and a boundary scan register set instruction signal OEBSRSET. OR circuit 80 receives the level holding signal LE and a mode instruction signal Mode which is a boundary scan test control signal. The update instruction signal Update supplied to through latch 22d is set in a high-level active state in an Update state or while level holding signal LE is high, for setting the through latch 22d in a through state.

Boundary scan register BSR0 includes a multiplexer (MUX) 20e selecting one of an internal input signal IN from an input buffer 11, a shift-in signal SI from a boundary scan register (not shown) and an internal output signal Out supplied to data input terminal DI in accordance with level holding signal LE and a shift mode instruction signal SFTMode, a flip-flop 21e transmitting an output signal of multiplexer 20e in accordance with a shift clock signal SFT, a through latch 22e transmitting the output signal from flip-flop 21e in accordance with an output signal from an OR circuit 85, and a multiplexer 23e selecting one of the output signal from through latch 22e and internal output signal Out supplied to data input terminal DI and transmitting the selected signal to data output terminal DO.

An OR circuit 82 receiving the level holding signal LE and the mode instruction signal Mode which is a boundary scan test control signal generates the mode instruction signal MODE. An AND circuit 83 receiving the level holding signal LE and a free-running clock signal FRCLK and an OR circuit 84 receiving an output signal of the AND circuit 83 and a shift clock signal SFTCLK activated in a shift-DR state generate the shift clock signal SFT. OR circuit 84 outputs the shift clock signal SFT. Free-running dock signal FRCLK is a normally generated clock signal. Shift clock signal SFTCLK is a dock signal generated in accordance with a test clock signal TCK in a shift operation.

Through latch 22e is supplied with the output signal of OR circuit 85 receiving the level holding signal LE and an update clock signal UPCLK. Update clock signal UPCLK is activated in an Update-DR state. Through latch 22e enters a through state when the output signal from OR circuit 85 is high.

Boundary scan register BSR2 has a structure similar to that of boundary scan register BSR1 provided for output enable signal OE, and the internal state thereof is set in accordance with the output signal from OR circuit 86 receiving the level holding signal LE and a set signal IEBSRSET and an output signal from an OR circuit 87 receiving the level holding signal LE and the mode signal Mode.

If the mode signal Mode which is a boundary scan test control signal is generated in common to the boundary scan registers BSR1, BSR0 and BSR2, OR circuits 80, 82 and 87 may be combined into a common OR circuit. Operations of the cell shown in FIG. 33 will now be described.

When the level holding signal LE is low, all of boundary scan test control signal Mode and the signals OEBSRSET, IEBSRSET, UPCLK and SFTCLK are valid so that the internal states of boundary scan registers BSR0 to BSR2 are set in accordance with a specified mode.

The set signals OEBSRSET and IEBSRSET may be set signals generated in a boundary scan test or individually generated in a DC test mode as in the first embodiment or the like.

When level holding signal LE enters a high-level active state, the output signals of OR circuits 80, 82 and 87 go high for setting the multiplexers 23d and 23e at output stages in states of selecting the output signals from through latches 22d and 22e. Further, through latches 22d and 22e are set in through states in accordance with activation (high level) of level holding signal LE. In the boundary scan register BSR1, flip-flop 21d is set and the output signal thereof is set high. In boundary scan register BSR0, AND circuit 83 transmits the free-running clock signal FRCLK, and the shift clock signal SFT is generated in accordance with free-running clock signal FRCLK. Multiplexer 20e selects the internal input signal IN output from input buffer 11 and supplies the selected signal to flip-flop 21e in accordance with the activation of level holding signal LE.

Boundary scan register BSR2 is set in a state similar to that of boundary scan register BSR1, and hence the input enable signal IE maintains a high-level active state. When level holding signal LE is high, therefore, the signal supplied to pad P is transmitted through input buffer 11 and boundary scan register BSR0, and supplied to output buffer 10. Output buffer 10 drives the pad P in accordance with the data supplied from boundary scan register BSR0 since output enable signal OE2 is active.

In the structure shown in FIG. 33, therefore, the signal voltage of pad P immediately before activation of level holding signal LE is sequentially transmitted by input buffer 11, boundary scan register BSR0 and output buffer 10 and held. In this case, flip-flop 21e of boundary scan register BSR0 performs a shift operation in accordance with free-running clock signal FRCLK, which determines the operating frequency of a data output signal. In other words, the relationship VIH/VIL between the input signal voltage and a high/low level can be measured by changing the signal voltage supplied to pad P immediately before rise of the level holding signal LE. Further, another DC test for leakage current, VOH or the like can be performed. Each desired DC test function can be tested in the activation period of level holding signal LE with a sufficient time margin.

Boundary scan register BSR1 provided for output enable signal OE may have the structure shown in FIG. 27. Trough latch 22d of boundary scan register BSR1 may be supplied with the output signal of the OR circuit receiving the level holding signal LE and update clock signal UPCLK.

[Modification]

Figure 34:
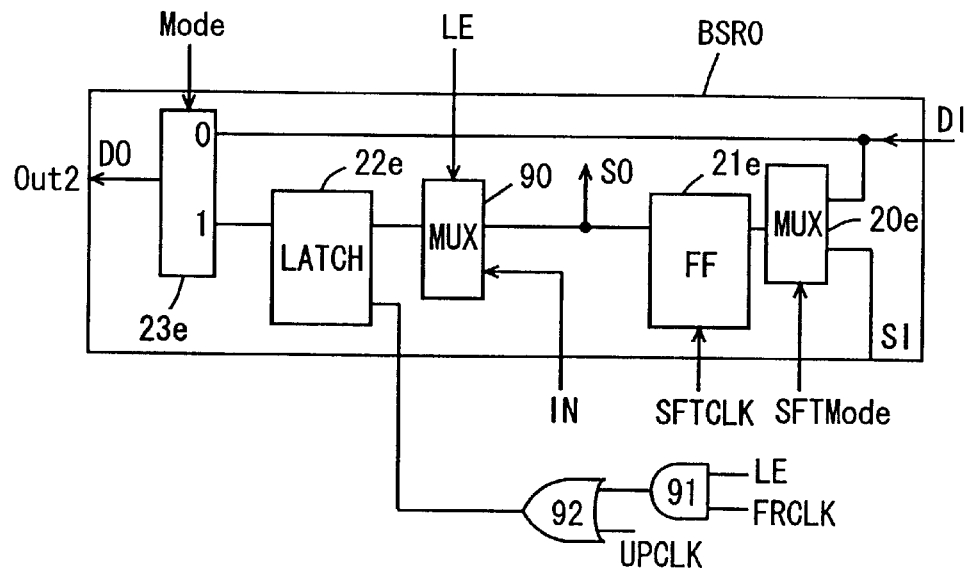
FIG. 34 illustrates a modification of the fifteenth embodiment of the present invention.

FIG. 34 illustrates the structure of a modification of the fifteenth embodiment of the present invention. Referring to FIG. 34, in a boundary scan register BSR0 generating an internal output signal Out2, a multiplexer (MUX) 90 is provided between a latch 22e and a flip-flop 21e, for selecting one of an output signal from flip-flop 21e and an internal input signal IN in accordance with a level holding signal LE. Flip-flop 21e is supplied with a shift clock signal SFTCLK. A multiplexer 20e at an input initial stage selects one of a signal supplied to an input terminal DI and a signal shifted in accordance with a shift mode signal SFTMode which is a boundary scan test control signal and supplies the selected signal to flip-flop 21e. Flip-flop 21e performs a shift operation in accordance with shift clock signal SFTCLK.

When level holding signal LE is in a high-level active state, multiplexer 90 selects the internal input signal IN in place of the output signal from flip-flop 21e. An AND circuit 91 and an OR circuit 92 control the transfer operation of latch 22e. AND circuit 91 receives the level holding signal LE and a free-running clock signal FRCLK. OR circuit 92 receives an output signal of AND circuit 91 and an update clock signal UPCLK and controls the transfer operation of latch 22e.

In the structure shown in FIG. 34, OR circuit 92 supplies a clock signal to latch 22e in accordance with free-running clock signal FRCLK when the level holding signal LE is high. Multiplexer 90 selects the internal input signal IN when the level holding signal LE is in a high-level active state. Multiplexer 23e at an output stage selects the output signal of latch 22e in accordance with a mode signal Mode which is a boundary scan test control signal. Therefore, the internal input signal IN is output in accordance with free-running clock signal FRCLK as an internal output signal Out2 for an output buffer. Also in this case, a pad P can be held at the same voltage level as the voltage of the input signal applied immediately before activation of level holding signal LE while latch 22e latches the signal and level holding signal LE is in a high-level active state.

In the structure shown in FIG. 33, through latches 22d and 22e may be omitted. In boundary scan register BSR0 shown in FIG. 34, latch 22e may be configured to enter a through state when the output signal of OR circuit 92 is high and to enter a latch state when the output signal of OR circuit 92 is low.

According to the fifteenth embodiment of the present invention, as hereinabove described, the signal supplied to the pad is captured in accordance with the level holding signal and persistently output to the pad, whereby the pad can be held at a voltage level responsive to the input signal voltage for a prescribed period, and a DC test such as measurement of the voltage level of the input signal or an output signal can be correctly performed. An internal structure employed for a boundary scan test is utilized in this case and hence the circuit scale is not increased.

Sixteenth Embodiment

Figure 35:
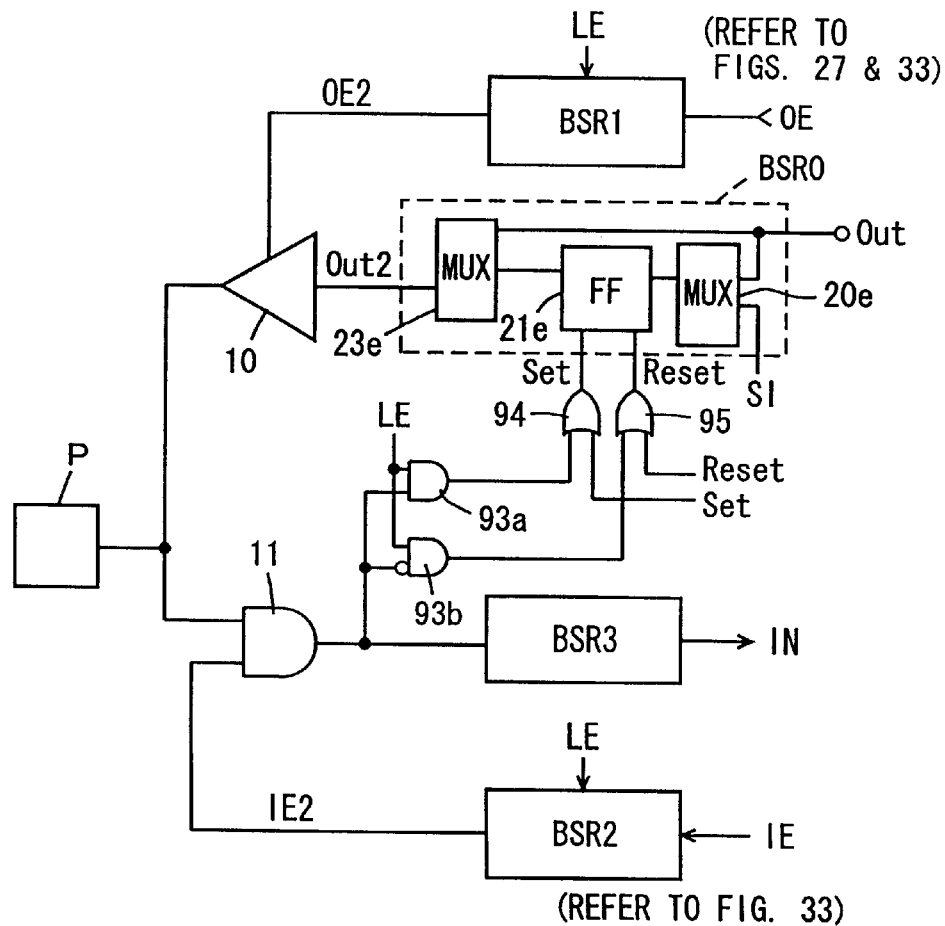
FIG. 35 schematically illustrates the structure of a main part of a semiconductor integrated circuit device according to a sixteenth embodiment of the present invention.

FIG. 35 illustrates the structure of a main part of a semiconductor integrated circuit device according to a sixteenth embodiment of the present invention. The structure shown in FIG. 35 includes gate circuits 93a and 93b receiving an output signal of an input buffer 11 and a level holding signal LE, an OR circuit 94 receiving an output signal of gate circuit 93a and a set signal Set which is a boundary scan test control signal and an OR circuit 95 receiving an output signal of gate circuit 93b and a reset signal Reset which is a boundary scan test control signal. Gate circuit 93a outputs a high-level signal when both of level holding signal LE and the output signal of input buffer 11 are high, and gate circuit 93b outputs a high-level signal when level holding signal LE is high and the output signal of input buffer 11 is low.

A boundary scan register BSR0 provided for an output buffer 10 includes a multiplexer (MUX) 20e selecting one of an internal output signal Out and a shift-in data signal SI, a flip-flop (shift register) 21e transferring an output signal of multiplexer 20e in accordance with a shift clock signal (not shown), and a multiplexer 23e selecting one of the output signal of flip-flop 21e and the internal output signal Out in accordance with a mode signal Mode (not shown) which is a boundary scan test control signal and generating an internal output signal Out2. Flip-flop 21e is set into a set/reset state in accordance with output signals of OR circuits 94 and 95.

A boundary scan register BSR1 provided for an output enable signal OE has the structure shown in FIG. 27 or 33, and holds an internal output enable signal OE2 at a high level of an active state when level holding signal LE is in a high-level active state. A boundary scan register BSR2 provided for an internal input enable signal IE has a structure similar to that shown in FIG. 33, and holds an internal input enable signal IE2 in a high-level active state in activation of level holding signal LE. Operations will now be briefly described.

When level holding signal LE is low, both of the output signals from gate circuits 93a and 93b are low. Therefore, OR circuits 94 and 95 generate a set signal and a reset signal to flip-flop 21e in accordance with a set signal Set and a reset signal Reset, respectively. Boundary scan registers BSR1 and BSR2 are set into specified states under the control of a boundary scan test circuit since the level holding signal LE is low. Also in boundary scan register BSR0, a set signal and a reset signal are generated under the control of the boundary scan test circuit, for controlling the set/reset state of flip-flop 21e. Boundary scan register BSR0 is also set into a prescribed state under the control of the boundary scan test circuit in accordance with a boundary scan test control signal (not shown).

When level holding signal LE enters a high-level active state, gate circuits 93a and 93b are enabled. Boundary scan registers BSR1 and BSR2 set output signals OE2 and IE2 thereof to high levels of active states, for enabling the output buffer 10 and input buffer 11. With a signal of a prescribed voltage level applied to pad P, the output signals of gate circuits 93a and 93b change in response to the voltage level of the signal supplied to pad P. When the signal supplied to pad P is high, the output signal of gate circuit 93a goes high, the set signal Set is activated through OR circuit 94, and flip-flop 21e is set. When the signal supplied to pad P is low, the output signal of gate circuit 93b goes high, the reset signal Reset is activated through OR circuit 95, and flip-flop 21e is reset. Flip-flop 21e outputs a high-level signal in the set state and outputs a low-level signal in the reset state. Therefore, output buffer 10 outputs a signal of the same logic as the signal supplied to the input pad P (in the case of positive logic) and holds the voltage level of pad P while level holding signal LE is high.

Also in the structure shown in FIG. 35, a signal of the same logical level as the signal supplied to pad P can be persistently output after external signal application to pad P is stopped, by controlling the voltage level of the signal externally applied to pad P and setting boundary scan register BSR0 provided for output buffer 10 in a set or reset state. Therefore, a desired DC test can be executed also in this state. The latch is provided between flip-flop 21e and multiplexer 23e so that an output signal corresponding to the input signal can be transmitted to pad P through output buffer 10 after stopping application of the input signal when an operation of setting the latch in an update-DR state is performed for measuring the voltage level of the input signal.

The signals Set and Reset supplied to the OR circuits 94 and 95 may be generated in the DC test as in the first embodiment.

According to the sixteenth embodiment of the present invention, a signal of the same logical level as the input signal can be persistently output by externally applying a signal to the input pad, controlling the set/reset state of the boundary scan register provided in correspondence to the output buffer and activating the level holding signal. A desired DC test can be executed with a margin in this state. A structure for a boundary scan test is simply utilized, and increase of the circuit scale can be suppressed.

Seventeenth Embodiment

Figure 36:
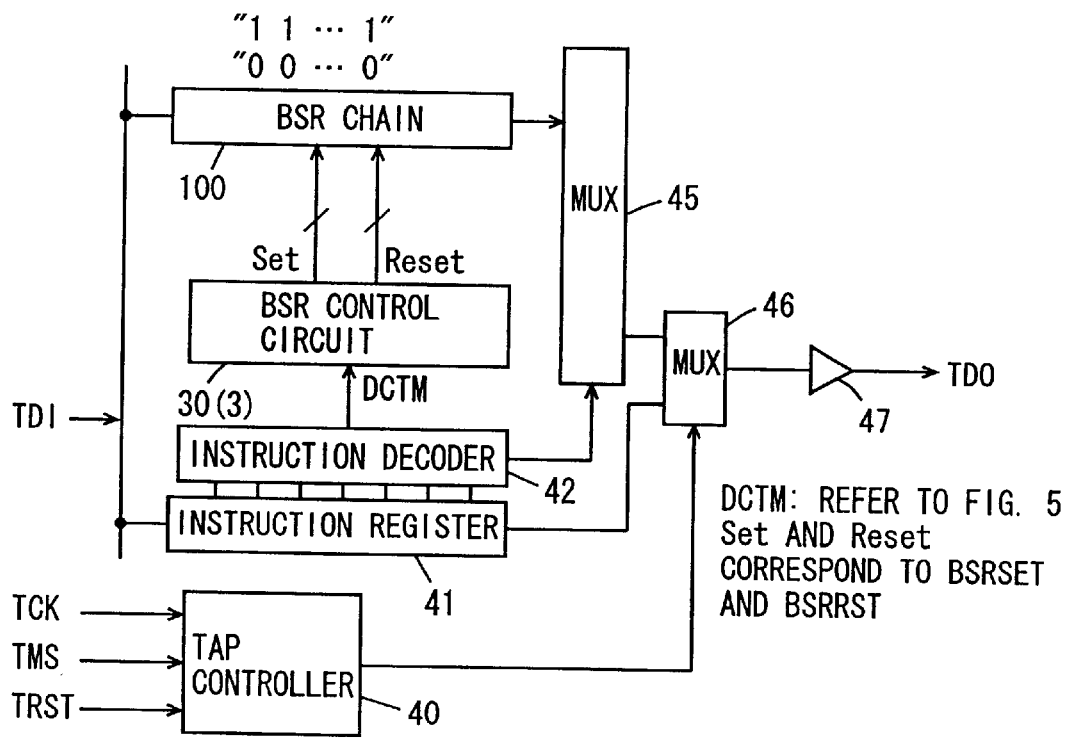
FIG. 36 schematically illustrates the structure of a main part of a semiconductor integrated circuit device according to a seventeenth embodiment of the present invention.

FIG. 36 illustrates the structure of a main part of a semiconductor integrated circuit device according to a seventeenth embodiment of the present invention. In the structure shown in FIG. 36, two test modes EXTEST1 and EXTEST2 are prepared for a boundary scan test circuit. When an external test instruction EXTEST1 or EXTEST2 is set in an instruction register 41, an instruction decoder 42 supplies a DC test mode control signal DCTM setting all boundary scan registers provided in correspondence to output cells included in a boundary scan register chain (BSR chain) 100 to set or reset states to a BSR control circuit 30 (or 3). BSR control circuit 30 (or 3) drives a set signal Set or a reset signal Reset to an active state in accordance with DC test mode control signal DCTM supplied from instruction decoder 42 and sets the boundary scan registers corresponding to the output cells included in BSR chain 100 to set or reset states.

An external instruction EXTEST, which is generally utilized in a boundary scan test, is an instruction for performing data input/output between the boundary scan registers and a device external to the device (integrated circuit device). The external test instruction EXTEST is employed in verifying connection between the integrated circuit device (device) and an external logic circuit or testing the external logic circuit. When the external test instruction EXTEST is supplied, a cell connected to an output pin terminal of boundary scan register chain (BSR chain) 100 outputs data. External test instruction EXTEST is generally supplied in testing (performing an interconnection test) on faultiness/non-faultiness of connection in the integrated circuit device assembled on a board. Disconnection (open-circuit) or shorting of a print pattern, disconnection of a bonding wire in the integrated circuit device or a contact failure between the pin terminal and the circuit board can be detected by executing the external instruction EXTEST.

When external test instruction EXTEST is supplied, whether or not propagation of data of all "0" or all "1" is normally performed is verified. When the external test instruction EXTEST is executed in a boundary scan test mode, test data is generally supplied to an input pin and captured in the boundary scan registers in a capture-DR state, and thereafter transition to a shift-DR state is made for propagating the captured test data in BSR chain 100 through a scan path. Then, transition to an update-DR state is made for outputting the data from an output cell connected to the output pin. The two external test instructions EXTEST1 and EXTEST2 dedicated to the DC test are further prepared as the external test instruction EXTEST, and operations of setting all output terminals to "1" or "0" are assigned to these external test instructions.

When the external test instruction EXTEST1 or EXTEST2 is supplied, instruction decoder 42 supplies a DC test mode control signal DCTM to BSR control circuit 30 (or 3) for setting the boundary scan registers included in BSR chain 100 in set or reset states. Therefore, no time is required for preloading and a shift operation dissimilarly to an ordinary boundary scan test, and the output cell (including an I/O cell) is simply set in a set or reset state, and signals of "1" or "0" can be output from all output terminals by setting the boundary scan registers connected to the output terminals and an output control signal to set/reset states. Thus, the voltage levels of the output signals can be readily measured.

While the standard IEEE 1149.1 recommends a code for all "0" bits for the external instruction EXTEST in general, addition of a designer-defined code is accepted in this standard and an instruction for a DC test or the like can be added without suffering the function of the boundary scan test.

BSR control circuit 30 (or 3) may be singly provided in the integrated circuit device, may be provided for each I/O cell, or may be provided in correspondence to each boundary scan register BSR (see the aforementioned embodiments).

According to the seventeenth embodiment of the present invention, as hereinabove described, an external test is expanded in the boundary scan test circuit, the boundary scan registers are set to set/reset states in common and "1" or "0" is set in all terminals, whereby pattern data need not be transferred through the scan path, and the DC test can be executed at a high speed.

The logic shown in FIG. 5 can be utilized for the logic of the direct current test mode control signal DCTM, and the output terminals can be set to either "1" or "0" by utilizing the items 2) and 3) shown in FIG. 5.

Eighteenth Embodiment

Figure 37:
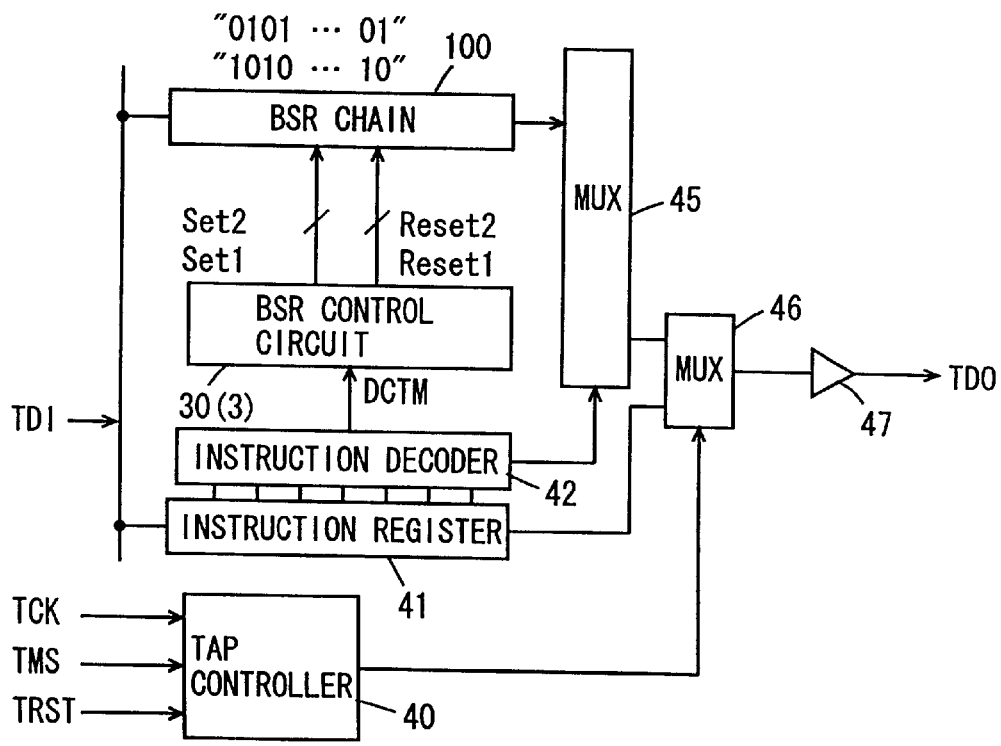
FIG. 37 schematically illustrates the structure of a main part of a semiconductor integrated circuit device according to an eighteenth embodiment of the present invention.

FIG. 37 schematically illustrates the structure of a main part of a semiconductor integrated circuit device according to an eighteenth embodiment of the present invention. In the structure shown in FIG. 37, two types of external test instructions EXTEST1 and EXTEST2 are prepared as an external test instruction EXTEST. The external test instruction EXTEST1 is a test instruction for setting "10" in a pair of adjacent terminals, and the external instruction EXTEST2 is a test instruction for setting "01" in a pair of adjacent terminals. When one of the external test instructions EXTEST1 and EXTEST2 is set in an instruction register 41, an instruction decoder 42 supplies a direct current test mode control signal DCTM to a BSR control circuit 30 (or 3). The direct current test mode control signal DCTM is a multi-bit signal including information specifying whether to set "01" or "10" in adjacent terminals. In BSR chain 100, a pair of test cells provided in correspondence to a pair of adjacent terminals in I/O cells are supplied with different control signals respectively. The signals Set1 and Reset1 are supplied to one of the pair of test cells, while signals Set2 and Reset2 are supplied to the other test cell. In other words, control signals for test cells provided in correspondence to adjacent terminals are separated.

When DC test control signal DCTM specifies setting "10" in the adjacent terminals (when the external test instruction EXTEST1 is supplied), for example, BSR control circuit 30 (or 3) sets the signals Set1 and Reset2 into active states, for example. Thus, one of adjacent I/O cells is supplied with a signal "1" from the test cell in the set state while a signal of "0" is supplied to an output buffer of the other adjacent I/O cell from the boundary scan register in the reset state. Thus, data "10" can be set in the adjacent terminals. A direct current test can be performed while respective pairs of adjacent terminals are set in states "10" and "01" by executing the external test instructions EXTEST1 and EXTEST2, for detecting shorting/opening between the pair of adjacent terminals.

Figure 38:
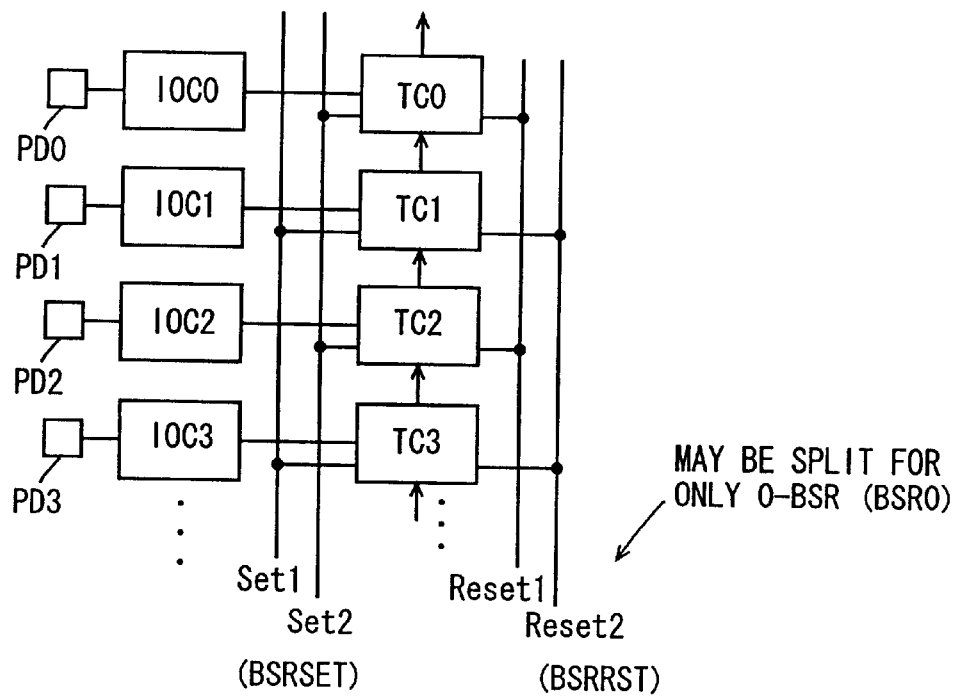
FIG. 38 schematically illustrates the structure of a BSR chain shown in FIG. 37.

FIG. 38 schematically illustrates the structure of BSR chain 100. FIG. 38 representatively shows I/O cells IOC0 to IOC3 provided in correspondence to adjacent pads PD0 to PD3 and test cells TC0 to TC3 provided in correspondence to I/O cells IOC0 to IOC3. Different control signals are supplied to adjacent test cells. In the structure shown in FIG. 38, test cells TC0 and TC2 are supplied with set signal Set2 and reset signal Reset2, and test cells TC1 and TC3 are supplied with set signal Set1 and reset signal Reset1. Test cells TC0 to TC3 are identical in internal structure to those described with reference to any of the above embodiments, and boundary scan registers are arranged independent on the structure of the I/O cells. The boundary scan registers (particularly those related to signal output) included in test cells TC0 to TC3 are set to set/reset states by the signals Set1, Set2, Reset1 and Reset2.

As shown in FIG. 38, different control signals (set and reset signals) are supplied to adjacent test cells and pads PD0 to PD3 correspond to adjacent pin terminals, and hence data "10" and "01" can be readily output at the adjacent terminals.

Upon outputting signals to the output terminals, only the states of boundary scan registers O-BSR (BSR0) provided in correspondence to output buffers need be different between the adjacent test cells. Therefore, the set and reset signals are required to be split into groups (two groups) only for the boundary scan registers BSR0 (O-BSR) each provided for the output buffers (boundary scan registers each for an output enable signal enter set states commonly in the adjacent cells). This is obvious from that only the state of the boundary scan register (O) provided for the output buffer is different in testing VOH and VOL in the items 2) and 3) among the functions of DC test control signal DCTM shown in FIG. 5.

While gray codes are employed for the DC test mode control signal DCTM shown in FIG. 5, ordinary binary notation may alternatively be employed. The set/reset states can be readily made different between the adjacent cells by increasing the bit number of the DC test mode control signal DCTM. A DC test mode control signal of an appropriate bit pattern can be assigned to a test mode of making the logic levels of output signals from the adjacent terminals different.

The external test instructions EXTEST1 and EXTEST2 are included in external test instruction EXTEST employed for the boundary scan test. In executing the external test instruction, the output cell (cell including an output buffer) outputs data (responsive to set/reset state) held in the boundary scan registers included in the corresponding test cell to the corresponding pin terminal.

According to the eighteenth embodiment of the present invention, as hereinabove described, different set/reset signals are supplied to adjacent test cells, whereby a signal of "01" or "10" can be output to adjacent terminals at a high speed without shifting a test pattern through a scan path, for reducing the test time and improving the efficiency of failure detection.

Also in the eighteenth embodiment, BSR control circuit 30 (or 3) may be provided for each I/O cell or for each boundary scan register. When it is provided for each boundary scan register, boundary scan registers provided for output buffers should be split into two groups in particular, and only BSR control circuits for the boundary scan registers provided for the output buffers should be divided into two groups.

Nineteenth Embodiment

Figure 39:
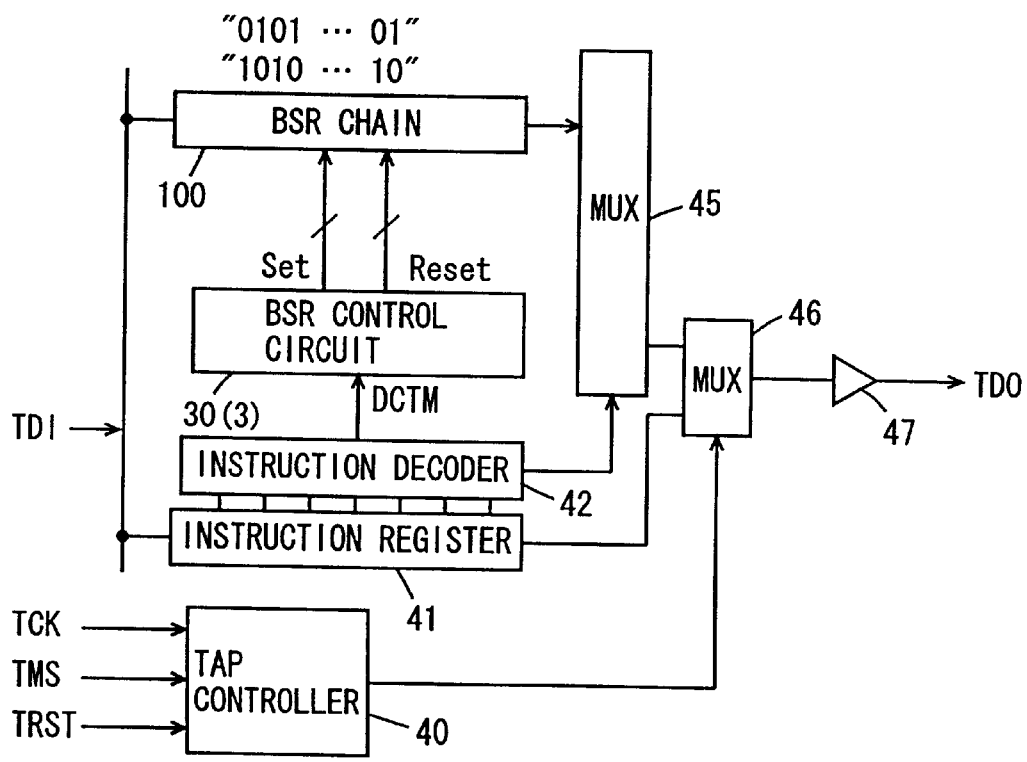
FIG. 39 schematically illustrates the structure of a main part of a semiconductor integrated circuit device according to a nineteenth embodiment of the present invention.

FIG. 39 schematically illustrates the structure of a main part of a semiconductor integrated circuit device according to a nineteenth embodiment of the present invention. In the structure shown in FIG. 39, a BSR control circuit 30 (or 3) outputs a set signal Set and a reset signal Reset to a BSR chain (boundary scan register chain) 100 in accordance with a direct current test mode control signal DCTM from an instruction decoder 42. In boundary scan register chain 100, connection of the set signal Set and the reset signal Reset is different between adjacent I/O cells. When one of the adjacent I/O cells is in a set state, the other one is in a reset state, and a signal of "01" or "10" is output to a pair of adjacent terminals. Connection of the set signal Set and the reset signal Reset is simply made different with respect to test cells for adjacent I/O cells.

In an external test operation for a DC test, a pattern "1010 . . . 10" or "0101 . . . 01" is output as a data output pattern. Signals having different logical values between adjacent terminals are output and hence a failure such as shorting/opening between the adjacent terminals (signal lines) can be readily detected and the efficiency of failure detection is improved. While data "01" or "10" is output at the adjacent terminals, either logic "1" or logic "0" is output as to each terminal, and hence VOH and VOL can also be tested as to each terminal.

Figures 40, 41:
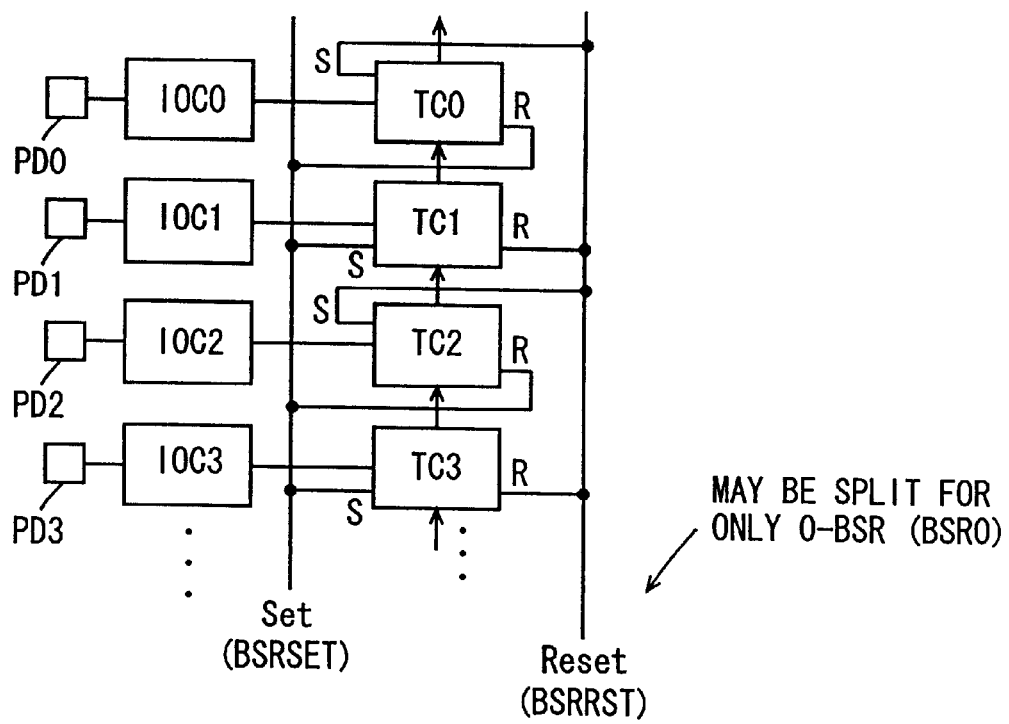
FIG. 40 is a list of logics implemented by a BSR control circuit shown in FIG. 39.
FIG. 41 schematically illustrates the structure of a BSR chain shown in FIG. 39.

FIG. 40 is a list of logic implemented by BSR control circuit 30 (or 3) in the nineteenth embodiment of the present invention. In DC test functions shown in FIG. 40, HL output and LH output are specified in place of H output and L output in items 2) and 3). In HL output, a signal of logic "10" is output at adjacent terminals. In the LH output function, a signal of "01" is output at the adjacent terminals. The voltage level of an output signal is set in combination of adjacent terminals, and the signal voltage of an output terminal is not individually and independently controlled. However, each terminal can be set in the state of either the logic "1" or the logic "0" by the HL output or the LH output in the items 2) and 3). Thus, no problem arises in particular.

As to a boundary scan register provided for an input buffer, an internal input signal I is in a don't care state in all states of the DC test functions, and a set signal Set and a reset signal Reset for another boundary scan register may be utilized.

FIG. 41 illustrates an exemplary structure of BSR chain (boundary scan register chain) 100 shown in FIG. 39. Referring to FIG. 41, I/O cells IOC0 to IOC3 are arranged for pads PD0 to PD3 provided in correspondence to adjacent terminals. Test cells TC0 to TC3 are arranged in correspondence to I/O cells IOC0 to IOC3, respectively. A signal line transmitting the set signal Set and a signal line transmitting the reset signal Reset are arranged in common for test cells TC0 to TC3. Test cells TC0 and TC2 receive the reset signal Reset in set inputs S while receiving the set signal Set in reset inputs R. Test cells TC1 and TC3 receive the set signal Set in set inputs S while receiving the reset signal Reset in reset inputs R. In the adjacent test cells TC0 and TC1, therefore, set/reset states are inverted. Also in the adjacent test cells TC2 and TC3, set/reset states are inverted.

Line connection for the set signal Set and the reset signal Reset is switched only for a boundary scan register BSR0 (O-BSR) provided for an output buffer (see FIG. 40). Set signal Set and reset signal Reset are control signals driven in a DC test mode, and correspond to the boundary scan register set signal BSRSET and the boundary scan register reset signal BSRRST in the aforementioned embodiments. Ordinary set and reset signals set in a boundary scan test are supplied to test cells TC0 to TC3 in common, for setting the adjacent cells in the same states in the boundary scan test.

Figure 42:
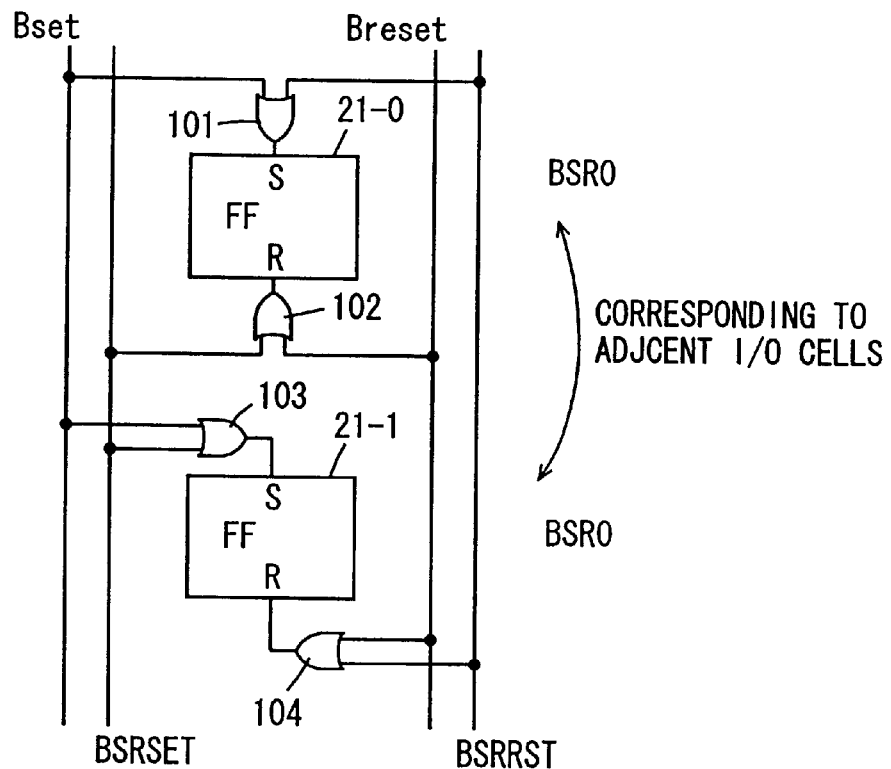
FIG. 42 schematically illustrates an exemplary structure of a test cell shown in FIG. 41.
Figure 43:
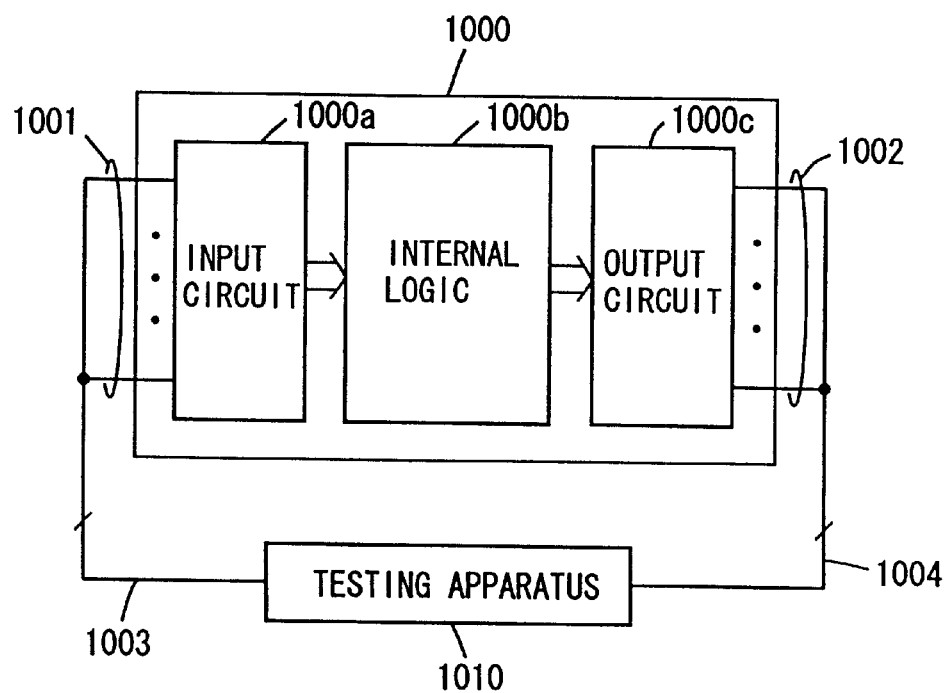
FIG. 43 schematically illustrates the overall structure of a conventional semiconductor integrated circuit device.
Figure 44:
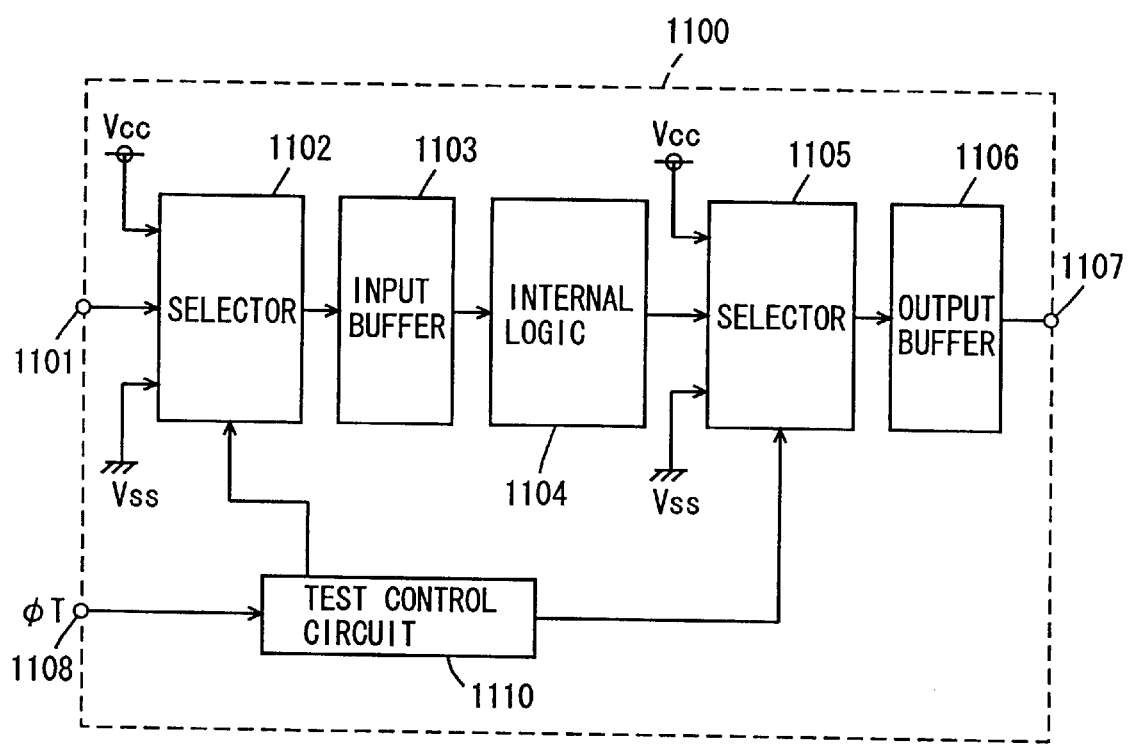
FIG. 44 schematically illustrates the structure of another conventional semiconductor integrated circuit device.

FIG. 42 schematically illustrates interconnection of output boundary scan registers (boundary scan registers provided in correspondence to output buffers) BSR0 provided in correspondence to two adjacent I/O cells. FIG. 42 shows flip-flops (FF) 21-0 and 21-1 included in output boundary scan registers (boundary scan registers connected to output buffers) BSR0. Flip-flops 21-0 and 21-1 have set inputs Sand reset inputs R. The set input S of flip-flop 21-0 is supplied with an output signal of an OR circuit 101 receiving the boundary scan register reset signal BSRRST generated in the DC test along with a set signal Bset generated in the boundary scan test. The reset input R of flip-flop 21-0 is supplied with an output signal of an OR circuit 102 receiving the boundary scan register set signal BSRSET generated in the DC test mode and a boundary scan test reset signal Breset activated in a boundary scan test operation.

In flip-flop 21-1, the set input S is supplied with an output signal of an OR circuit 103 receiving a boundary scan test set signal Bset and boundary scan register set signal BSRSET generated in a direct current test mode. The reset input R of flip-flop 21-1 is supplied with an output signal of an OR circuit 104 receiving the boundary scan test register reset signal Breset and boundary scan register reset signal BSRRST generated in the direct current test mode. In the boundary scan test, therefore, flip-flops 21-0 and 21-1 are set to set/reset states in accordance with the set signal Bset and the reset signal Breset respectively.

In the direct current test mode, flip-flop 21-1 is set and flip-flop 21-0 is reset when boundary scan register set signal BSRSET is driven to an active state. Therefore, the logic states of the output boundary scan registers provided in correspondence to adjacent I/O cells differ from each other, and a signal of logic "10" is output at the adjacent terminals. When the reset signal BSRRST is activated in the direct current test mode, flip-flop 21-0 is set, while the flip-flop 21-1 is reset. Thus, a signal of "01" can be output at the adjacent terminals.

Also in the nineteenth embodiment, the BSR control circuit may be provided for each chip, each I/O cell or each boundary scan register. When the BSR control circuit is provided for each boundary scan register, the logic of the BSR control circuit need be inverted so that the control modes of the output boundary scan registers provided in correspondence to adjacent terminals differ from each other.

According to the nineteenth embodiment of the present invention, as hereinabove described, the boundary scan register chain sets adjacent output boundary scan registers in different states in a hardware manner through the boundary scan test circuit, whereby output patterns of "10" and "01" can be readily generated at the adjacent terminals, and a failure such as shorting between adjacent terminals can be readily detected. Further, each boundary scan register is simply set in a set/reset state through the boundary scan test circuit and no test pattern data is shifted through a scan path, whereby each I/O cell can be set in a desired state in a short time.

Other Applications

The semiconductor integrated circuit device is only required to be a device having boundary scan registers supporting JTAG test, and may be either a logic circuit or a memory circuit.

The aforementioned embodiments may be appropriately combined with each other.

According to the present invention, as hereinabove described, the DC test is performed through the circuit utilized for a boundary scan test, whereby a desired test can be performed, with signal propagation delay and increase of the circuit scale suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
    at least one I/O cell coupled to a pad and including at least one of an input circuit for inputting a signal and an output circuit for outputting a signal;
    at least one test cell including a boundary scan register provided in correspondence to the circuit included in said I/O cell, said boundary scan register capable of serially transferring test data in a boundary scan test mode in accordance with a shift instruction; and
    test control circuitry for setting said boundary scan register of said test cell in either one of a set state and a reset state in response to a test mode instruction signal to set a logical level of an output signal of said boundary scan register to a prescribed value, for setting an operating state of said I/O cell in accordance with said output signal from said boundary scan register of said test cell.

2. The semiconductor integrated circuit device in accordance with claim 1, wherein the circuit included in said I/O cell is brought into an operable state in accordance with an enable signal, and said test cell further includes a boundary scan register for providing said enable signal.

3. The semiconductor integrated circuit device in accordance with claim 1, wherein said I/O cell includes both of said input circuit and said output circuit, said input circuit and said output circuit are brought into operable states in response to an input control signal and an output control signal, respectively, and said test cell includes the boundary scan register arranged in correspondence to each of said input circuit, said input control signal, said output circuit and said output control signal.

4. The semiconductor integrated circuit device in accordance with claim 3, wherein said test control circuitry individually supplies a control signal to the boundary scan register arranged for each of said input circuit, said output circuit, said input control signal and said output control signal in response to said test mode instruction signal.

5. The semiconductor integrated circuit device in accordance with claim 3, wherein said test control circuitry causes the boundary scan register provided in correspondence to said input circuit to capture data supplied through said pad and said input circuit externally, for decoding the captured data and generating a control signal for said boundary scan register in response to said test mode instruction signal.

6. The semiconductor integrated circuit device in accordance with claim 1, wherein said I/O cell further includes a voltage fixing element for setting said pad to a fixed potential when rendered conductive, and said test cell further includes a control signal boundary scan register for providing a control signal for controlling conduction of said voltage fixing element.

7. The semiconductor integrated circuit device in accordance with claim 1, wherein the at least one I/O cell includes a plurality of I/O cells while the at least one test cell also includes a plurality of test cells in correspondence to the plurality of I/O cells, and said test control circuitry includes test control circuits arranged in correspondence to the I/O cells, each for supplying a control signal to a corresponding test cell.

8. The semiconductor integrated circuit device in accordance with claim 1, wherein the at least one I/O cell includes a plurality of I/O cells, and said at least one test cell also includes a plurality of test cells arranged in correspondence to the plurality of I/O cells, and said test control circuitry includes a plurality of test control circuits arranged in correspondence to boundary scan registers of the plurality of test cells.

9. The semiconductor integrated circuit device in accordance with claim 1, further comprising a boundary scan test circuit for performing the boundary scan test in said boundary scan test mode, said boundary scan test circuit including a first register, wherein said test control circuitry includes said first register and a circuit for generating a signal for setting a state of said boundary scan register in accordance with a control signal outputted from said first register, and said first register outputs said control signal specifying the state of said boundary scan register.

10. The semiconductor integrated circuit device in accordance with claim 1, wherein said test control circuitry includes:

a boundary scan test circuit for performing control of said boundary scan test in accordance with a signal instructing said boundary scan test mode, said boundary scan test circuit outputting a control signal specifying a state of said boundary scan register, and a circuit for generating a signal for setting said state of said boundary scan register in accordance with said control signal from said boundary scan test circuit.

11. The semiconductor integrated circuit device in accordance with claim 1, wherein said I/O cell includes said output circuit, said test cell includes an output boundary scan register provided in correspondence to said output circuit, and an input boundary scan register for capturing a signal supplied to said pad, and said test control circuitry includes a circuit for setting the signal supplied to said pad into said output boundary scan register through said input boundary scan register in response to said test mode instruction signal.

12. The semiconductor integrated circuit device in accordance with claim 1, wherein the at least one I/O cell includes a plurality of I/O cells, and said at least one test cell includes a plurality of test cells arranged in correspondence to the plurality of I/O cells, and said test control circuitry includes a circuit for serially connecting the boundary scan registers and setting data of a prescribed pattern in the boundary scan registers in the test cells in response to said test mode instruction signal.

13. The semiconductor integrated circuit device in accordance with claim 1, wherein the at least one I/O cell includes a plurality of I/O cells, and said at least one test cell includes a plurality of test cells arranged in correspondence to the plurality of I/O cells, and said test control circuitry includes a test pattern generator for generating a prescribed test pattern for setting said prescribed test pattern in the boundary scan registers in the test cells by a shift operation in response to said test mode instruction signal.

14. The semiconductor integrated circuit device in accordance with claim 1, wherein said I/O cell includes the output circuit, a signal output operation of said output circuit being controlled by an output control signal, and said test cell includes the boundary scan register arranged in correspondence to each of said output circuit and said output control signal, each the boundary scan register including means for holding an output signal of said each boundary scan register at a constant logical level in response to a level keep instruction signal supplied from said test control circuitry.

15. The semiconductor integrated circuit device in accordance with claim 1, wherein said I/O cell includes a voltage fixing element for setting said pad to a fixed potential in response to a voltage control signal, and said test cell includes a control boundary scan register arranged in correspondence to said voltage control signal for said voltage fixing element and holding a logical level of an output signal of said control boundary scan register in response to a level keep instruction signal from said test control circuitry.

16. The semiconductor integrated circuit device in accordance with claim 1, wherein said I/O cell includes both of said input circuit and said output circuit, and said test cell includes a control boundary scan register arranged in correspondence to each of said input circuit and said output circuit and holding a logical level of an output signal of said control boundary scan register in activation of a level keep instruction signal.

17. The semiconductor integrated circuit device in accordance with claim 16, wherein each of said input circuit and said output circuit is driven into an operable state by an enable signal, and said test cell further includes an enabling boundary scan register arranged in correspondence to each enable signal and holding a logical level of an output signal of said enabling boundary scan register in response to said level keep instruction signal.

18. The semiconductor integrated circuit device in accordance with claim 16, wherein said test control circuitry includes means for setting the boundary scan register for said output circuit in one of a set state and a reset state in accordance with the signal supplied to said pad when said level keep instruction signal is active.

19. The semiconductor integrated circuit device in accordance with claim 1, wherein said test control circuit includes a boundary scan test circuit for performing the boundary scan test in said boundary scan test mode, and said test control circuitry includes means for setting said boundary scan register into one of a set state and a reset state to set an output signal of the boundary scan register to a fixed logic level in accordance with a test mode instruction from said boundary scan test circuit.

20. The semiconductor integrated circuit device in accordance with claim 19, wherein said at least one I/O cell includes a plurality of I/O cells, and each of the I/O cells includes the output circuit, said test control circuitry includes means for setting at least the boundary scan registers arranged for the output circuits in states complementary to each other in each set of a pair of adjacent I/O cells.

* * * * *